US005696714A

United States Patent [19]
Russell

[11] Patent Number: 5,696,714
[45] Date of Patent: Dec. 9, 1997

[54] OPTICAL RANDOM ACCESS MEMORY

[75] Inventor: James T. Russell, Bellevue, Wash.

[73] Assignee: Information Optics Corporation, Issaquah, Wash.

[21] Appl. No.: 256,202

[22] PCT Filed: Dec. 30, 1992

[86] PCT No.: PCT/US92/11356

§ 371 Date: Jun. 28, 1994

§ 102(e) Date: Jun. 28, 1994

[87] PCT Pub. No.: WO93/13529

PCT Pub. Date: Jul. 8, 1993

Related U.S. Application Data

[63] Continuation-in-part of Ser. No. 815,924, Dec. 30, 1991, Pat. No. 5,379,266.

[51] Int. Cl.$^6$ .................................................. G11C 13/00
[52] U.S. Cl. .......................................... 365/106; 365/127
[58] Field of Search ............................... 365/106, 235, 365/120, 127

[56] References Cited

U.S. PATENT DOCUMENTS

| | | |
|---|---|---|
| 3,191,157 | 6/1965 | Parker et al. . |
| 3,440,620 | 4/1969 | French .................................. 365/127 |
| 3,573,433 | 4/1971 | Harris . |
| 3,637,307 | 1/1972 | Spitz . |
| 3,656,120 | 4/1972 | Maure . |
| 3,676,864 | 7/1972 | Maure et al. . |
| 3,704,068 | 11/1972 | Waly . |
| 3,765,749 | 10/1973 | LaMacchia . |
| 3,806,643 | 4/1974 | Russell . |
| 3,860,917 | 1/1975 | Auria . |
| 3,885,094 | 5/1975 | Russell . |
| 3,898,005 | 8/1975 | Roberts . |
| 3,899,778 | 8/1975 | Roberts . |
| 3,952,290 | 4/1976 | Williams . |
| 3,996,570 | 12/1976 | Roberts . |
| 4,021,606 | 5/1977 | Takeda et al. . |
| 4,227,212 | 10/1980 | Woolfson et al. . |
| 4,663,738 | 5/1987 | Sprague . |
| 4,682,861 | 7/1987 | Hosoya . |
| 4,727,533 | 2/1988 | Erbert . |
| 4,743,091 | 5/1988 | Gelbart . |
| 4,745,417 | 5/1988 | Inokuchi . |
| 4,794,245 | 12/1988 | Auer . |
| 4,899,224 | 2/1990 | Ooba et al. . |
| 4,988,153 | 1/1991 | Paek . |
| 5,007,690 | 4/1991 | Chern et al. . |
| 5,013,107 | 5/1991 | Biles . |
| 5,138,604 | 8/1992 | Umeda et al. . |
| 5,340,978 | 8/1994 | Rostoker . |

FOREIGN PATENT DOCUMENTS 1188220  12/1968  United Kingdom .

*Primary Examiner*—Terrell W. Fears
*Attorney, Agent, or Firm*—Graybeal Jackson Haley LLP

[57]  ABSTRACT

An optical memory (10) is disclosed in which data is stored in an optical data layer (19) capable of selectively altering light such as by changeable transmissivity, reflectivity, polarization, and/or phase. The data is illuminated by controllable light sources (15) and an array of multi-surface imaging lenslets (21) project the image onto a common array of light sensors (27). Data is organized into a plurality of regions or patches (called pages) and by selective illumination of each data page, one of the lenslets (21) images the selected data page onto the light sensors (27). Light in the data image pattern strikes different ones of the arrayed light sensors (27), thereby outputting a pattern of binary bits in the form of electrical data signals. By selectively and sequentially illuminating different ones of the data regions (pages) on the data layer (19), correspondingly different data patterns are imaged by the corresponding lenslets (21) onto the common sensor array (27), thereby enabling many stored data pages to be retrieved by multiplexing at electro-optical speed.

28 Claims, 60 Drawing Sheets

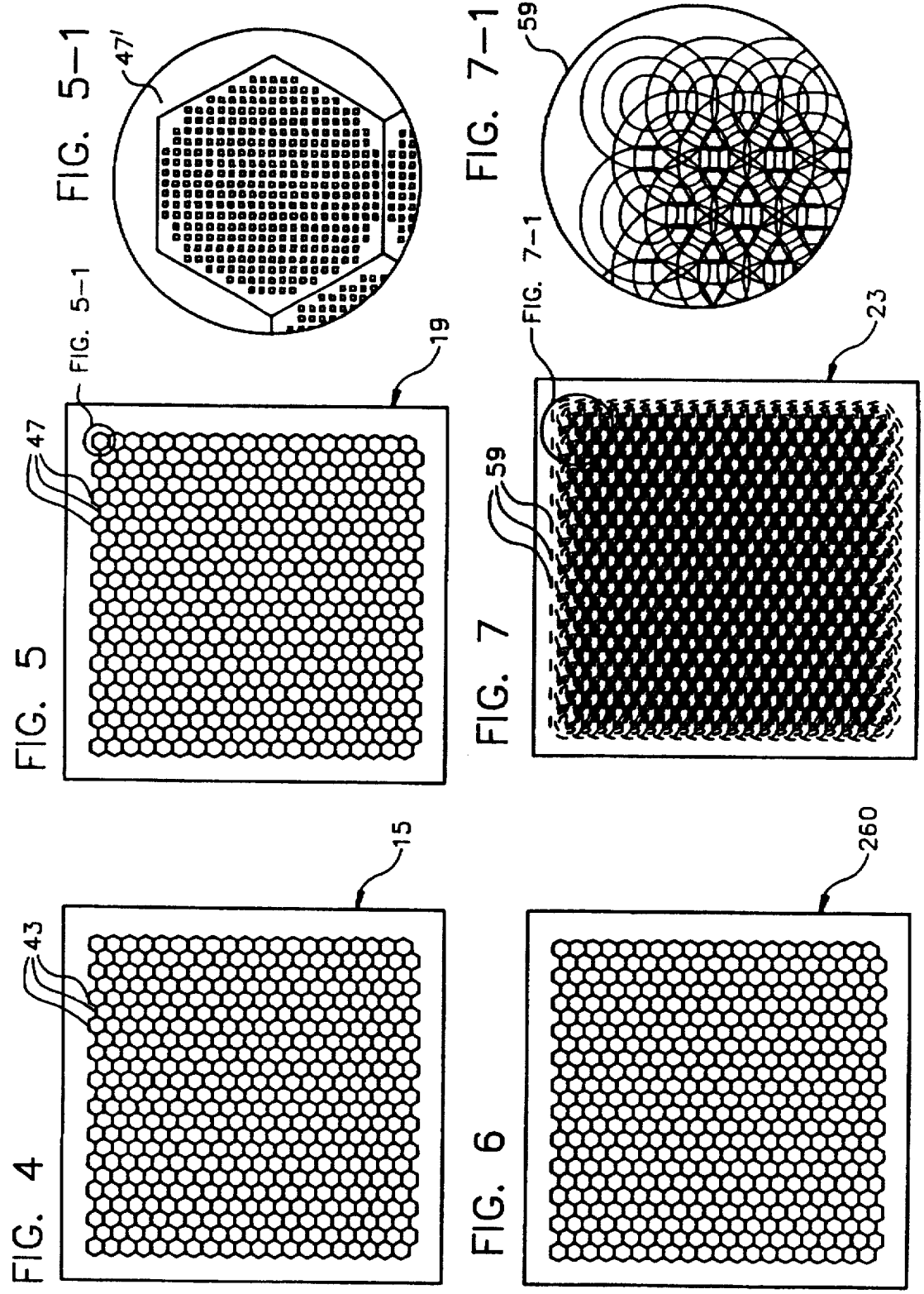

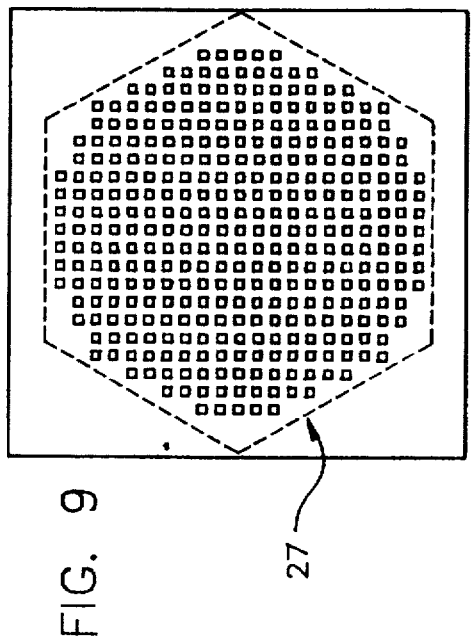
FIG. 9
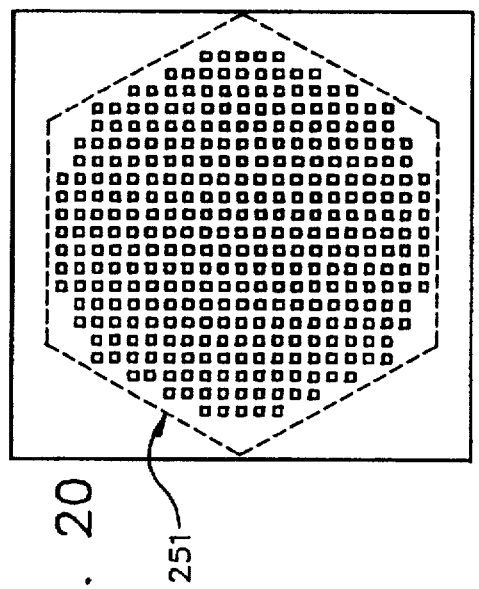
FIG. 20
RECORDING LIGHT SOURCE OR PAGE COMPOSER LAYOUT
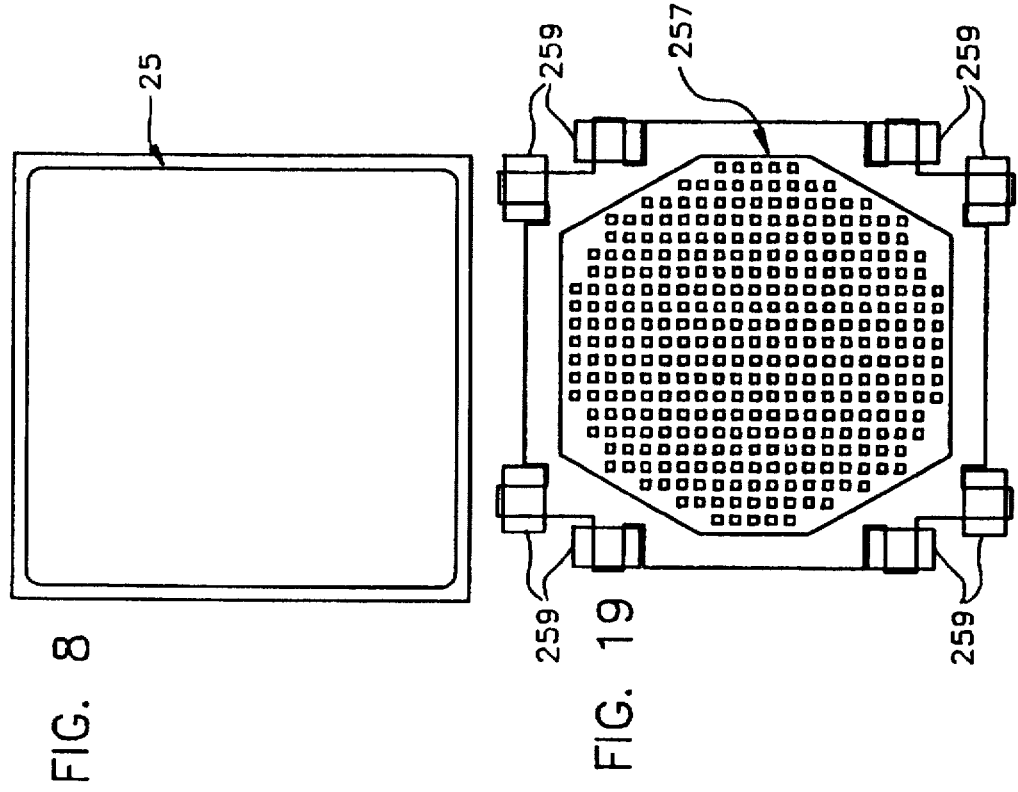
FIG. 8
FIG. 19
MICRO FIELD LENSES AND TYPICAL ELECTROMAGNETIC MOVERS

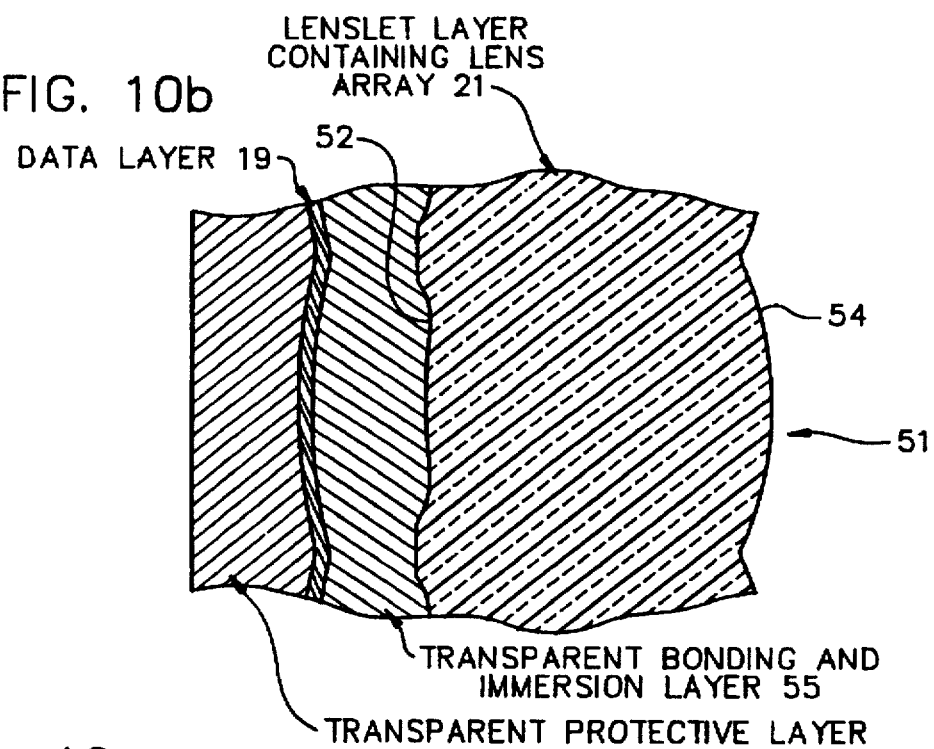
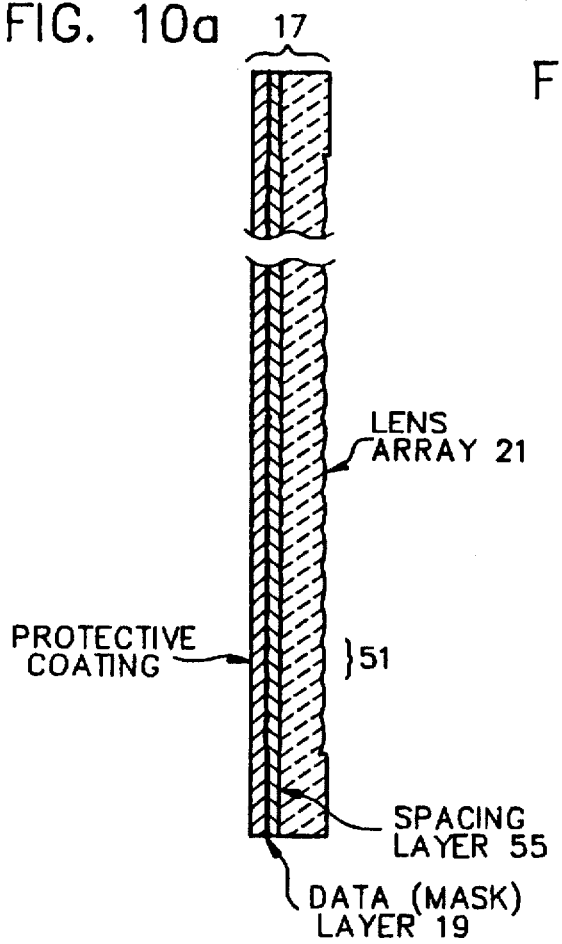
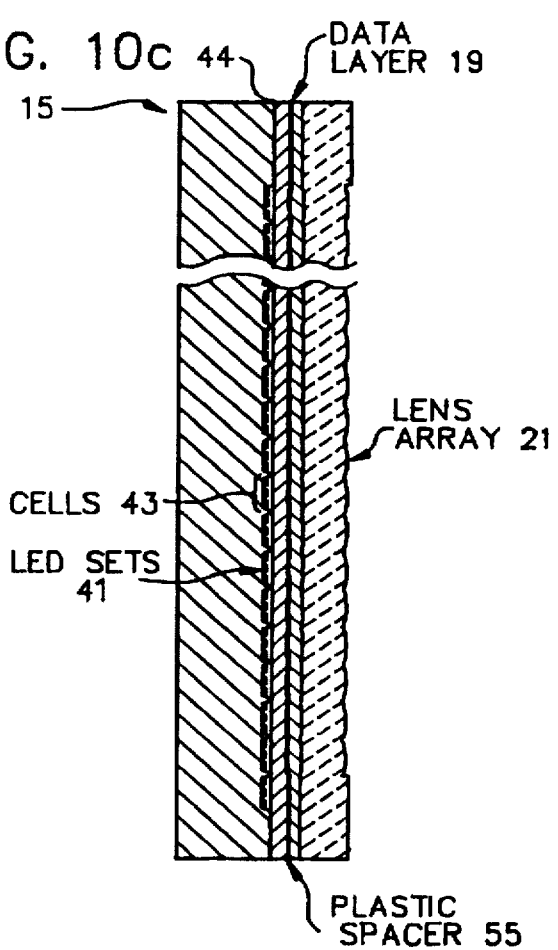

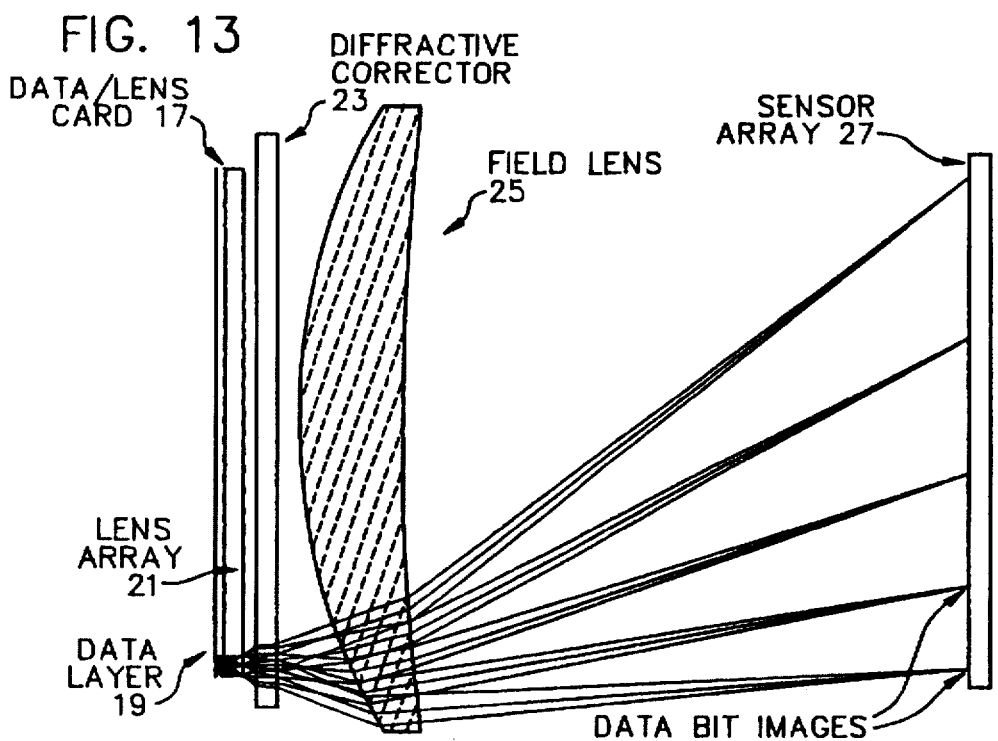
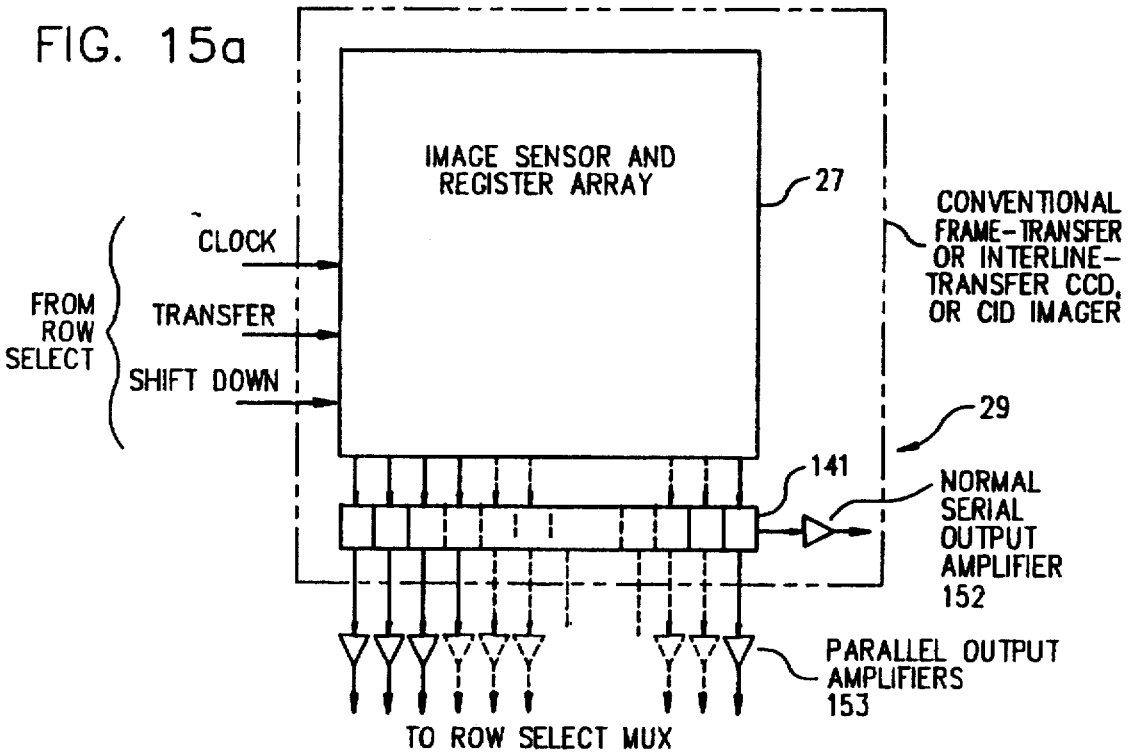

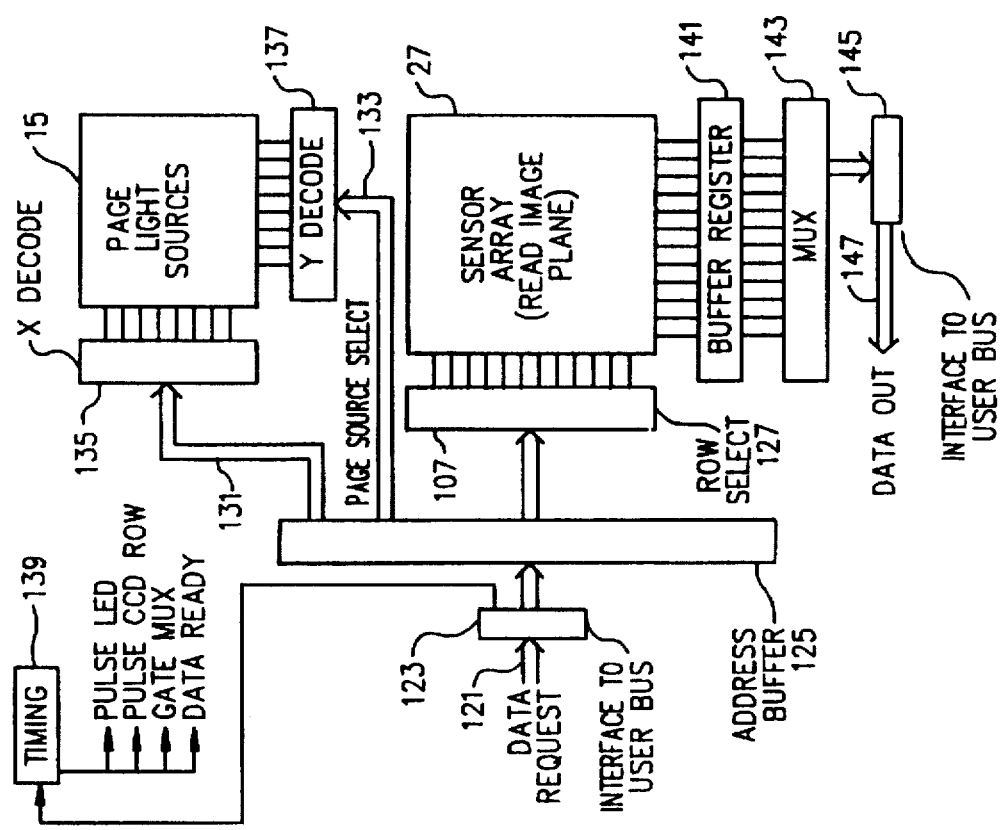
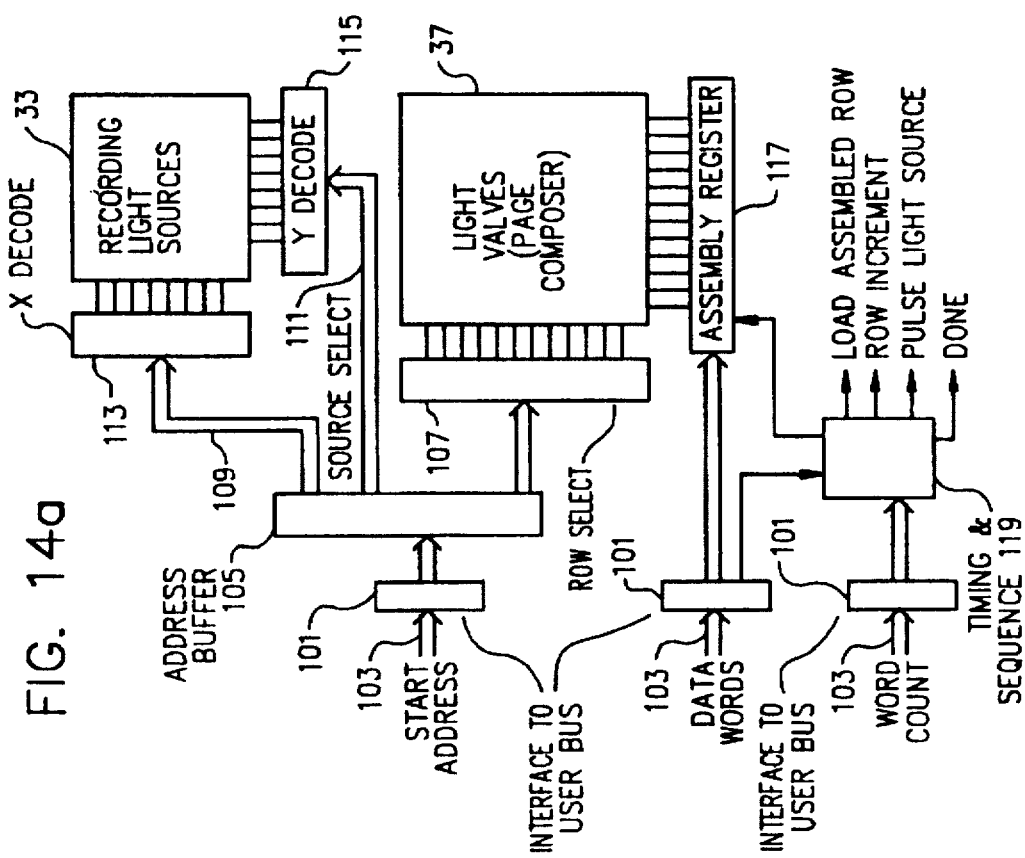

RECORDING LIGHT SOURCES

LENS

LIGHT VALVES

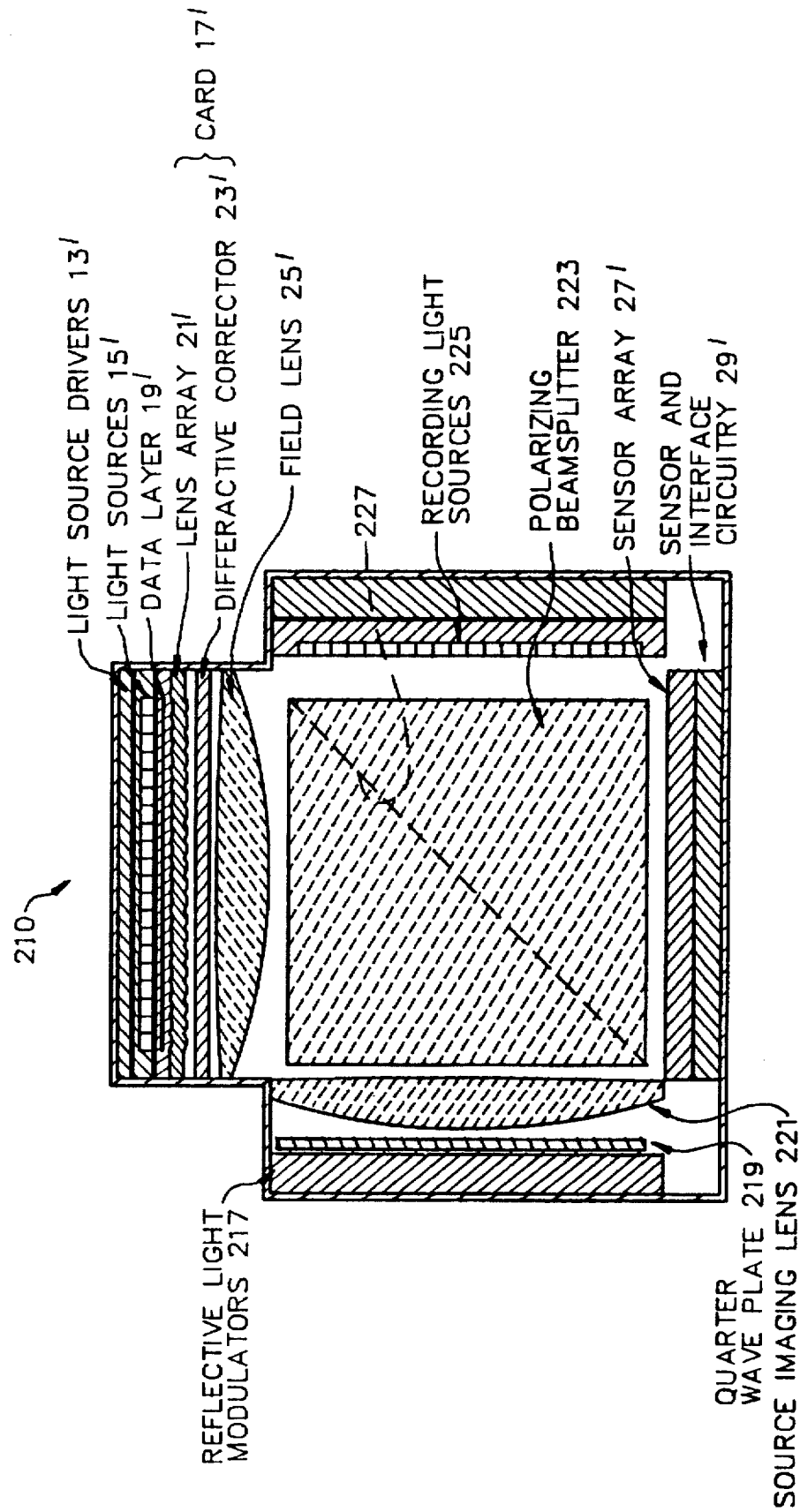
FIG. 17 WRITE/READ SYSTEM 210

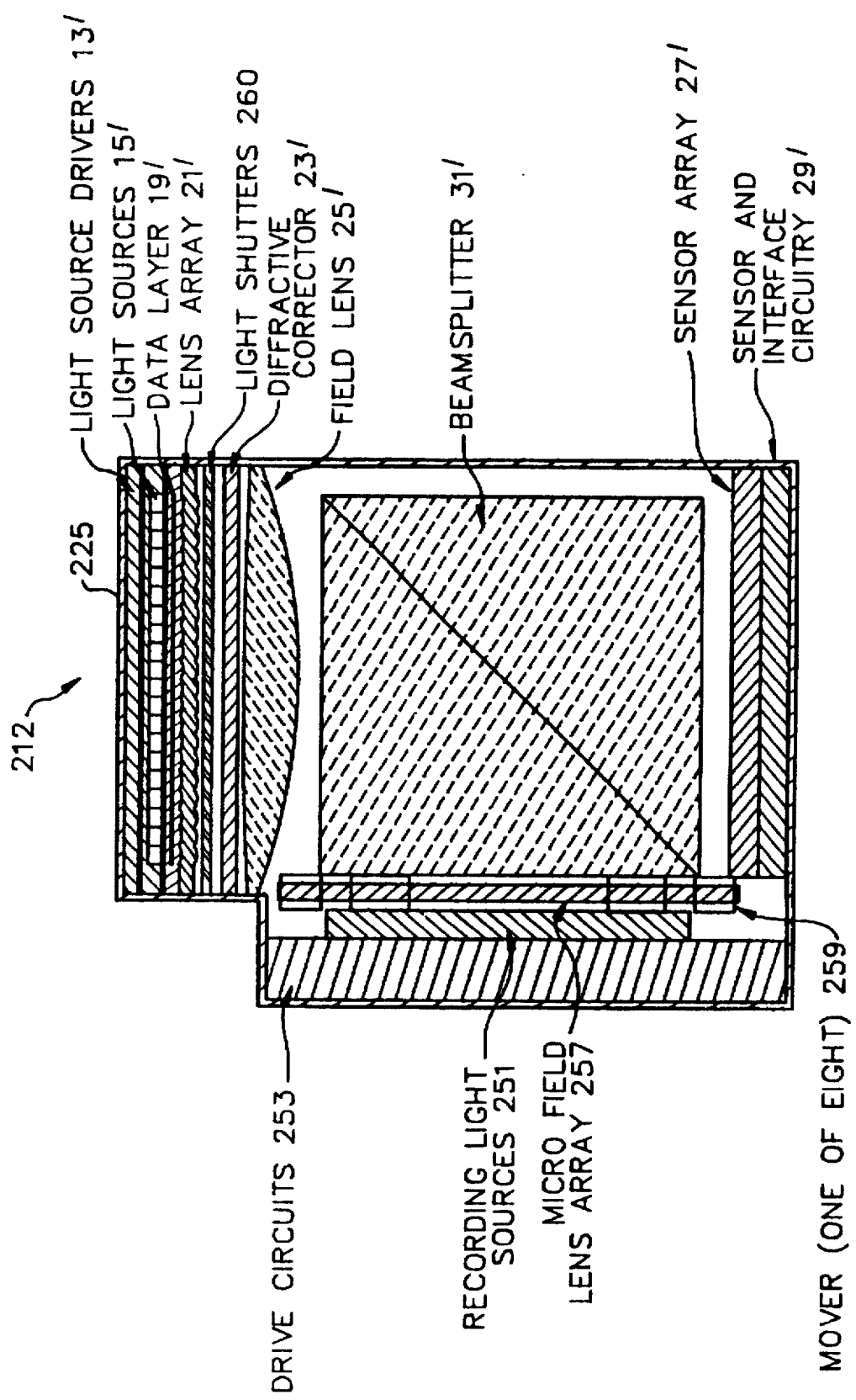
FIG. 18 WRITE/READ SYSTEM

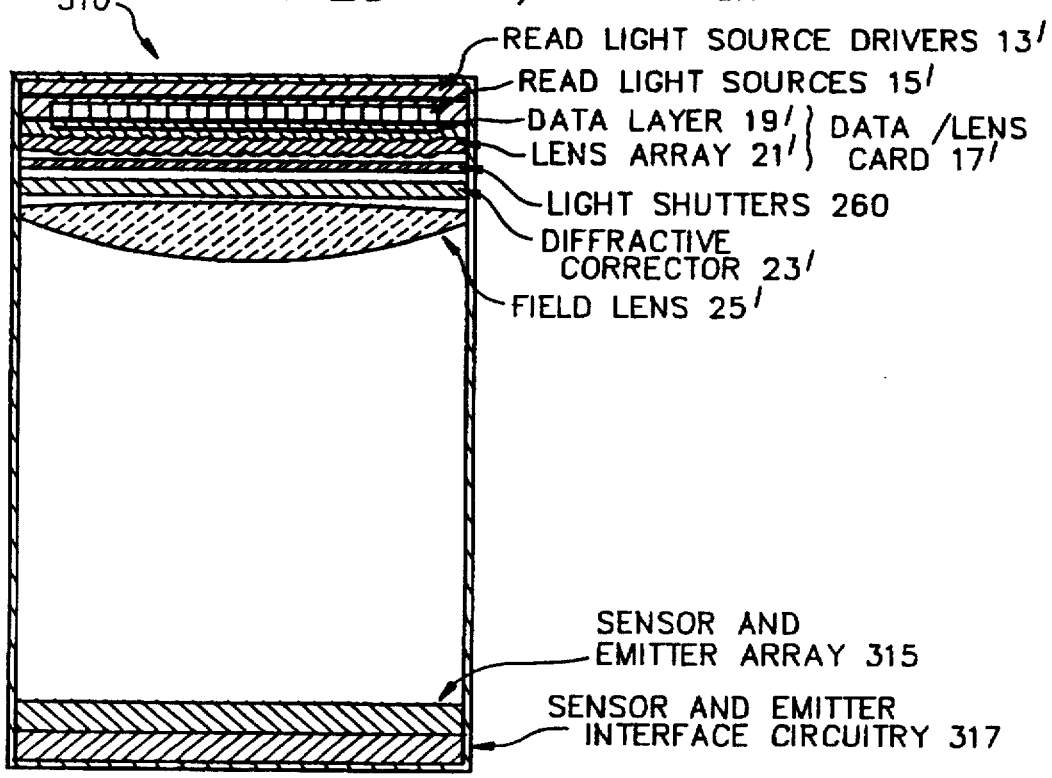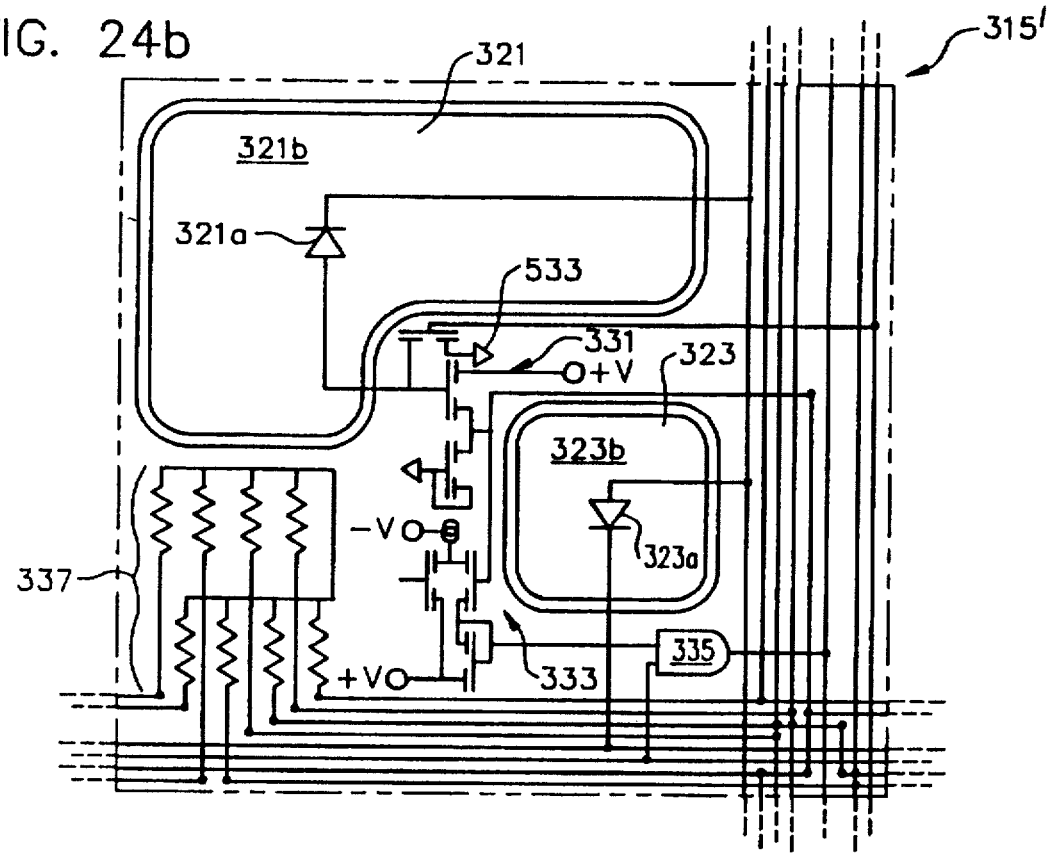

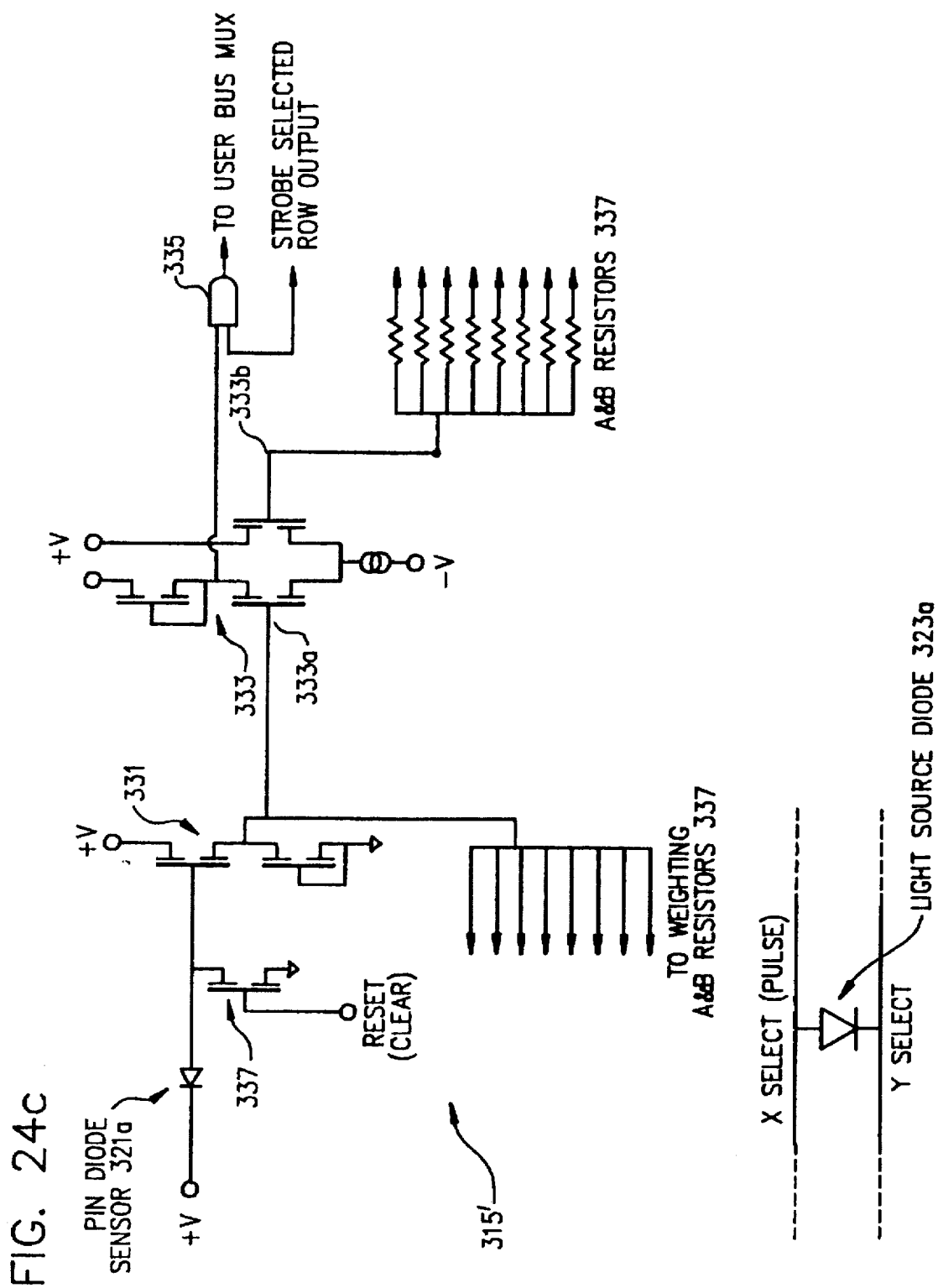

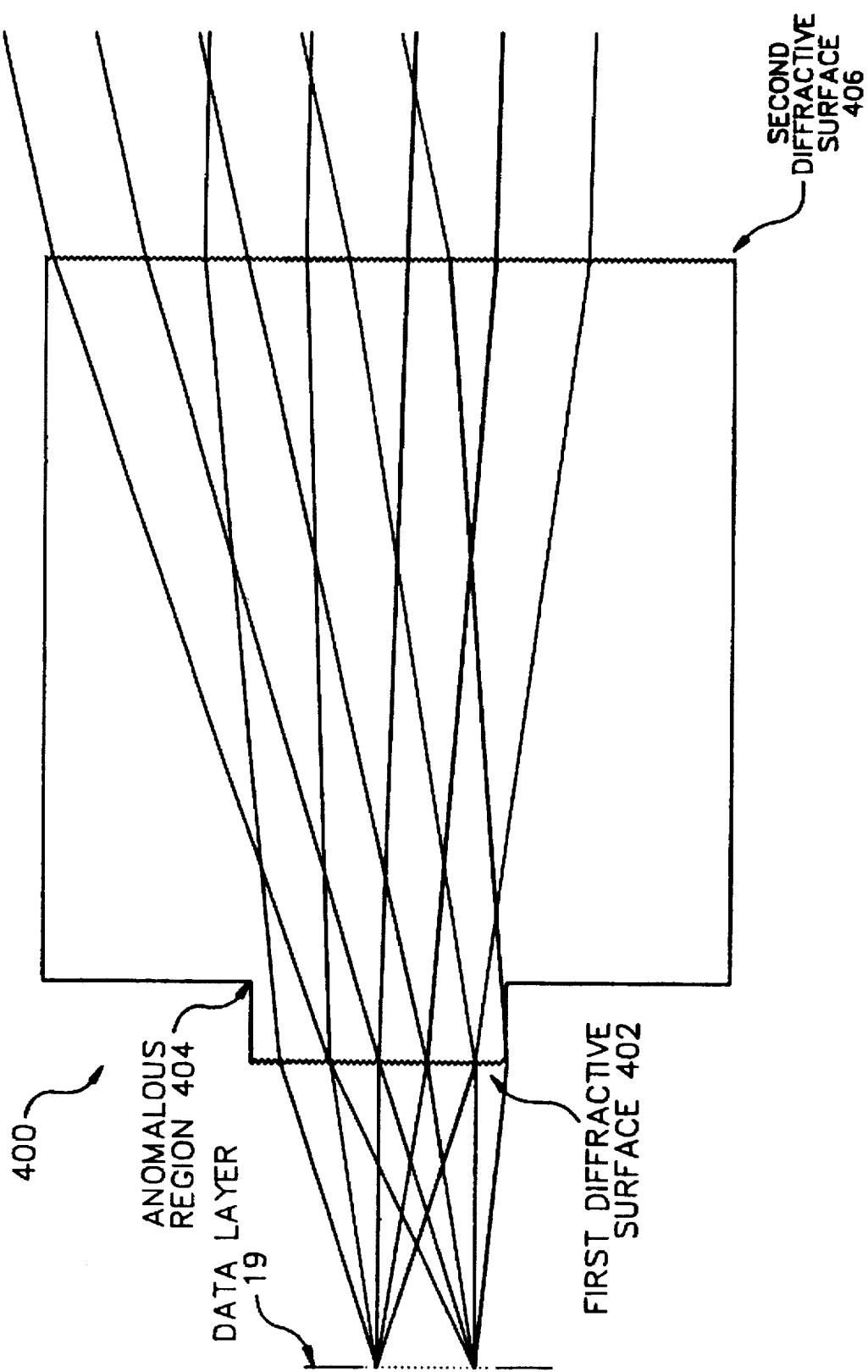

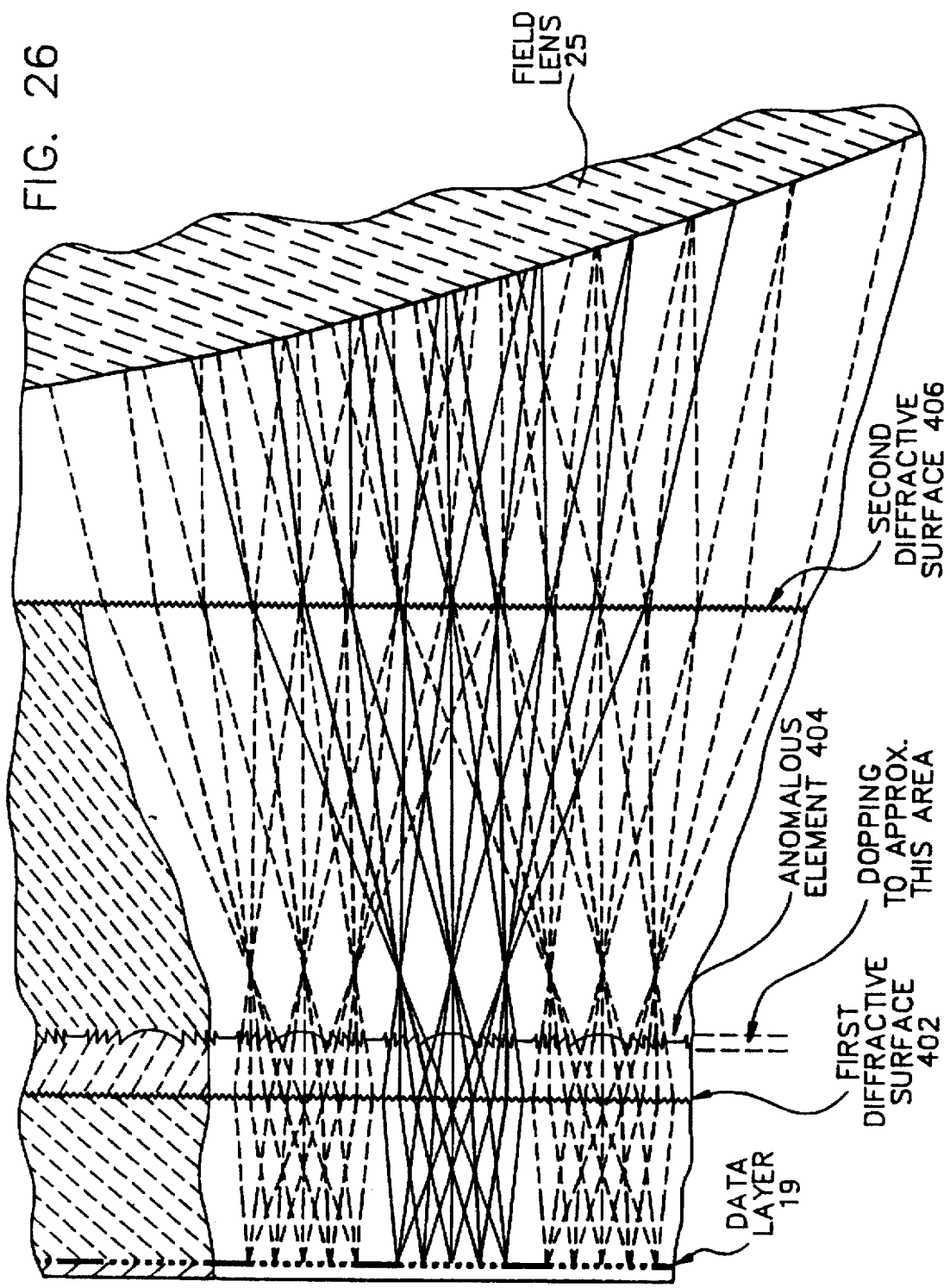

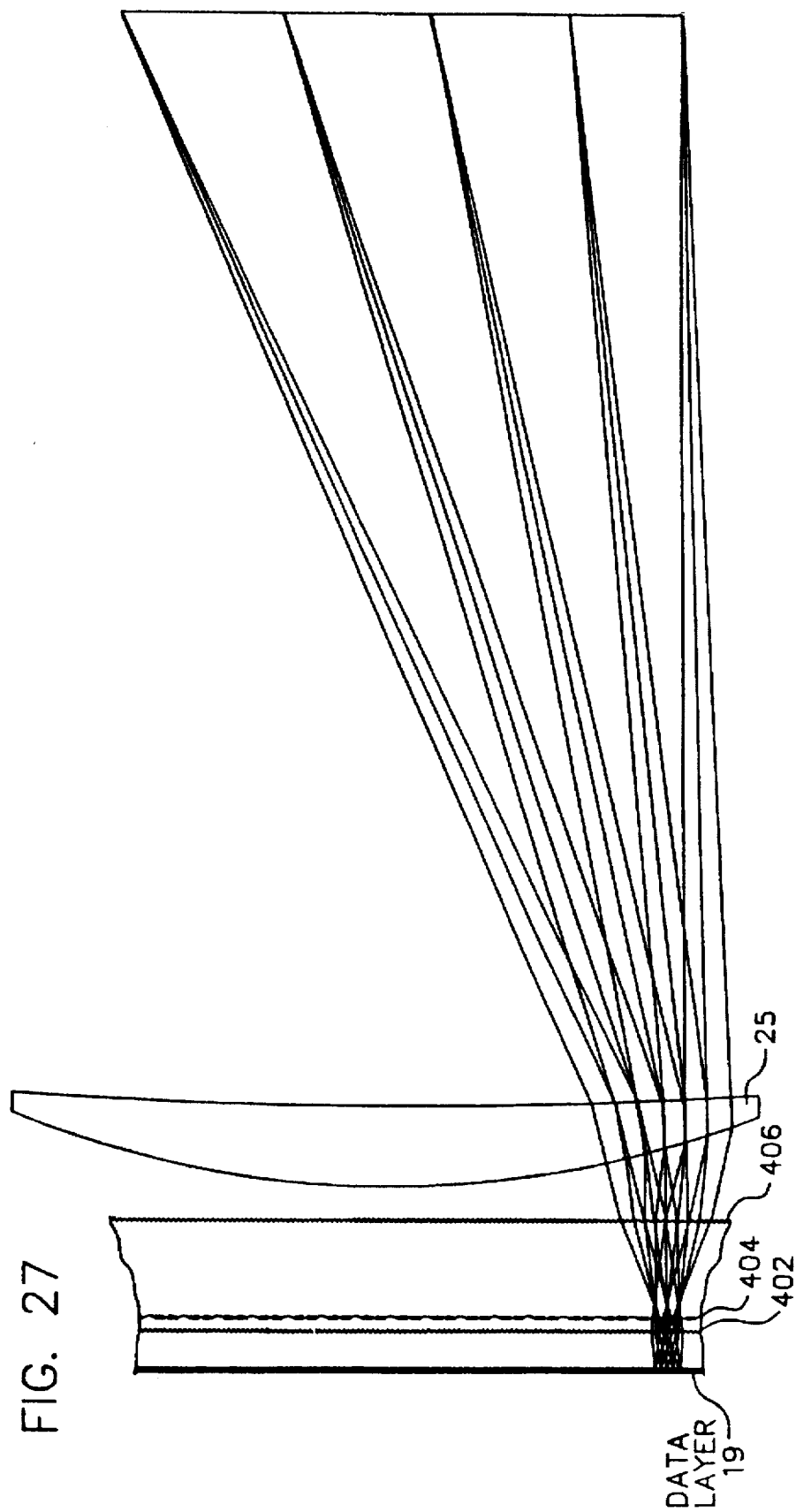

FIG. 33   ANOMALOUS DISPERSION $$\frac{p-1}{p+2} = \frac{N \cdot E^2}{m \cdot 3} \left[ \frac{\ell^2 \times \lambda^2}{\pi \cdot c^2 (\lambda^2 - \ell^2)} \right] \qquad \lambda = 2 \cdot \pi \cdot \frac{c}{w} \quad \text{and} \quad p = n^2$$

$\ell = 3.99 \cdot 10^{-7}$
$N = 5.3 \cdot 10^{37}$
$b = 3.5 \cdot 10^{13}$
$d = .3$ $m = .91 \cdot 10^{-30}$
$E = 1.6 \cdot 10^{-19}$
$c = 3 \cdot 10^{8}$ $$e(\lambda) = d \cdot \frac{2 \cdot \dfrac{N \cdot E^2}{m \cdot 3 \cdot \pi} \left[ \dfrac{1}{\left( \dfrac{c^2}{\ell^2} - \dfrac{c^2}{\lambda^2} \right) - \dfrac{c \cdot b}{\lambda^2} \cdot \lambda \cdot i} + 1 \right]}{1 - \dfrac{N \cdot E^2}{m \cdot 3 \cdot \pi} \left[ \dfrac{1}{\left( \dfrac{c^2}{\ell^2} - \dfrac{c^2}{\lambda^2} \right) - \dfrac{c \cdot b}{\lambda^2} \cdot \lambda \cdot i} \right]} + 1.72 \cdot (1-d)$$

$g(\lambda) = 1.65 + .065 \cdot 10^7 \cdot (6.5 \cdot 10^{-7} - \lambda)$

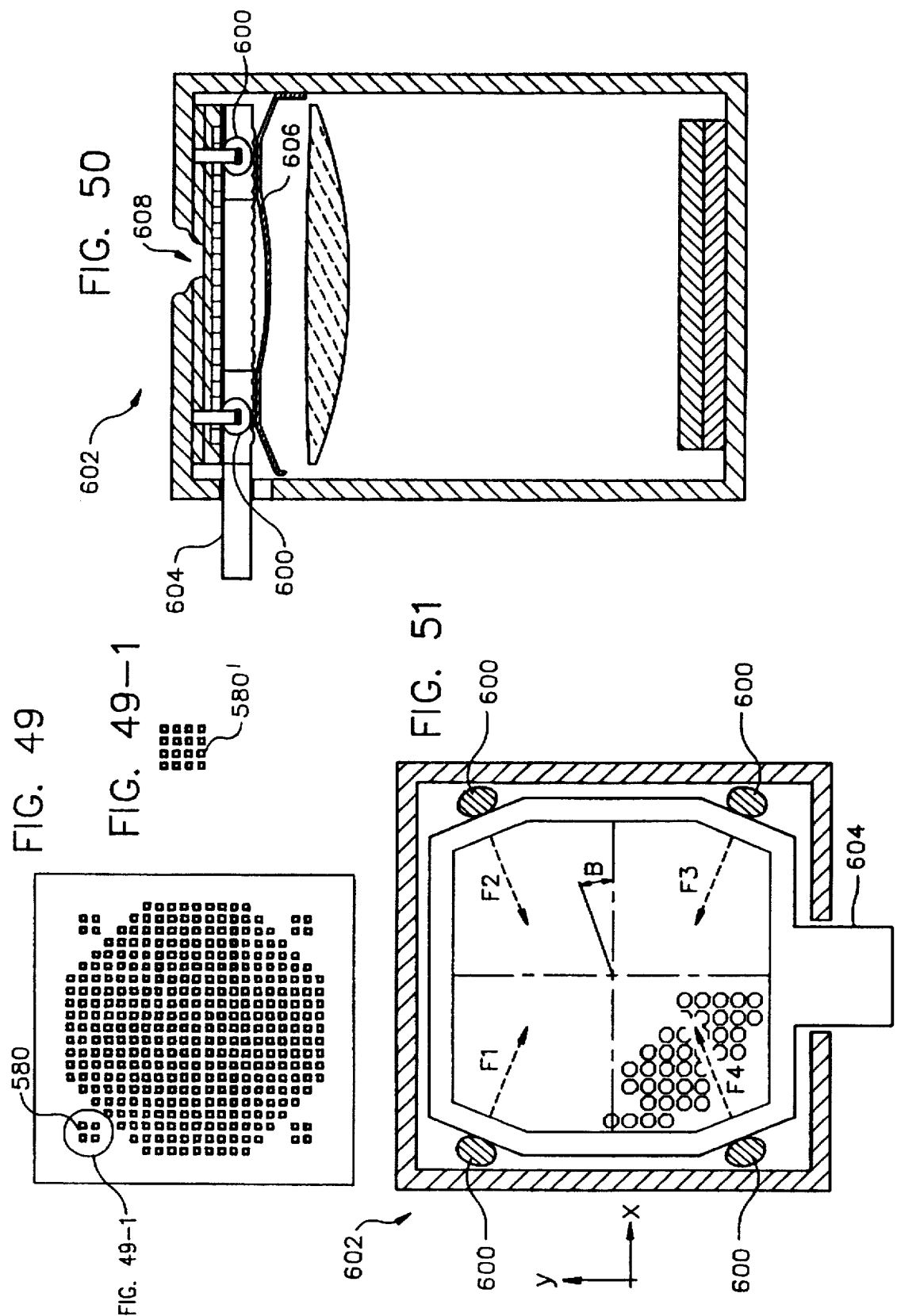

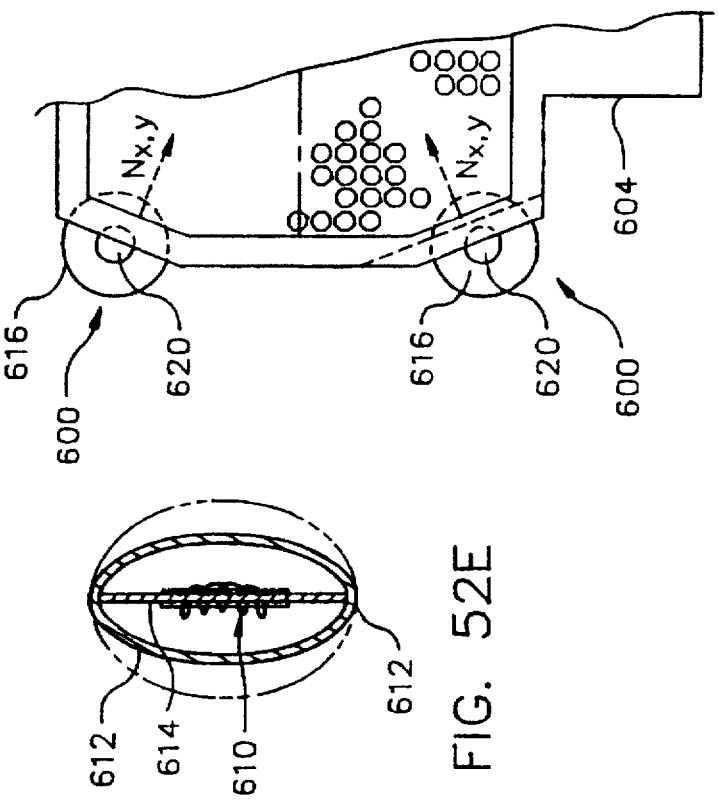
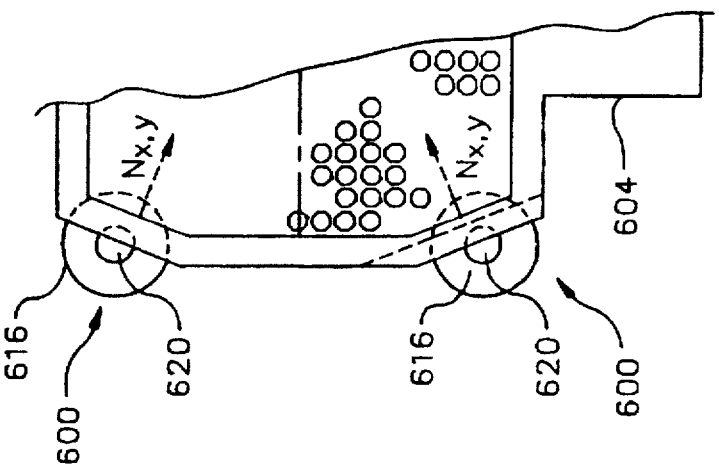
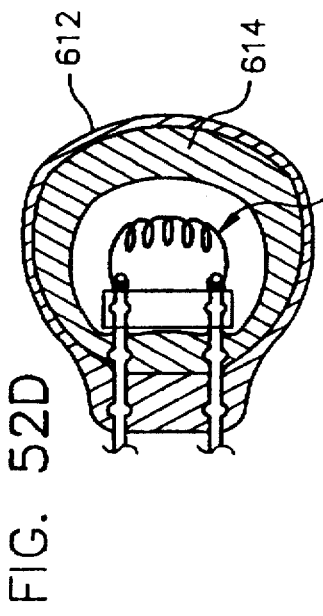
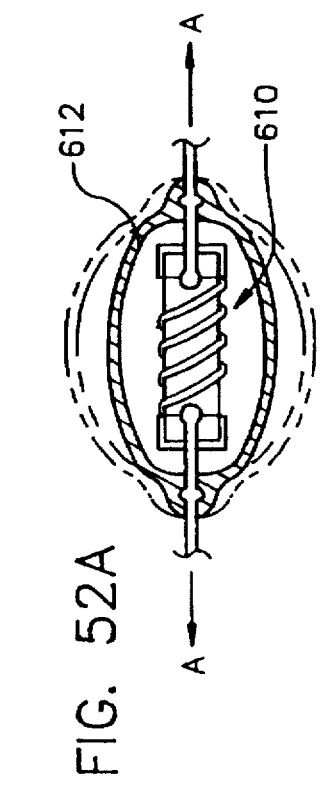
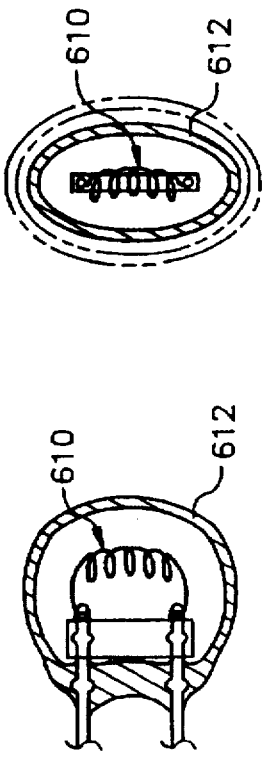
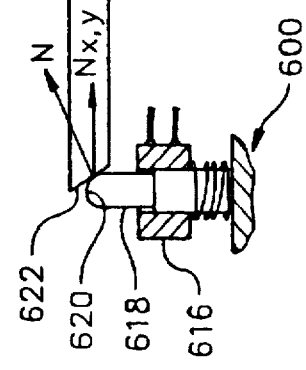

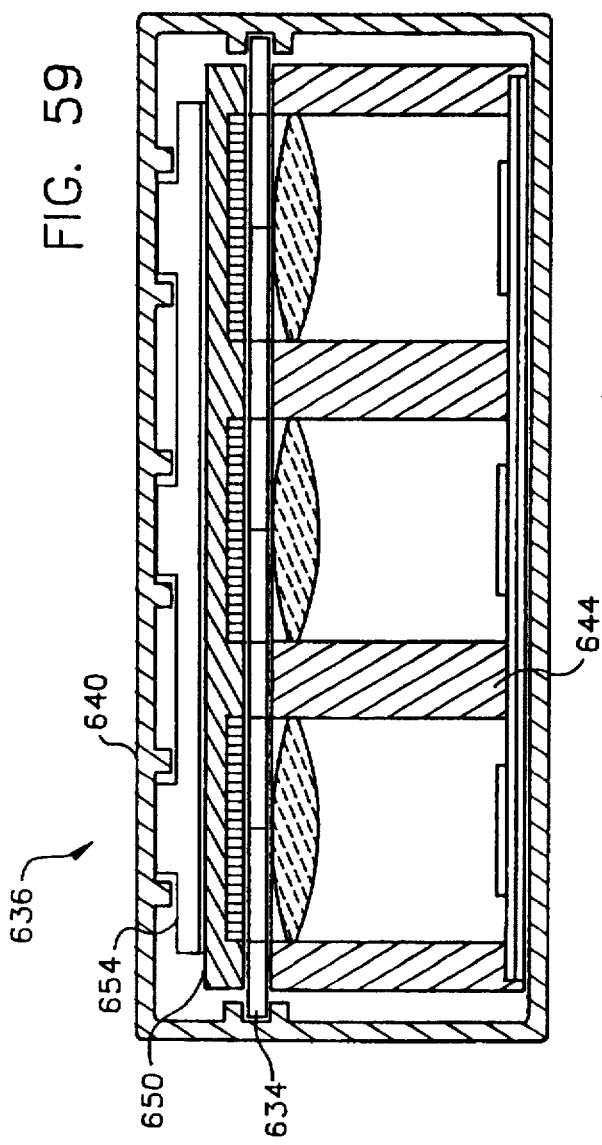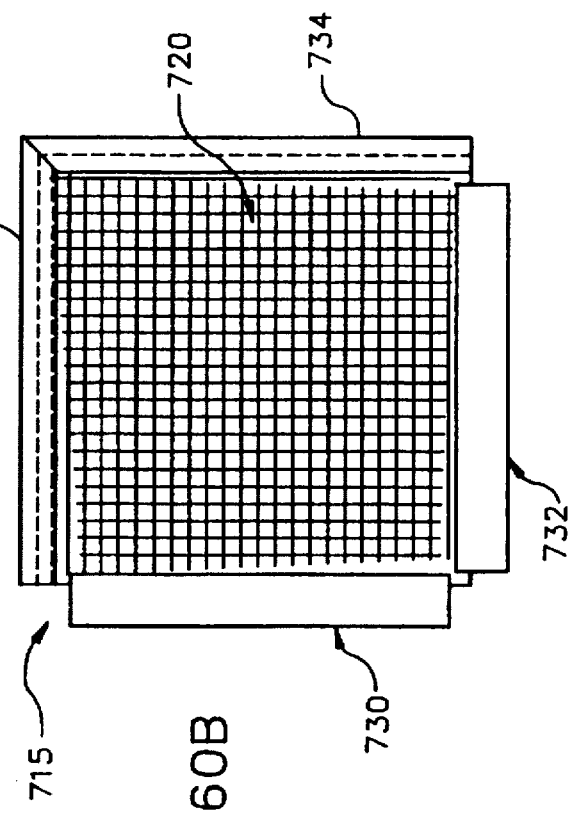

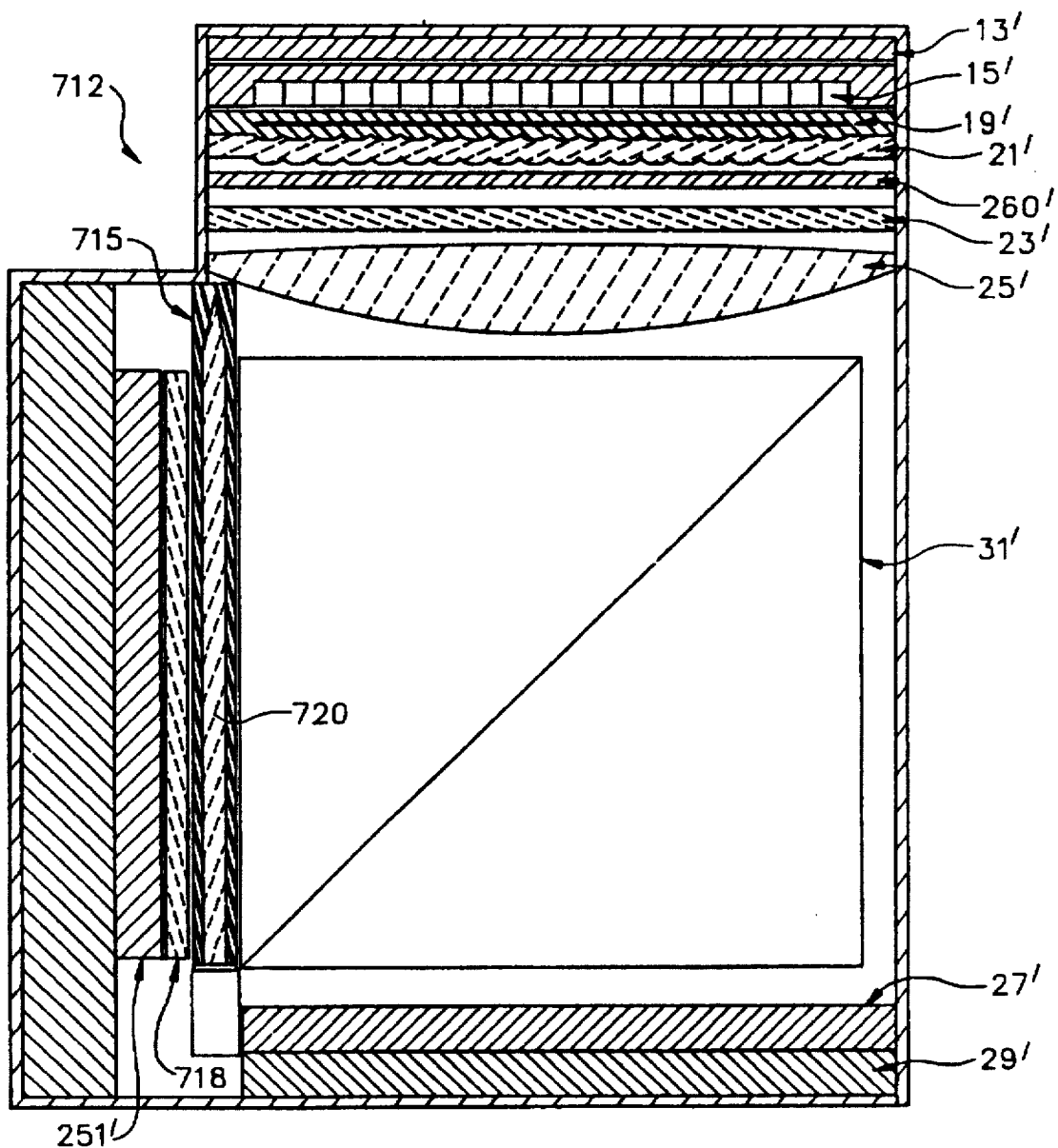

FIG. 66A
FIG. 66B
FIG. 66C
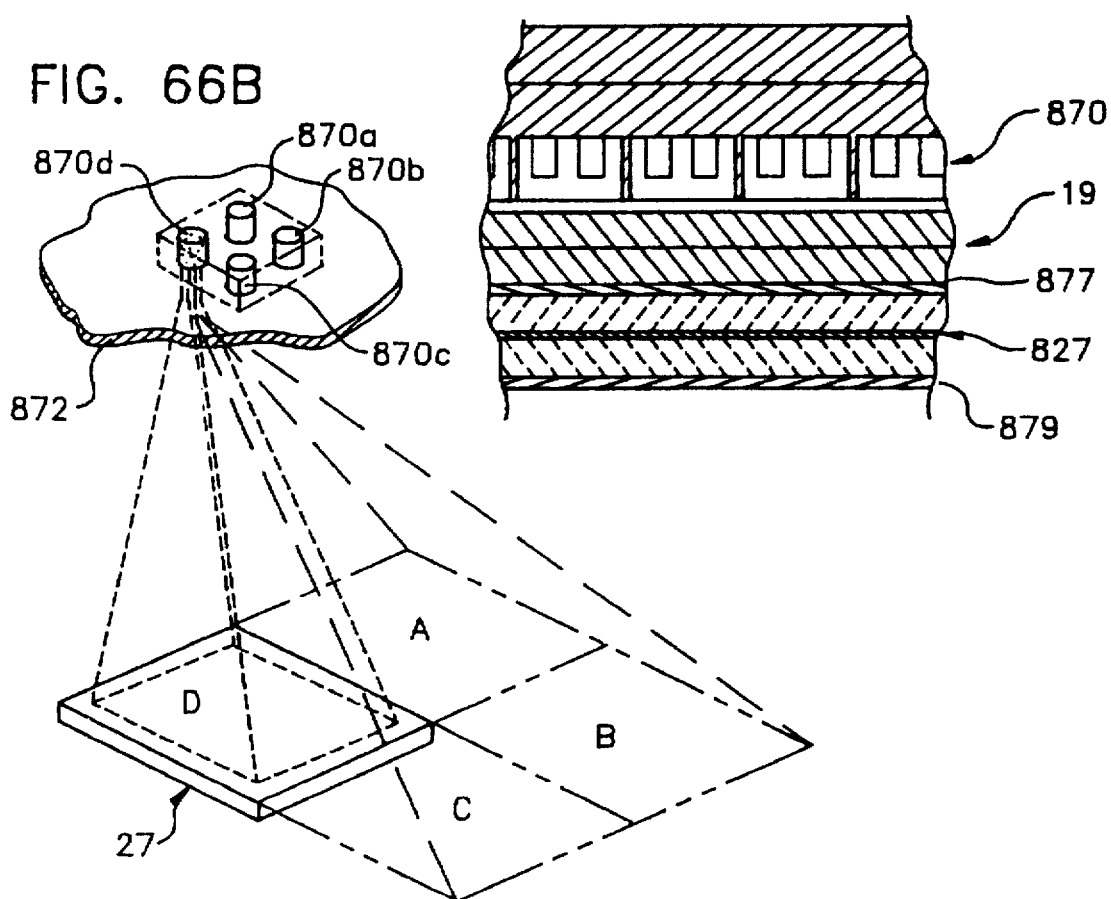
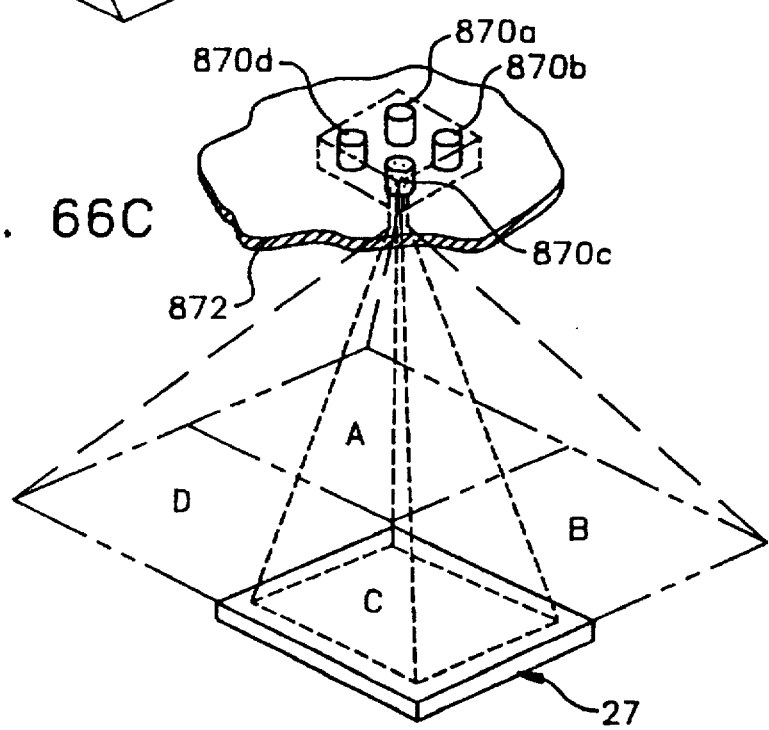

TWO FILTER

THREE FILTER

FOUR FILTER

FIG. 72A
FIG. 72B
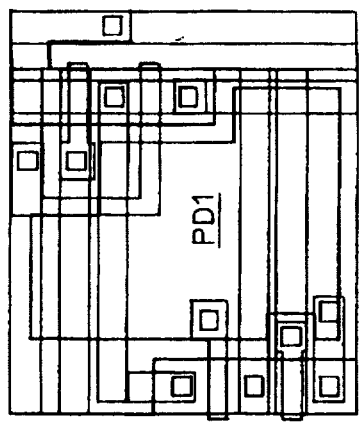
FIG. 72B
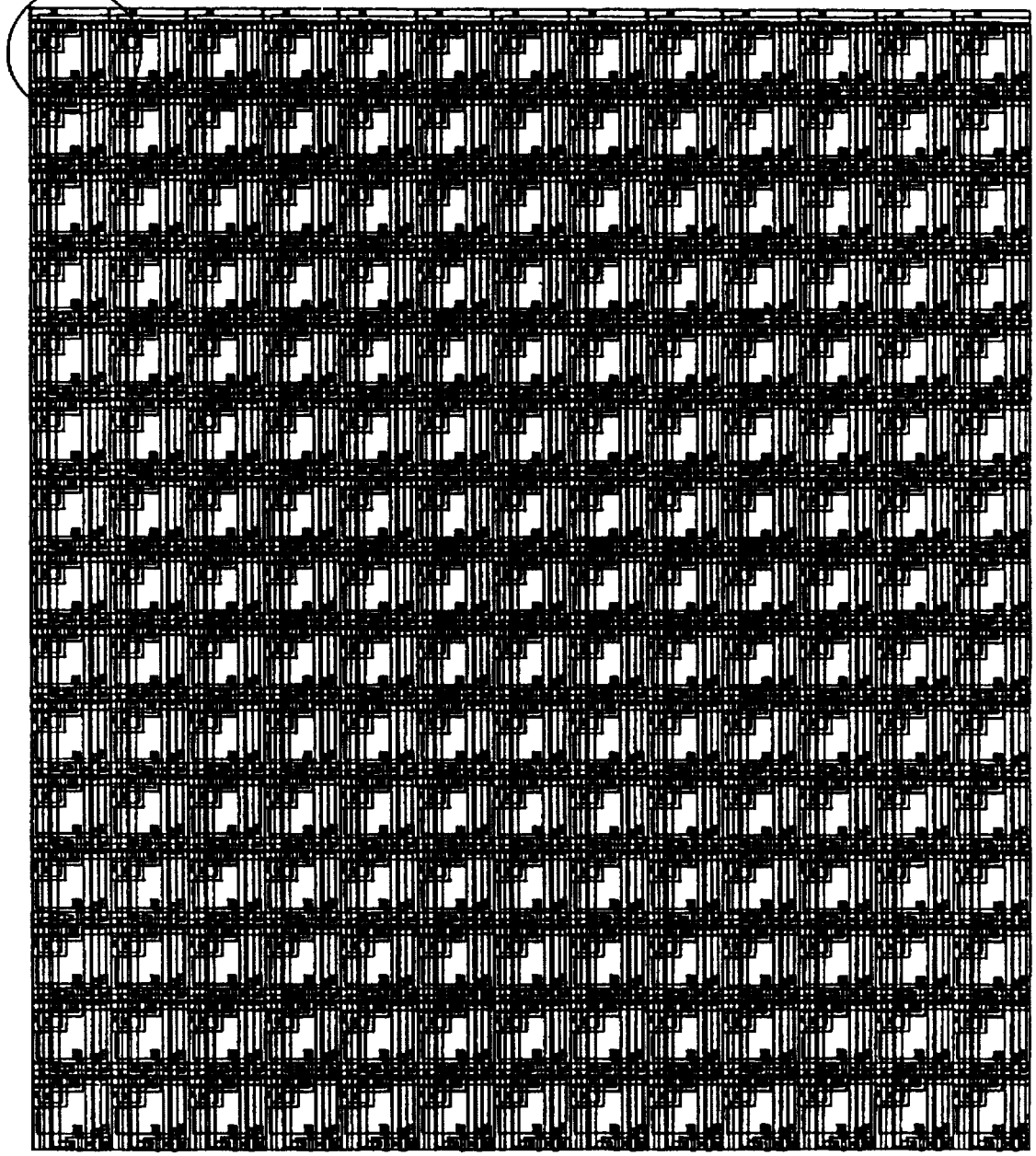
FIG. 72A

OPTICAL RANDOM ACCESS MEMORY

CROSS REFERENCE TO EARLIER FILED APPLICATION

This application is a continuation-in-part of application Ser. No. 07/815,924, filed Dec. 30, 1991, now U.S. Pat. No. 5,379,266, claimed through international application PCT/US92/11356, filed Dec. 30, 1992.

BACKGROUND OF THE INVENTION

The invention concerns method and apparatus of optically storing and retrieving mass digital data stored as light altering characteristics on an optical material and providing fast random access retrieval.

Optical memories of the type having large amounts of digital data stored by light modifying characteristics of a film or thin layer of material and accessed by optical addressing without mechanical movement have been proposed but have not resulted in wide spread commercial application. The interest in such optical recording and retrieval technology is due to its projected capability of faster retrieval of large amounts of data compared to that of existing electro-optical mechanisms such as optical discs, and magnetic storage such as tape and magnetic disc, all of which require relative motion of the storage medium.

For example, in the case of optical disc memories, it is necessary to spin the record and move a read head radially to retrieve the data, which is output in serial fashion. The serial accessing of data generally requires transfer to a buffer or solid state random access memory of a data processor in order to accommodate high speed data addressing and other data operations of modern computers. Solid state ROM and can provide the relatively high access speeds that are sought, but the cost, size, and heat dissipation of such devices when expanded to relatively large data capacities limit their applications.

Examples of efforts to provide the relatively large capacity storage and fast access of an optical memory of the type that is the subject of this invention are disclosed in the patent literature such as U.S. Pat. No. 3,806,643 for PHOTOGRAPHIC RECORDS OF DIGITAL INFORMATION AND PLAYBACK SYSTEMS INCLUDING OPTICAL SCANNERS and U.S. Pat. No. 3,885,094 for OPTICAL SCANNER, both by James T. Russell; U.S. Pat. No. 3,898,005 for a HIGH DENSITY OPTICAL MEMORY MEANS EMPLOYING A MULTIPLE LENS ARRAY; U.S. Pat. No. 3,996,570 for OPTICAL MASS MEMORY; U.S. Pat. No. 3,656,120 for READ-ONLY MEMORY; U.S. Pat. No. 3,676,864 for OPTICAL MEMORY APPARATUS; U.S. Pat. No. 3,899,778 for MEANS EMPLOYING A MULTIPLE LENS ARRAY FOR READING FROM A HIGH DENSITY OPTICAL STORAGE; U.S. Pat. No. 3,765,749 for OPTICAL MEMORY STORAGE AND RETRIEVAL SYSTEM; and U.S. Pat. No. 4,663,738 for HIGH DENSITY BLOCK ORIENTED SOLID STATE OPTICAL MEMORIES. While some of these systems attempt to meet the above mentioned objectives of the present invention, they fall short in one or mere respects.

For example, some of the systems proposed above have lens or other optical structure not capable of providing the requisite resolution to retrieve useful data density. The optical resolution of the data image by these prior lens systems does not result in sufficient data density and data rate to compete with other forms of memory. Although certain lens systems used in other fields such as microscope objectives are theoretically capable of the needed resolutions, such lens combinations are totally unsuited for reading data stored in closely spaced data fields. Another difficulty encountered with existing designs is the practical effect of temperature and other physical disturbances of the mechanical relationship between the data film or layer, the lens assemblies and the optical sensors that convert the optical data to electrical signals. For example, the thermal expansion effects of even moderate density optical memories of this type can cause severe misregistration between the optical data image and the read out sensors. Similar difficulties are encountered in the required registration between the recording process and the subsequent reading operations. Intervening misregistration of the high density optical components can cause significant data errors if not total loss of data.

Accordingly, it is an object of this invention to provide an optical mass memory having random accessibility in a relatively compact size comparable to or even smaller than tape and compact disc storage mechanisms and yet still serving data processing equipment in the same manner that solid state random access memories move data into and from the processor's data bus.

SUMMARY OF THE INVENTION

Data is stored in an optical data layer capable of selectively altering light such as by changeable transmissivity, reflectivity, polarization, and/or phase. In the case of a transmissive data layer, data bits are stored as transparent spots on a thin layer of material and are illuminated by controllable light sources. An array of imaging lenslets project an optically enlarged image of the illuminated data onto an array of light sensors. The layer of data is organized into a plurality of regions or patches (called pages) and by selective illumination of each data page one of the lenslets images the data page onto the array of light sensors. Transmitted page data, in this case light passed through the transparent bit locations on the data layer, strike different ones of the arrayed light sensors, thereby outputting a pattern of binary bits in the form of electrical data signals. By selectively and sequentially illuminating different ones of the data regions (pages) on the data layer, correspondingly different data patterns are imaged by the corresponding lenslets onto the same photosensor array, thereby enabling many data pages to be multiplexed at electrooptical speed onto the common photosensor array image plane.

The data storage and retrieval system of the present invention is embodied in read-only devices, write-only devices, and in read/write configurations as described more fully below in the detailed description. A preferred form of the invention is to fabricate the data layer and lenslet array as a bonded structural unit or card, much like a sandwich of different layers of material, to thereby fix the optical distances and registration of these elements. This bonded data/lens card structure minimizes the adverse optical effects of differential thermal expansion between the data layer and the lenslets and allows for an exceedingly dense data pattern. A further aspect of this sandwiched data and lenslet card structure is to immerse the data layer in the space adjacent the lenslets in a transparent material of select index of refraction relative to air and to the lenslet so as to control the angle of divergence of data image rays emanating from the data layer and still provide refractive power at the first surface of the lenslet. This immersion material is preferably also a structural bonding layer made of a transparent polymer described more fully below. The resulting structure, which can be fabricated at a relatively low per unit cost, provides an effective way of achieving the imaging power needed to faithfully form the data image onto the common photosensor array, notwithstanding the very dense, compact arrangement of the data.

Still another aspect of this preferred form of the lenslet array is that the first surface of each lenslet, i.e., adjacent the data layer, is aspherically contoured to enhance the optical resolution of the exceedingly small and dense patch of data that is to be imaged. The data layer and lenslet array together with the transparent immersion/bonding layer can be fabricated at a cost that allows the structure to be made and effectively and efficiently used as a replaceable data card.

Further still, the preferred form of the write only and read/write embodiments of the invention uses the bonded data lenslet structure as a blank data card in the write systems for recording data through the fixed lenslet array. The recording data pattern is thus projected and condensed by each lenslet onto the selected data layer page of the record medium.

An additional aspect of the preferred form of the invention is the placement of a diffractive corrector adjacent the refractive lenslet surfaces opposite the data layer to correct for optical aberrations introduced by the lenslet optics in the environment of overlapping data image rays from adjacent pages due to the close compact spacing of the data and lenslets. This diffractive corrector, which may take the form of a diffractive grating or a holographic optical element, is formed with optical modifying grating or holographic ringlets, each substantially centered on the optical axis of corresponding lenslets and having overlapping portions at increasing ringlet radius. As a result, the optical ray bundle leaving each lenslet is diffracted in a manner that minimizes effects of various forms of optical aberrations. The data image reaching the photosensor plane is therefore sharp, with minimum distortion in spite of the closely packed multiple lenslet configuration. In a preferred form of the invention, the diffractive corrector is followed by a field lens that has a single common aperture encompassing the entire lenslet array and serves to bend the various rays of light associated with the images of different data pages onto the common image read out plane of the photosensor array.

Still another preferred aspect of the data layer, lens array and cooperating photosensor array is to arrange the data pages in a close-packed geometry as contiguous cells, preferably hexagonal in shape. Within each cell the data bits are arrayed in a suitable pattern such as orthogonal rows and columns. The refractive elements of the lenslets are also preferably cellular in shape to conform to the data pages. Complementing the hexagonal cell shape of the individually selectable data pages is the arrangement of the sensor sites on imaged data plane in a correspondingly shaped but substantially larger hexagonal field. The projected image of data bits fills up the hexagonal sensing plane field and makes more efficient use of the lenslet and diffractive corrector optics given the close spacing of these individual elements.

In association with this preferred cellular configuration of the data regions or pages and sensor array, the individually energizable light sources, which may be diode emitters, either laser or LED, or may be other solid state or controllable devices, are likewise preferably formed in a hexagonal cell pattern. Each light source is of substantially the same shape and configuration as its associated hexagon data region or page. A preferred form of the array of light sources is to pack into each hexagonal shaped light source cell a plurality of concurrently energized solid state emitters, thereby producing the illumination energy and area coverage best suited for imaging the data layer onto the distant photosensor array.

A preferred configuration and several alternative write/read configurations of the invention are disclosed. In the preferred form, the read-only assembly is modified to add a write subassembly by using a diagonal beam splitter in the optical read path to accommodate an assembly of data page recording or composing light sources and light valves, and imaging optics located to the side of the read optics path for injecting a record data image into an entrance pupil of a lenslet (opposite the data layer). During recording, a blank data/lenslet card is installed in the assembly. An array of write or recording light sources are disposed at a predetermined distance from a write imaging lens which in turn causes a full page of a data light pattern to be projected through a wall of controllable light valves which are set open or closed to compose a data pattern. The resulting illuminated data page composed by the light valves is then transmitted toward and reflected by the diagonal beam splitter in the path of the read optics so that the projected write image is now in the optical path that includes the field lens, diffractive corrector, and lenslet array as described above and is condensed and recorded on the blank data layer.

Data storage may be by thermal, photochemical or energy storage techniques. For example, known metallic films such as Tellurium, or photochemical films such as silver halide, diazo, or other optical data storage processes such as dye-polymer or magneto-optical are employed for this recording operation. The primary advantage of recording through the data/lenslet card is the substantial elimination of geometric distortion due to intrinsic characteristics of the lens system. Also, since the recording process is substantially the reverse of optical read imaging, optimum position registration, thermal stability and reliability are achieved.

Alternative forms of the write/read embodiment are disclosed and include a variation on the forgoing preferred embodiment in which the light valves in the subassembly of the recording optics are replaced by reflective light modulators.

Another alternative embodiment of the write/read system is to again place the recording optics and page composer in a side wall or side subassembly of the housing, but using in this case a set of recording light sources that are arrayed in the configuration of a data page. The light sources are energized according to the desired data pattern for each page that is to be recorded. An electromechanical mover or servo mechanism is used to align an array of microlenses, functioning collectively as a field lens, to controllably direct the light ray bundles of the composed data page light sources for maximizing recording light energy through the beam splitter and field lens into a specific one of the lenslets which in turn condense and image the composed data page onto the data layer for recording. A plurality of light shutters, such as an LCD array, are preferably interposed in front of the lenslet array in this embodiment in order to open the optical path for only a single lenslet at a time and to block stray light rays from entering adjacent lenslets.

In the read-only and write/read assemblies, the sensor array is preferably provided by a layer of charge coupled devices (CCD) arrayed in the pattern of the projected data page and causing the data light images to generate charge coupled data that is then outputted into data bucket registers underlying the photosensitive elements of the charge coupled devices. Alternatively, other output sensor arrays may be employed, including an array of photosensitive diodes, such as PIN type diodes.

Another preferred aspect of the disclosed embodiments of the invention is to provide means for adapting (changing)

the light threshold that triggers each photosensor site to switch binary state, e.g., from a "0" to a "1" output bit signal. A preferred form of such adapted threshold is a network of cross-coupled biasing resistors for variably biasing each sensor switching threshold as a function of light sensed at neighboring sensor sites. The biasing resistors are weighted depending on the proximity to the subject sensor site.

An alternative form of the invention, preferred for certain applications, combines photosensors and emitters interspersed on the same plane that receives the read image. The sensors read the data image as above. The emitters on the sensor plane are used in a write mode to compose a data page that is to be recorded and the composed page is then imaged back through the optics (reverse from read) tow rite the data onto selected pages of the data layer using light blocking shutters in the path to screen off the non-selected pages.

It is therefore seen that the present invention provides an enormous data storage capability having random access speeds that approach, if not exceed, the fastest solid state RAMs and ROMs. Moreover, the organization of the data output capability of the present invention enables unusually large data words to be accessed virtually at the same instant, such as at a single clock time. Since the entire data page, when imaged on the photosensor array, conditions the array to output all of the data from that page at any given instance, the size of the output word is limited only by the number of bits in the sensor array and the addressing electronics cooperating with the sensor array. Since the array itself can be interrogated along rows and columns of data, each of which may be on the order of 1,000 bits per row or column, this allows the system of the present invention to output a data word on the order of 1,000 bits, or selected and variable portions thereof as needed. Such relatively large output words provide important applications of the present invention to such systems as computer graphics, "correlation engines" of computer based industrial systems, and other computerized or digital based systems.

These and other features, objects, and advantages of the invention will become apparent to those skilled in the art from the following detailed description and appended drawings.

BRIEF DESCRIPTION OF THE DRAWINGS

FIG. 4 is a plan view showing schematically the layout of individually switchable light sources for illuminating data regions or pages during readout and showing the arrangement of such light sources as contiguous hexagonal cells.

FIG. 5 is a plan view similar to FIG. 4 showing the layout of the data layer and FIG. 5-1 is a blow-up of one of the hexagonal data pages of the layer depicting the orthogonal array of rows and columns of data bits within a single data page.

FIG. 6 is a plan view similar to FIGS. 4 and 5 showing the array of lenslets in a hexagonal cell pattern that cooperates in a one-to-one lenslet to page registration with the hexagonal data layer pattern shown in FIG. 5.

FIG. 7 is a plan view of the diffractive corrector that is disposed adjacent the lenslet array on the side opposite the data layer for optically modifying and correcting the image rays projected by the individual lenslets as described more fully in the detailed description and FIG. 7-1 is an enlarged view of a fragment of the corrector.

FIG. 8 is a plan view of the rectangular field lens that encompasses the entire field of data page image rays available from the lenslets of FIG. 4 and directs such image rays to a common sensor plane.

FIG. 9 is a plan view showing the layout of the photosensors at the image sensing plane but depicted schematically at a greatly reduced density for illustration purposes.

FIG. 10a is a section of the bonded structure of the data layer and lenslet array usable as a replaceable data storage card or unit.

FIG. 10b is an enlarged fragment view of the lenslet and data layer of FIG. 10a.

FIG. 10c is another section similar to FIG. 10a showing the arrangement of the data layer and lenslet structure mounted in registration and in face-to-face proximity with the multiple read light sources, in this instance LED sets, serving as the read illumination for the embodiments of FIGS. 1-3.

FIG. 13 is an enlarged schematic view of the arrangement and interaction of certain principal components of the invention including the data/lens bonded structure, the diffractive corrector, a field lens and the photosensor array, and showing the optical paths of data bit light rays from the data layer enlarged and imaged on the sensor array through the various optical components.

FIGS. 14a and 14b are block diagrams, respectively, of the data write addressing and control, and data read addressing and control electronics associated with the memories of FIGS. 1, 2 and 3.

FIG. 15a, 15b and 15c are various structural and circuit schematic diagrams of the preferred embodiment of the sensor array and associated electronics.

FIG. 17 is an alternative embodiment of a write/read system in a section view similar to FIG. 2, using many of the same elements as the above briefly described embodiments but having reflective light modulators to compose the data page during a write (recording) mode.

FIG. 18 is another alternative embodiment of a write/read system in a section view similar to FIGS. 2 and 17, in which the data page is recorded by composing it on an array of selectively energized data record lights and then imaging that composed page onto the data layer through an array of micro lenses and individually selectable LCD light shutters and employing a set of electromechanical movers to variably position the micro lens array for optimum recording light imaging.

FIG. 19 is a plan view of the micro lenses and associated electromechanical movers used in the write mode of the embodiment of FIG. 18.

FIG. 20 is another plan view similar to FIG. 19 showing the pattern of composed data during write operation of the system of FIG. 18, depicted at greatly reduced density.

FIG. 23 is a section view of an alternative write/read embodiment having a composite of interspersed photosensors and photo emitters on a common substrate at the read image plane for composing recording data pages at the same plane as the read image data is sensed.

FIGS. 24a and 24b are fragmentary plan views of the circuit layout of the combined photosensor and emitter array of the alternative embodiment of FIG. 23, in which FIG. 24b is an enlarged plan view of one composite sensor-emitter site of the many sites shown in FIG. 24a and illustrating the adapted threshold network and interconnect leads integrated into a common large scale integrated (LSI) circuit.

FIG. 24c is a circuit schematic of the adaptive threshold sensor network integrated into each sensor site on the LSI circuit of the embodiment of FIGS. 23, 24a and 24b.

FIG. 25 is a schematic diagram similar to FIG. 11, of an alternative optical system for use in the embodiments of FIGS. 1-3 in which the composite refractive-diffractive surfaces of the lens system are replaced by a system of first and second diffractive surfaces interposed by a color correction anomalous lens.

FIG. 26 is an enlarged schematic diagram of the lens system of FIG. 25 showing the anomalous color correction lens in its preferred configuration FIG. 27 is an element.

FIG. 27 is an overall schematic view of the optical system of the alternative embodiment shown in FIGS. 25 and 26 showing the data layer, first diffractive surface, anomalous lens element, second diffractive surface, and the field lens for imaging the data on the-distal sensor plane.

FIG. 33 sets forth the optical equations used in computing the lens prescription for the color correcting anomalous lens.

FIG. 49 is a plan view of one depicting fiducial marks associated with a page of optical data.

FIG. 50 is a cutaway side elevation view of an optical memory module for reading a single chapter of optical data.

FIG. 51 is a cutaway plan view of the module of FIG. 50.

FIGS. 52A through 52E are various views of registration adjusters utilizing wax or polymer filled sheaths.

FIGS. 53A and 53B are views of a registration adjuster utilizing a solenoid.

FIG. 59 is a rear elevation sectional view of the game cartridge of FIG. 58.

FIG. 60A is a vertical section view similar to FIG. 18, showing an alternative write/read embodiment in which the electromechanically moved microfield lens array is replaced by a fixed microfield lens array and a dynamic ultrasonic lens module for directing light from each composed data page to select individual pages on the recording media for writing the data.

FIG. 60B, 60C and 60D show, respectively, a front elevation view of the ultrasonic lens module, a block diagram of the control electronics for the ultrasonic lens module, and wave form diagrams of the relative phase of ultrasonic waves launched into the lens module.

FIGS. 66A, 66B and 66C show an alternative embodiment using color light sources and corresponding color filtering to achieve a functionally similar result to the embodiment of FIGS. 65B, 65C and 65D above, respectively.

FIGS. 72A, 72B, 72C and 72D are, respectively, a sensor integrated circuit (IC) layout, an enlarged layout for one sensor bit, a greatly enlarged IC layout of the single bit detection and logic, and a schematic diagram of the detector and logic for a single sensor cell.

FIG. 73B is a flow chart of the signal processing of data A (information) and surrounding data B (background) processed from the raw signal outputs developed at the sensor array; and FIG. 73C is a top plan view of a data image with corner fiducials shown enlarged in FIG. 73C-1 used in the signal processing of FIG. 73B.

DETAILED DESCRIPTION

Figure 1:
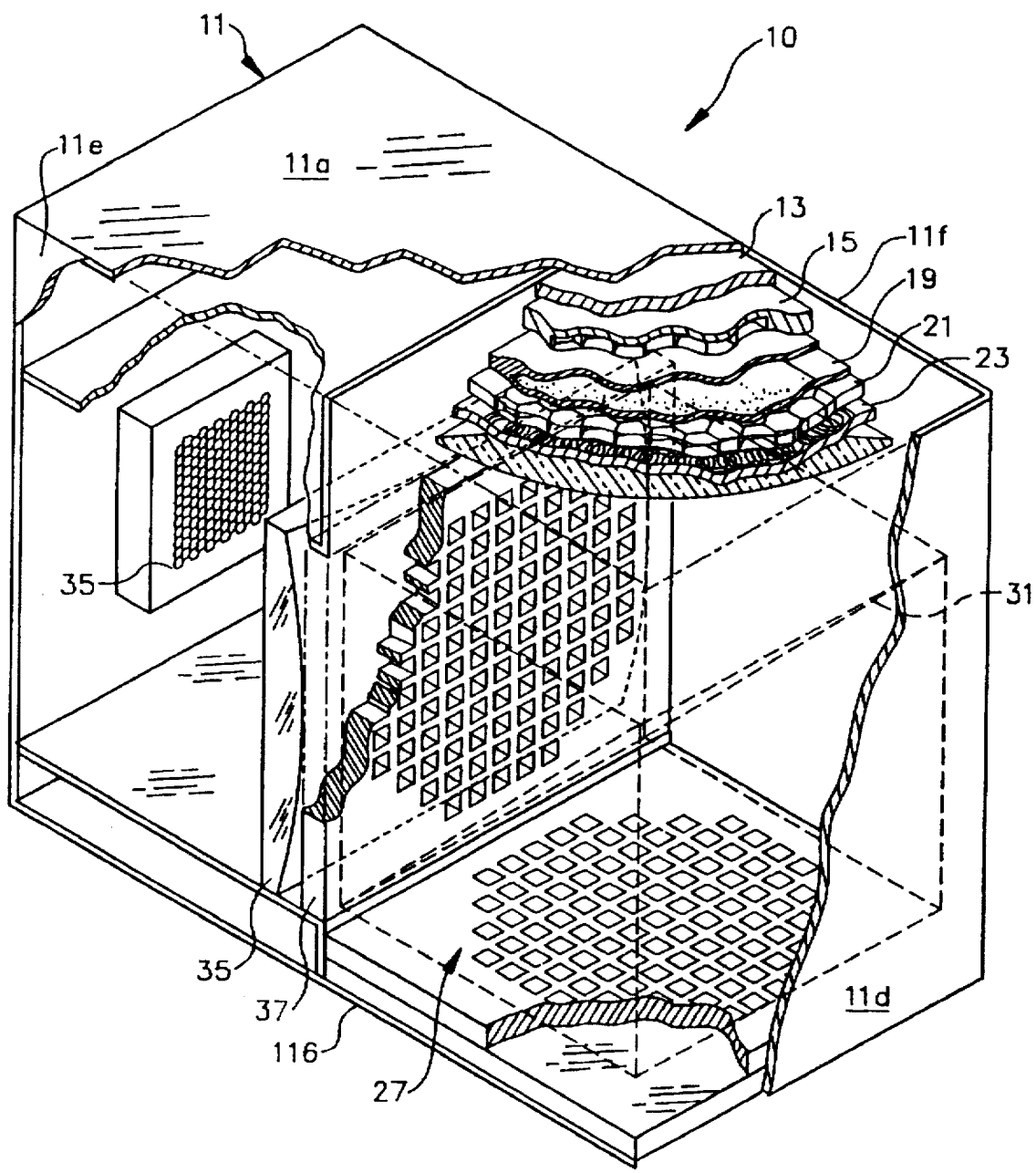
FIG. 1 is an isometric view, partly cutaway, of a write/read embodiment of the invention showing a housing for the various electrical and optical components of the optical random access memory of the present invention.
Figure 2:
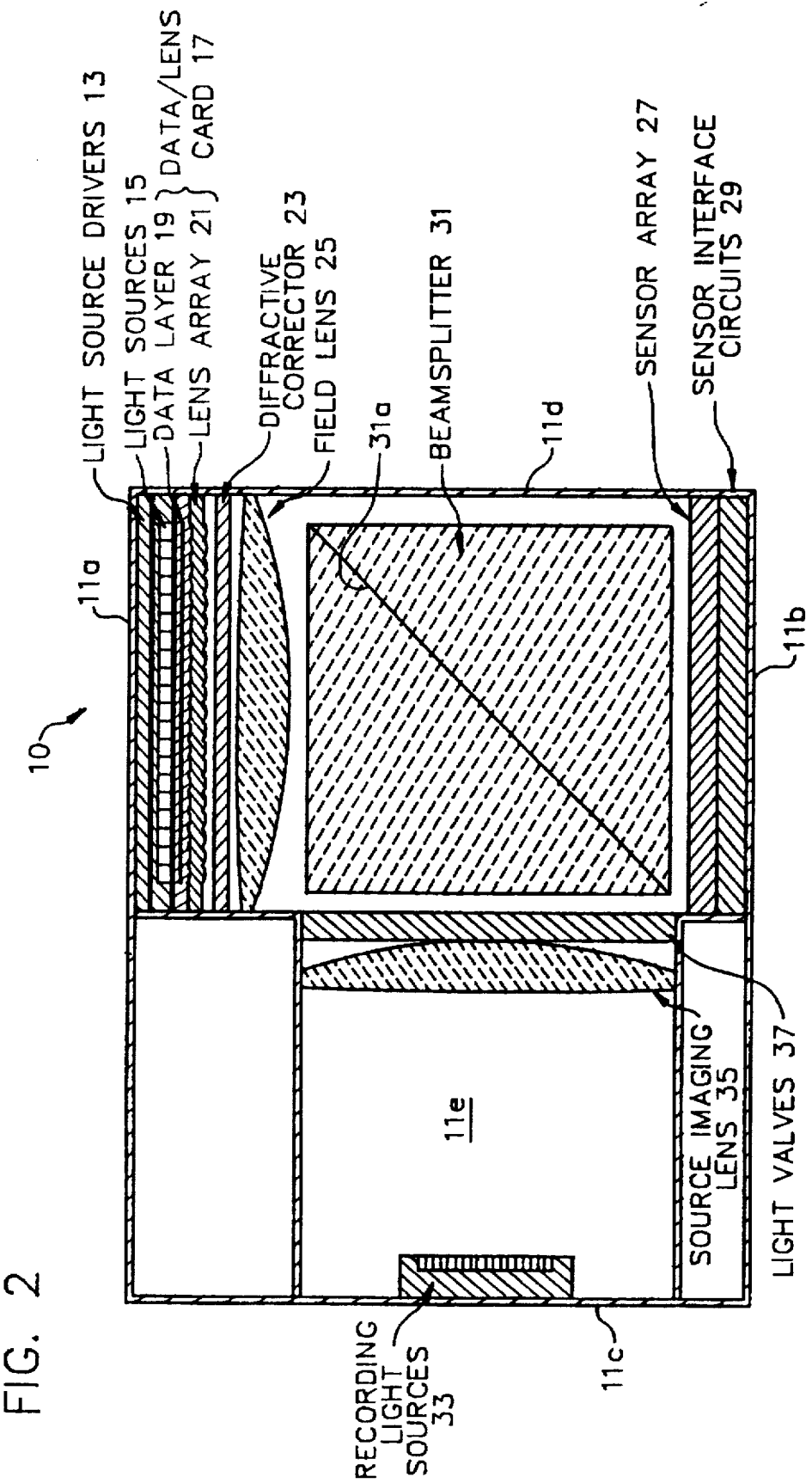
FIG. 2 is a full section view in elevation of the optical memory of FIG. 1.

With reference to FIG. 1 and 2, a preferred form of a write/read configuration of the optical random access memory 10 in accordance with the invention is shown to include a housing 11 of a regular polygon shape, in this instance including top and bottom walls 11a and 11b, respectively; opposing side walls 11c and 11d, and front and back walls 11e and 11f, respectively. Although not critical to the invention, in this embodiment the housing 11 is substantially bisected into left and right chambers each of a generally cubical configuration in which the right hand chamber as viewed in FIG. 2 contains the electronics and optical components for reading data by projecting a data image onto a photosensor array disposed adjacent the bottom wall 11b at the right hand side of the housing. The left hand chamber of housing 11 contains the electronics, light sources, and other optics that function to compose and record data images onto a blank data film or layer positioned in the right hand chamber as described more fully below.

READ COMPONENTS

To more easily understand the construction and operation of the combined write/read system shown in FIGS. 1 and 2, only those elements of the system used for reading data will be described first, then the write (or record) elements will be introduced and explained. Thus, with reference to the right hand side of the bisected housing 11, there is provided adjacent the upper housing wall 11a, an array of light source drivers 13 formed in an integrated circuit and coupled by micro leads (not shown) to an array of solid state photo-emitter elements serving as the read light sources 15. Light sources 15 are mounted on a circuit board or other integrated structural unit to fix the sources in a closely packed dense light pattern that will be described more fully in connection with FIG. 4. Immediately beneath and parallel to light sources 15, a unitary data/lens card structure 17 is removably mounted for storing on a data layer 19 binary information bits organized in multiple data pages or regions. A complementary lens array 21 is bonded to layer 19 and has a plurality of lenslets disposed in precise, fixed optical registration with each multi-bit data region or page. Unitary data/lens structure 17 is fabricated as a bonded unit so that the array 21 of lenslets is fixed in spatial relation to the data layer 19 and so that the structure 17 is readily removable as a unit from housing 11 of the optical memory 10.

To enhance the resolution of the light image rays emanating from data/lens structure 17, a diffractive corrector 23 of generally planar shape is located adjacent second surfaces of lens array 21, i.e., opposite the data layer and first lens surfaces. Following diffractive corrector 23, the data images projected from data layer 19 and lens array 21 upon illumination by light sources 15 are further redirected by field lens 25 having an aperture that encompasses the entire depth and width of the right hand chamber of housing 11. Hence, field lens 25 in this embodiment is of generally rectangular shape about its perimeter as best shown in FIG. 8 and otherwise has conventional spherical or plano optical surfaces as described more fully herein.

The foregoing elements of the read function of optical memory 10 occupy generally the upper one third of the right hand chamber of housing 11. Beneath the field lens 25 there is an open cavity that allows for the optical convergence of the data image rays which in turn form the data image onto an upwardly facing common image plane of sensor array 27. The data image projected onto array 27 in this preferred embodiment is in the shape of a hexagon, as is shown in FIG. 9, to conform to the image generating data pages on layer 19, and the light sources and optics; however, the sensor array 27 itself may have a substantially rectangular or, in this case, square perimeter. Beneath sensor array 27 is located the sensor interface circuitry 29 which is preferably fabricated as an integrated or printed circuit wafer of similar thickness and rectangular perimeter to complement and lie subadjacent sensor array 27 as shown. The free space that would exist between field lens 25 and sensor array 27 in which the image magnified by lenslet array 21 is occupied in this embodiment by a substantially cubical beam splitter 31 having a diagonal beam splitting plane 31a for cooperating with the writing (record) functions of this optical memory 10 in which a composed record page is generated in the left hand chamber of housing 11 and projected in reverse fashion as described more fully below.

Thus, in operation, a single page of binary data selected on data layer 19 by energizing a chosen cell of light sources 15, causes a data image to be generated that appears generally in the shape of the data image shown in FIG. 9 (although it is depicted at a greatly reduced density for illustration). The image has roughly the shape of a hexagon and fills the image plane on the upper surface of sensor array. The individual data bits within a single data page are here arranged as shown in FIG. 5 in closely spaced rows and columns and at densities that use to advantage high resolution optical films and other record media including but not limited to photochemical films. To provide storage competitive with other types of memory, the data bits must be in a size range of 2.25 to 0.5 microns and a center-to-center spacing also in that range. Each data page is formed by the amount of individual data bits that can be collected and grouped into a single hexagon cell as shown in FIG. 5 and at the preferred density range of $2\times10^7$–$4\times10^8$ bits per $cm^2$, it has been found that about $10^6$ (1 megabit) of data per page (or region) is an advantageous quantity that results in the generation of a data image after magnification that can be reliably sensed by photosensitive elements of sensor array 27. In this case, the preferred embodiment provides an optical magnification through the various lens assemblies of approximately 20 to 30 times. Thus, assuming a magnification of 25, the spacing of the projected image elements on sensor array 27 is on the order of 25 microns and a hexagon cell consisting of a page of data will, in this embodiment, contain one million data bits per page that are imaged on a corresponding number of photosensitive elements in array 27. The particular structure and operation of the sensor array 27 and various alternatives to the preferred embodiment are described in greater detail below. For the present, however, it will be appreciated that each data bit which may be represented by spots of light from the imaged page, causes a photosensitive element of sensor array 27 to either conduct or nonconduct depending on whether the data is a "1" or a "0" bit. Although different forms of data layer 19 may be employed, in the present preferred embodiment that data layer 19 is a transmissive mask or film in which binary "1" bits are transmissive while binary "0" bits are opaque or light blocking.

It will thus be seen that the read elements and operation of optical memory 10 provide for accessing each of hundreds of pages of data having, for example, one million bits per page at 1 micron bit size. The read out of data from sensor array 27 is described in greater detail in connection with FIGS. 14b, and 15a, 15b and 15c; however, it is seen that by selecting a single data page on data layer 19 by energizing one cell of the LED or laser diode light sources 15 an entire page of $10^6$ bits is made available at the interface circuitry 29 associated with sensor array 27 at speeds typical of electro-optical switching, e.g., equal to or less than 50 nanoseconds. Data words that make up different portions of the entire page may be addressed, such as a column or row of data on each page, or the entire page may be output. Each row or column of data within an accessed page may contain as many as one thousand data bits, hence making fast retrieval of exceedingly long bit words of this magnitude within the capability of the optical memory 10. In terms of dimensions, a one million ($10^6$) bit page imaged on sensor array 27 will occupy a hexagon that would fill an area of 6.5 $cm^2$ or about 1 square inch. Similarly, at the above stated preferred density range of $2\times10^7\times4\times10^8$ bits per $cm^2$, an area of 6.5 $cm^2$ (about 1 square inch) contains as many as 640 patches or pages of data, each patch or data page being almost instantaneously selectable ($\leq 50$ nanoseconds) and retrievable by the high speed switching capabilities of electro-optical and electronic addressing devices. In effect, the multiple pages of data bits are multiplexed onto the image plane at sensor array 27 by electronic switching of read light sources 15. The output data is available in the above-mentioned form for direct (without buffer storage) application to a processor data bus.

Further details of the construction and operation of the read function of optical memory 10 will be described in conjunction with a separate read-only system shown in FIG. 3 and the corresponding electronic and optical components depicted in FIGS. 4–15. It will be appreciated that these read function components, used separately in the read-only system of FIG. 3, correspond to the read elements in the combined write/read optical memory 10 shown in FIG. 1 and 2 but for the intervening beam splitter 31.

RECORDING COMPONENTS

Now with further reference to FIGS. 1 and 2, the write or recording function of optical memory 10 is provided primarily by the components located in the left hand chamber of housing 11. These include an array of page illuminating light sources 33, light source imaging lens 35, and an array of LCD light valves 37 located substantially at the bisector of housing 11 and hence to one side of the read-only optics of optical memory 10 described above. The module of recording light sources 33 is formed by an array of light emitters such as LEDs or laser diodes arrayed in a configuration that complements the arrangement of pages on data layer 19 which, in this embodiment, are in the hexagonal cellular pattern as shown in FIG. 5. Each element of light sources 33 is hence positioned within the optical path of memory 10 so as to cause light to be imaged by lens 35 over the entire face of light valves 37 which compose a full page of data bits by open or closed condition, onto a single page of data layer 19. More particularly, the recording image is reflected at the beam splitting diagonal plane 31a of beam splitter 31 and is then condensed in reverse optical processing (compared to the read mode) by field lens 25, diffractive corrector 23, and one of the lenslets of lens array 21 that is associated with the selected data page on layer 19 to be recorded. The geometrical and optical positioning of the pattern of light sources 33, when individually energized, cause the data composed by valves 37 to be recorded onto the selected page of layer 19.

It is noted that the relative dimensions of light sources 33 are somewhat smaller than might be expected by comparison with the pages on data layer 19 and the lenslets of array 21. The dimensions of sources 33 can be different from the array of pages on data layer 19 because the imaging process changes magnification through source imaging lens 35. In this preferred embodiment, the dimensions of light sources 33, both as a collection of sources and as individual light elements, is one half of the size of the pages of the data array on layer 19. A magnification of two times is provided by source imaging lens 35 in order to expand the illuminating recording light rays which are then passed by light valves 37 into the right hand chamber of housing 11. The data image is then deflected by beam splitter 31 up into the image condensing pupils of lens array 21 and onto the plane of data layer 19 for recording. Light valves 37 are preferably liquid crystal device (LCD) shutters interfaced to the data composing registers (see FIG. 14a) which sets the shutters according to whether the recorded bits are to be transmissive or opaque. Alternatively, light valves 37 may be ferroelectric shutters or other devices that alter the light that then fixes the data image on layer 19. Since light valves 37 collectively form a full page of data bits, there are in this embodiment $10^6$ million light valves fabricated on an integrated LCD shutter wafer that in turn is mounted as a prefabricated layer in the housing 11 as shown. In order to keep the same object-to-image size relationship for recording and reading, the effective recording and reading path lengths should be the safe.

In operation of the optical memory 10 of FIGS. 1 and 2, it will be appreciated that the system may be used for both writing (recording) and reading (data access) operations.

Thus, the recording function of optical memory 10, including the imaging optics of lens 35, field lens 25, diffractive corrector 23, and multiple lens 21, causes the composed data image in light valves 37 to be reduced in size (on the same principle as a photographic enlarger except in reverse, i.e., making smaller) with the source imaging lens 35 serving as a condenser. The data light rays to be recorded fill the entrance pupil of one of the lenslets of array 21 where the data pattern is further condensed and imaged onto the data layer forming layer 19 where the data is stored by optical recording processing techniques known per se, such as silver halide, diazo and/or others. The light valves 37 are selectively opened or closed to compose the data page, and serve as the counterpart of a negative in a photographic enlarger while the data layer 19 serves as the print paper. As an alternative to the configuration of optical memory 10 of FIG. 1 and 2, the data read function can be provided by a modification in which the data layer 19 of structure card 17 is made reflective rather than transmissive. A reflective record can then be used in conjunction with light sources 33 serving both as record lights as described above, and in a read mode as multiplexed read light sources in place of read light sources 15. In such case, during read, a selected one of light sources 33 is turned on, causing a source of illumination to be directed to and reflected off of a selected page of reflective data on layer 19 and returned through the beam splitter plane 31a of beam splitter 31 to the sensor array 27 where the reflected image would be output by addressing array 27 using interface circuitry 29.

READ-ONLY MEMORY

Figure 3A:
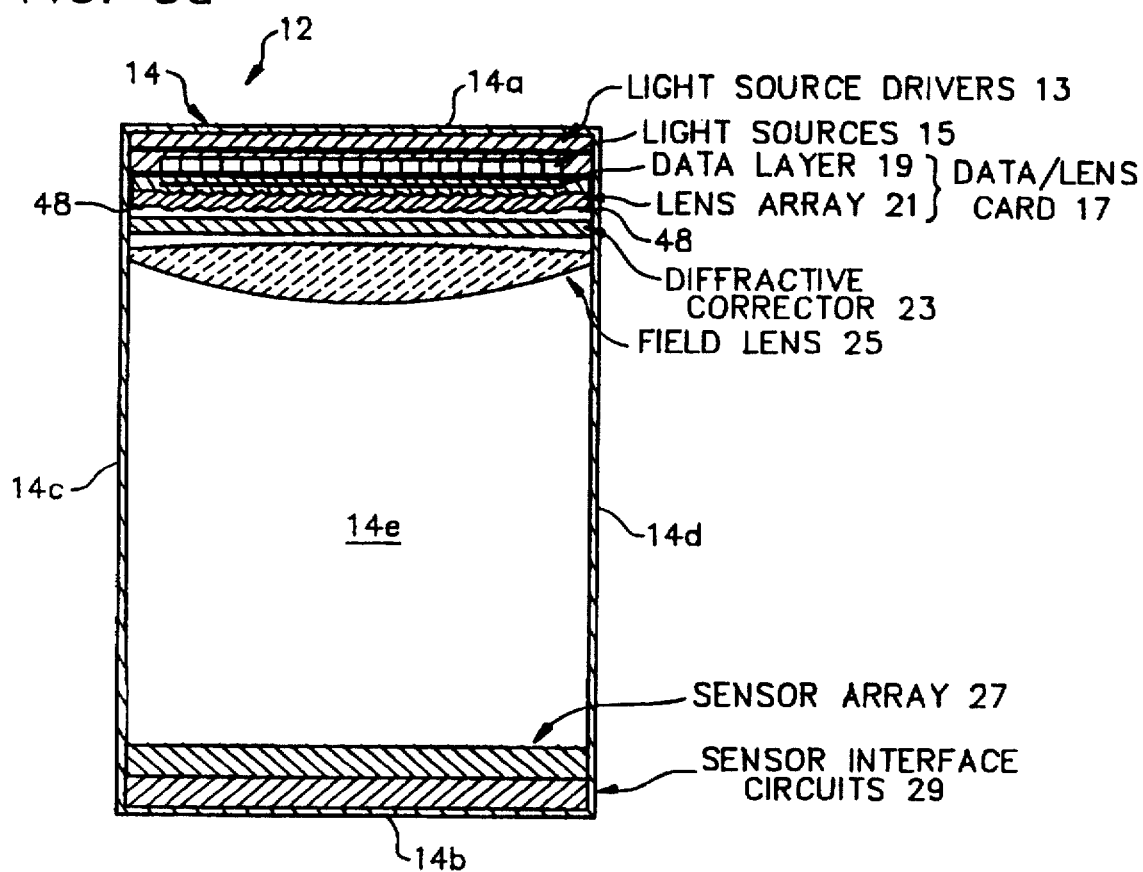
FIG. 3a is a section view in elevation of an embodiment of a read-only optical memory in accordance with the present invention.

FIG. 3a shows a preferred form of a read-only optical memory 12 for use in retrieving data that has been stored on data layer 19 and more particularly on a data/lens array card 17 using a data writing technique described above in connection with optical memory 10 or prepared by other recording or reproduction processes including mass copying techniques such as contact printing. Thus, using read-only optical memory 12, a data/lens array card 17 is installed in an optical memory housing 14 similar to housing 11 of optical memory 10 but in this case being provided by a housing consisting of only the right hand chamber of the write/read housing. Using an arrangement of the read electronics and optical components that is substantially the same as in the read section of write/read optical memory 10, read-only optical memory 12 has light source drivers 13, light sources 15, data layer 19 and lens array 21 constituting card 17, diffractive corrector 23 and field lens 25 all arranged in relatively close-layered relation, if not in face-to-face contact, in the upper portion of the optical memory housing 14 near top wall 14a as shown. Similarly, adjacent the bottom 14b of housing 14, sensor array 27 is mounted along with the associated sensor interface circuitry 29. In this form of the invention, the read data image is retrieved from each page of data layer 19 by multiplexing the arrayed light sources 15, causing the images to be projected as described for the read operation, onto the image plane of sensor array 27.

As individual sensor sites on array 27, organized in a data pattern such as shown in FIG. 9, are either illuminated or dark, depending upon the data bit, the corresponding sensor element is conditioned to output a "1" or "0" data bit when addressed. As also discussed, the output data available from sensor array 27 through associated sensor interface circuitry 29 is at an unusually high data rate in which entire column and row words on the order of 1,000 bits each are retrievable in parallel at a single clock time. Alternatively, individual bits or partial words can be retrieved by high speed random access addressing of array 27 and circuitry 29 without the constraint of slow speed serial read out typical of other optical memories such as Compact Disc and magnetic memories including tape and magnetic disc.

Light sources 15 for optical memories 10 and 12 are preferably arranged in a hexagonal cell 43 pattern as shown in FIG. 4 and FIG. 10c, each cell being composed of a set of multiple photoemitter diodes 41 in order to achieve the required intensity of the illuminating light per data page. Thus, during data read out, each cell of light sources 15 is turned on by multiplexing data retrieval circuitry shown in FIG. 14b, firing all the emitter diodes 41 in a given cell for a read out time interval sufficient to condition the photosensor array. Preferably, diodes 41 are laser diodes which have a more intense emission; however, LED diodes may be used in many applications.

The light emitting faces of diodes 41 and hence cells 43 are located on a light emitting interface plane 44 as shown in FIG. 10c and it is at this interface plane 44 that the data/lens array card 17 is placed in close proximity to the light sources with the data layer 19 adjacent interface 44. In the preferred form of optical memories 10 and 12, card 17 is replaceable. By incorporating guides that accommodate sliding the card sideways into the housing 14 through an access door at the front wall (see FIG. 3b) of housing 14, cards with different data are quickly exchanged. Light source drivers 13, light sources 15, diffractive corrector 23, field lens 25, sensor array 27, and its interface circuitry 29 are all securely mounted in housing 11 of optical memory 10 and housing 14 of optical memory 12 and are not usually replaceable.

Figure 3B:
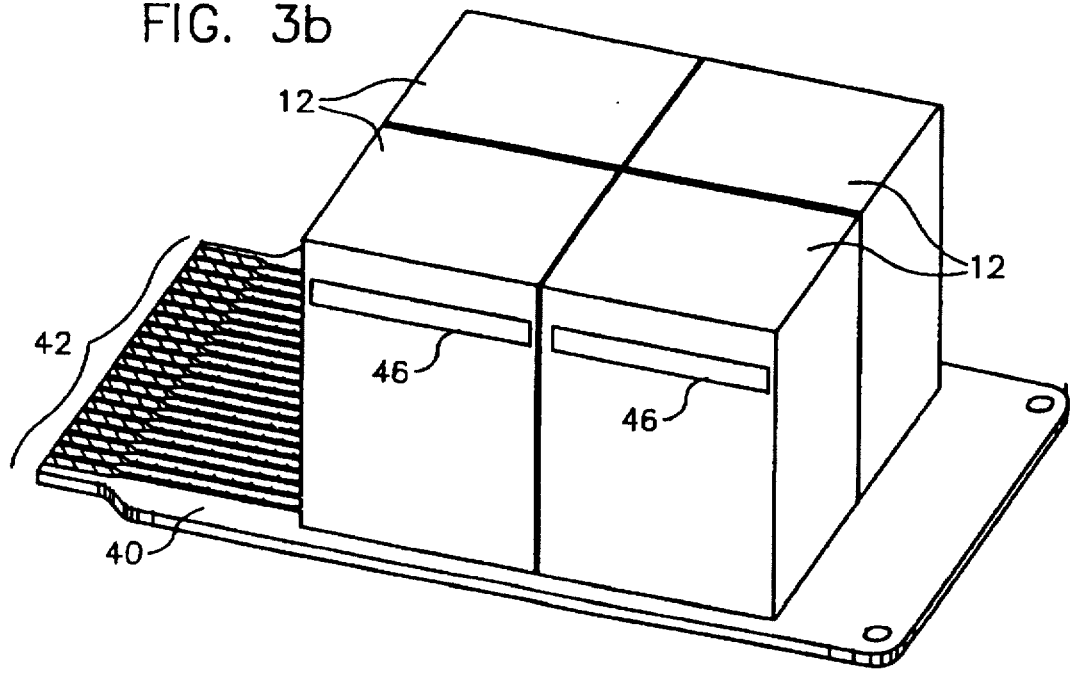
FIG. 3b is an isometric view of a preferred assembly of multiple optical memory modules mounted on and electronically connected via a plug-in printed circuit interface and module support board.

FIG. 3b shows a plurality of read-only memory 12 modules each provided by one of the read-only optical memories of FIG. 3a. These are mounted on a plug-in memory board 40 having an edge connector 42 with multi-lead conductors to the memory module interface and driver circuits. Each memory module 12 has a front card receiving slot 46 opening to precision card positioning edge guides 48 (see FIG. 3a) for receiving a replaceable data/lens card 17 as described above.

Now the fabrication of data/lens card 17, and more particularly, the construction of the lenslets of array 21 will be described with reference to FIGS. 10a–e, 11, 12 and 13. In configuring the lenslets of array 21, the shape of the data pages shown in FIG. 5 must be considered. Of course, there needs to be some empty space between data pages of the layer 19 in order to prevent interference (cross-talk) between data in adjacent pages. Because a lens is generally axially symmetric, its optimum imaging capability is in a circle, so a square array of bits is not optimum. That is, for a given refractive lens complexity in terms of its contouring and the cost of fabricating such a lens, there is a maximum circular area that will be imaged to maximum resolution, and the cost/complexity of a lens will increase dramatically as the radius (field of view) increases, assuming other parameters are held constant.

The most efficient use of each lens subsystem in array 21 is to make the data array, i.e., the pages of data layer 19, circular so that the diameter of each data field makes maximum use of the available lens imaging power. However, if the lenses and data patches are arranged in a regular array of columns and rows, there will be a significant fraction of area lost in the corners between the circular data regions.

With this in mind, the present invention is preferably embodied by forming each of pages 47 of data layer 19 in a close-packed cellular pattern, here each cell being hexagonal as best shown in FIG. 5. Each cell is filled substantially by the data bits at a uniform density as indicated by the enlarged fragmentary view of a single cell page 47' in FIG. 5. Thus the cellular shape of the data pages 47 serves to accommodate maximum density of data and efficient use of the circular configuration of lenses. Since the data pages are of hexagonal profile then the preferable configuration of the light source cells 43 of light sources 15 is also hexagonal to complement the hexagonal shaped and arrayed data pages. Given this preferred configuration of data pages 47, light illuminating sources cells 43, lenslets 51 of array 21, and the projected data image on the sensor array 27, a single data page contains one million bits each of approximately 1 micron size organized into 640 pages, each page being about 0.8 to 1.0 mm in diameter, for a total storage capacity per data/lens card 17 of 640 megabits and 80 megabytes (assuming 8 bit words per byte).

LENS CONSTRUCTION

Now in order to resolve data bits on layer 19 of required size and density, namely, between 2.25 and 0.5 microns, preferably about 1 micron, and stored at $2\times10^7$ to $4\times10^8$ bits per $cm^2$, the numerical aperture (NA) of each lens subsystem of array 21 must be relatively large, in the range of about 0.35 to 0.6, and preferably approaches 0.6 for 1 micron bit size. The focal length of the lenslet should be 1.0 mm or less and the spacing of the first lense surface to the data layer also should be 1.0 mm or less. Such NA values are normally found only in microscope objectives having a large number of elements. Read heads of Compact Disc systems use high power lenses but they only need to resolve one bit at a time, as compared to the megabit resolution of a field of data required by preferred embodiment of the present invention. The use of known Compact Disc objective lens designs will not provide adequate imaging resolution of the small, densely stored data bits on layer 19. Furthermore, it is not practical to adopt directly those multi-element objective lenses found in high resolution microscopes because of the cost, physical size and the lateral space requirements of such lens assemblies given the close-packed spacing of the data pages 47 on layer 19.

Figure 11:
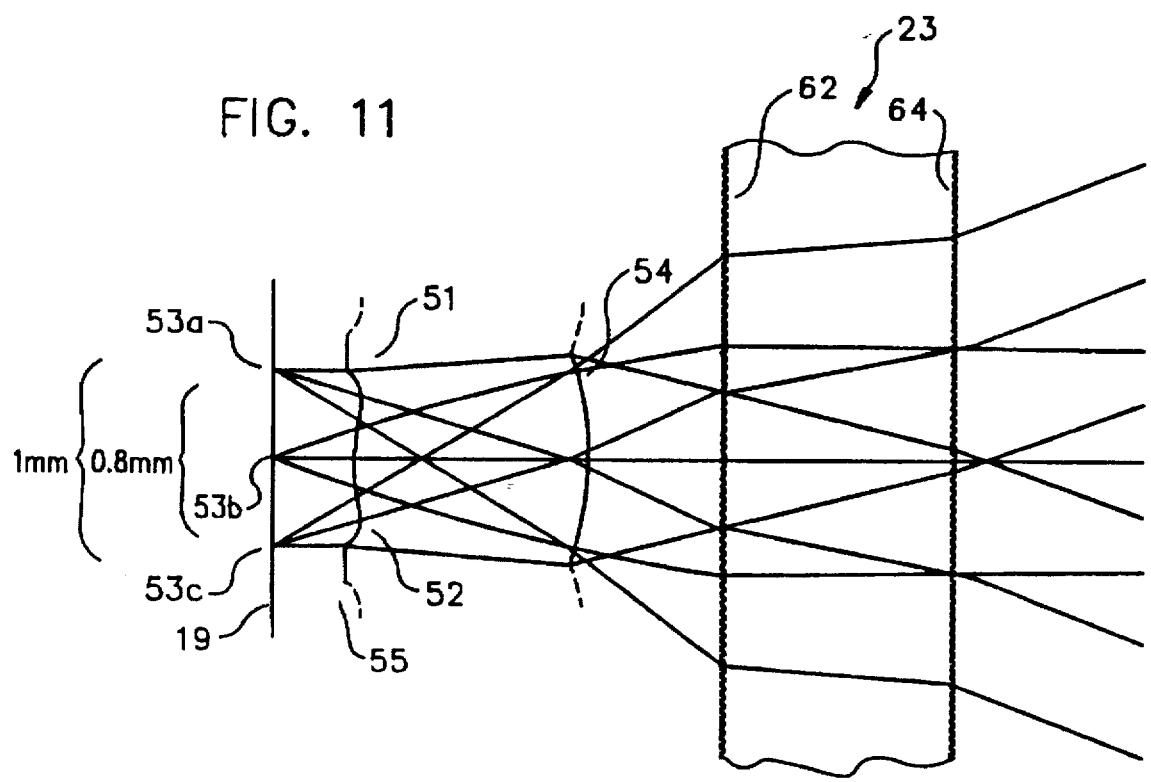
FIG. 11 is a schematic diagram of the optical characteristics of certain components of the embodiments of FIGS. 1-3 showing light rays emerging from the plane of the data layer and passing through an immersion polymer layer, then through a registering lenslet and hence through a two surface diffractive corrector.

Therefore, in designing each of the lenslets of the lens array 21 in accordance with the preferred embodiment, data/lens card 17 is composed of a continuous layer of lens glass having the contoured optical surfaces of the lenslets molded or otherwise formed thereon in a close-packed array 21. The first active lens surface 52 of each lenslet 51 of array 21 proximate to the data layer 19, i.e., within a distance that is the same order of magnitude as the diameter of the data field in a page 47. This is best illustrated in FIGS. 10b and 11 in which a single lenslet 51 shown as a subsystem of array 21 has its first active lens surface 52 (S1) within a spacing s of 1/10 to 3/4 of the field diameter of the lenslet (and the associated data page), which is in the range of 0.8 mm to 1 mm. This close optical coupling of surface 52 of lenslet 51 to the plane of the data layer 19 enables each data bit of the mask to form light image rays when illuminated by one of sources 15 that strike surface 52 of each lenslet at different locations on first surface 52. This is indicated by the optical ray patterns of FIG. 11 and FIG. 12 in which extreme data bits 53a and 53c are indicated (on opposite sides of a center bit 53b) to form light rays intersecting surface 52 at different contours. Secondly, the diameter of the data page 47 and the field of view of the lenslet 51 are substantially equal, and the first surface 52 (S2) of lenslet 51 is made strongly aspheric. By contouring surface 52 aspherically, the surface provides a unique optical treatment of the ray bundles from diverse data points 53a,b and c. The unique optical treatment is needed to accommodate the relatively large field angle due to the close spacing of the lens surface to the data layer 19 and the fact that the lens diameter is substantially that of the page 47 which is being resolved.

Thirdly, the optical space between data layer 19 and surface 52 of lenslet 51 is filled with a lens immersion material or spacing layer 55 such as a transparent polymer (i.e., plastic) having an index of refraction that is greater than air to provide the needed angle of data bit light rays to resolve each bit and is different from the index of the lenslet material which is preferably glass in order to define the first lens surface 52. For example, a glass having an index of 1.75 will work with a polymer having an index such as 1.5, which is typical of plastics. Furthermore, a plastic spacing layer 55 not only immerses the data field on layer 19 in a material having the desired index of refraction, but also serves to bond and hence fix the relative optical spacing of the lenslet relative to data layer 19. Plastic spacing layer 55 thus has a thickness s less than the diameter of the lens and data fields. Fabrication of spacing layer 55 may, for example, be spin coated. The lenslets 51 of array 21 are preferably formed of a continuous sheet of relatively high index glass having on one surface the circular aspherical contours that form the first lens surface 52. The second surface of the lens glass layer is formed with the plurality of second lens surfaces 54 (S2) of lenslets 51 which are here of substantially spherical convex shape in axial optical alignment with the aspherical first surfaces 52 (S2). The thickness of each lenslet 51 along the optical axis, and hence the approximate thickness of the glass layer, is on the order of the same dimension as the field diameter of a data page, namely 0.8 to 1 mm.

Fourthly, the center-to-center spacing of the lenslets is the same as the center-to-center spacing of the data pages 47 which, because of geometrical constraints, means that the second optical surface 54 (S2) of each lenslet 51 is the effective aperture stop. Coaction of first and second lens surfaces 52 and 54 provides the primary imaging and aberration correcting optical power of the device.

As mentioned, spacing layer 55 bonds and fixes the optical space between the data layer and the lens array layer. Therefore, differential thermal expansion and other causes of misregistration and misalignment of the optics are minimized at the location of maximum optical sensitivity. This resulting sandwich structure that serves as data/lens card 17 is now usable as a unit in either optical memory 10 for writing and reading, or after being recorded once in memory 10 as a read-only card in optical memory 12. The resulting data image may be projected directly onto a photosensor array 27 from the second surface 54 of lenslet 51 as shown in FIG. 11, but in accordance with the preferred form of the invention, the optical images from the second surface 54 of lenslet 51 are further refined through a diffractive corrector 23 having third (S3) and fourth (84) optical surfaces 62 and 64.

Figure 12:
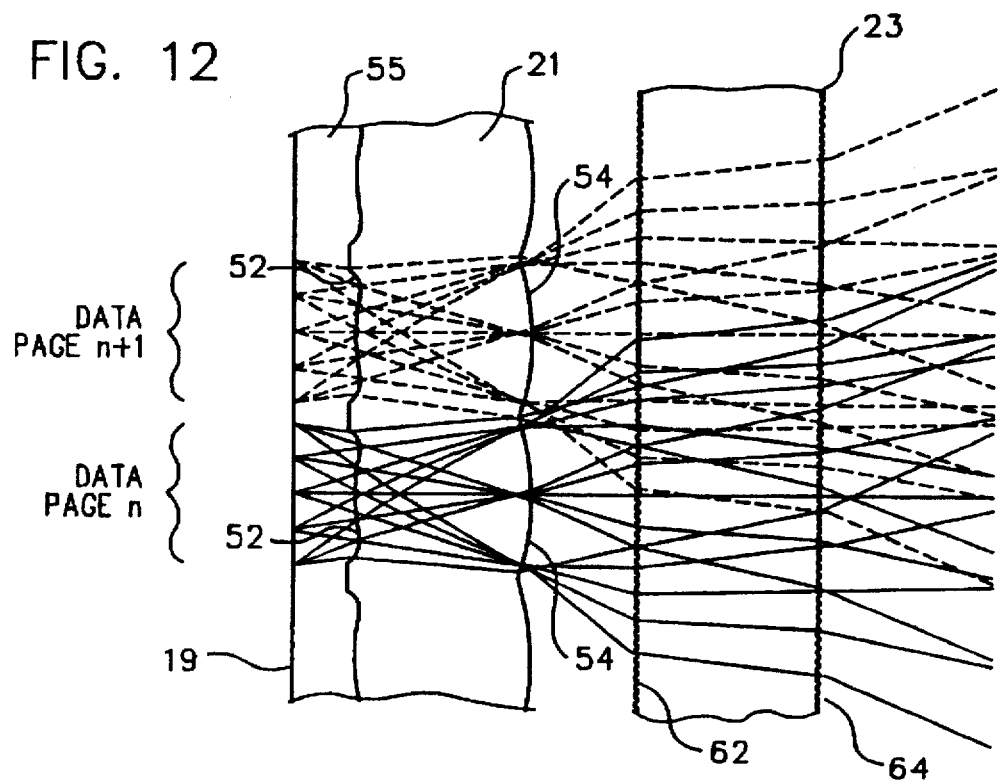
FIG. 12 is a diagramatic view similar to FIG. 11 but showing the overlapping of the various data bit rays from a pair of adjacent data pages of the data layer and the associated lenslets, followed by the optical treatment of the diffractive corrector.

This additional optical corrector used in optical memory 10 and optical memory 12 and best shown in FIGS. 11 and 12, serves to correct for residual aberrations in the images projected from the data page in an optical system in which the light rays emanating from adjacent lenslets 51 of array 21 overlap. By using a diffractive corrector 23 that has overlapping diffractive ringlets, this embodiment of the invention provides additional corrective surfaces for treating overlapping light rays emanating from adjacent data pages. Beyond the effective aperture stop of the image rays from refractive lenslet surface 54, adjacent data pages enter the same expansion space and the overlapping diffractive optics of corrector 23 provide a way of optically changing and hence correcting aberrations of these comingled image rays while retaining the integrity of each page image.

Therefore, diffractive corrector 23, which may be a diffractive grating of generally round overlapping ringlets or gratings 59 shown in enlarged form 59' in FIG. 7, provides third and fourth surfaces 62 (S3) and 64 (S4) to correct the optical data image rays emanating from second refractive surface 54 (S2) of the lenslet as best shown in FIGS. 11 and 12. More particularly, with reference to FIG. 12, it is seen that adjacent data pages N and N+1 of data layer 19 cause image light rays (one in solid lines and the other in dotted lines) to overlap after the second surfaces 54 (S2) of the adjacent lenslets 51 of array 21. As an alternative to the diffractive gratings 62 (S3) and 64 (S4), a holographic plate may be used in place of the grating plate to function as diffractive corrector 23. The holographic plate would be formed in a manner analogous to the ringlet patterns 59 of the grating shown in FIG. 7, by light interference images on a photographic plate using processes known per es.

The imaging of the data is enhanced by placing each separate data patch (page) on a slightly concave curvature facing the lenslet, as best seen in FIG. 10b, adjacent the first surface (S1) of the lens subsystem in order to reduce field curvature of the image plane. An example of this contouring is given in the following tables as a non-flat surface at SRF=0, being the object surface at the data layer 19. In such case, the data page contouring is formed by a press molding of the bonding layer 55 with a convex or dimple region at each page position prior to forming the data layer emulsion or film. Alternatively, a flat data page may be used with optics reconfigured to adjust for the flat field of the data.

LENS PRESCRIPTION

The lens system comprising a refractive lenslet 51 having a strong aspheric first surface 52 (S1), a second substantially but not exactly spherical second surface 54 (S2), and followed by spaced diffractive third surface 62 (S3) and a diffractive fourth surface 64 (S4) constitute a preferred objective lens subsystem. A minimum of four surfaces are thus provided in this embodiment with correction for optical aberrations, such as spherical, coma, distortion, astigmatism and field curvature. Such a lens structure is capable of imaging at sufficiently high resolution the 2.25 micron or smaller data bits. In fabricating the elements of this lens subsystem, several examples are given of the optical specifications of each of the four objective or primary surfaces S1, S2, S3, and S4, as well as the additional surfaces S5 and S6 of the spherical field lens and the contour of the data layer at SRF=0. The first example is for a lens system of the preferred embodiment, including a field lens 25 as shown in the following Table 1 in which the first set of data is for the spherical contours and the second set of data is the aspheric numbers.

TABLE 1

| LENS SYSTEM USING FIELD LENS | | | | |
|---|---|---|---|---|
| LENS DATA, OFF AXIS CASE: | | | | |
| SRF | RADIUS | THICKNESS | APERTURE RADIUS | GLASS |
| 0 | 1.6507 | 0.34000 | 0.40000 | 1.51021 |
| 1 | — | 1.0677 | 0.48000 | 1.730 |
| 2 | −1.14784 | 0.56209 | 0.48000 | AIR |
| 3 | — | 1.00000 | 1.00000 | LASF9 |
| 4 | — | 1.00000 | 2.00000 | AIR |
| 5 | 29.72358 | 5.00000 | 14.00000 | LASF9 |
| 6 | 189.14824 | 27.00000 | 14.00000 | AIR |
| 7 | — | — | 12.00000 | IMAGE |

TABLE 1-continued

LENS SYSTEM USING FIELD LENS

ASPHERIC DATA BY SRF:

| 1 | P1 | 0.41868 | P2 | -4.15565 | P3 | 38.37165 | P4 | -375.74267 |
|---|---|---|---|---|---|---|---|---|
|   | P5 | 261.09145 | P6 | 1.1372E+04 | P7 | -4.2733E+04 |   |   |
| 2 | CC | -0.79418 |   |   |   |   |   |   |
|   | P1 | 0.04666 | P2 | -0.22600 | P3 | 1.48769 | P4 | -13.02285 |
|   | P5 | 58.52966 | P6 | -135.09437 | P7 | 124.09391 |   |   |
| 3 | DFX COEF: |   |   |   |   |   |   |   |
|   | S1 | -0.00018 | S2 | 0.00663 | S3 | -0.26361 | S4 | 0.00014 |
|   | S5 | -0.26272 | S6 | 0.00020 | S7 | -0.00073 | S8 | 0.00041 |
|   | S9 | -0.00058 |   |   |   |   |   |   |
| 4 | DFR COEF: |   |   |   |   |   |   |   |
|   | S1 | 0.04124 | S2 | 0.01732 | S3 | 0.08333 | S4 | -0.12804 |
|   | S5 | -0.01943 | S6 | 0.24108 | S7 | -0.13212 | 88 | -0.17595 |
|   | S9 | 0.12643 | S10 | 0.15038 | S11 | -0.18001 | 812 | 0.05138 |

LENS DATA, ON AXIS CASE:

| SRF | RADIUS | THICKNESS | APERATURE RADIUS | GLASS |
|---|---|---|---|---|
| 0 | 1.6507 | 0.34000 | 0.40000 | 1.51021 |
| 1 | — | 1.0677 | 0.48000 | 1.730 |
| 2 | -1.14784 | 0.56209 | 0.48000 | AIR |
| 3 | — | 1.00000 | 1.00000 | LASF9 |
| 4 | — | 1.00000 | 2.00000 | AIR |
| 5 | 29.72358 | 5.00000 | 14.00000 | LASF9 |
| 6 | 189.14824 | 27.00000 | 14.00000 | AIR |
| 7 | — | — | 12.00000 | IMAGE |

ASPHERIC DATA BY SRF:

| 1 | P1 | 0.41868 | P2 | -4.15565 | P3 | 38.37165 | P4 | -375.74267 |
|---|---|---|---|---|---|---|---|---|
|   | P5 | 261.09145 | P6 | 1.1372E+04 | P7 | -4.2733E+04 |   |   |
| 2 | CC | -0.79418 |   |   |   |   |   |   |
|   | P1 | 0.04666 | P2 | -0.22600 | P3 | 1.48769 | P4 | -13.02285 |
|   | P5 | 58.52966 | P6 | -135.09437 | P7 | 124.09391 |   |   |
| 3 | DFX COEF: |   |   |   |   |   |   |   |
|   | S1 | 5.9759E-05 | S2 | -0.00018 | S3 | -0.28961 | S4 | 3.0229E-05 |
|   | S5 | -0.28958 | S6 | 0.00012 | 87 | -7.5216E-05 | S8 | 0.00037 |
|   | S9 | 1.0458E-05 |   |   |   |   |   |   |
| 4 | DFR COEF: |   |   |   |   |   |   |   |
|   | S1 | 0.06932 | S2 | 0.02576 | S3 | 0.07384 | S4 | -0.15970 |
|   | S5 | 0.23013 | S6 | -0.32693 | S7 | 0.29274 | S8 | 0.08388 |
|   | S9 | -0.32881 | S10 | 0.05363 | S11 | 0.17927 | S12 | -0.08469 |

Figure 21:
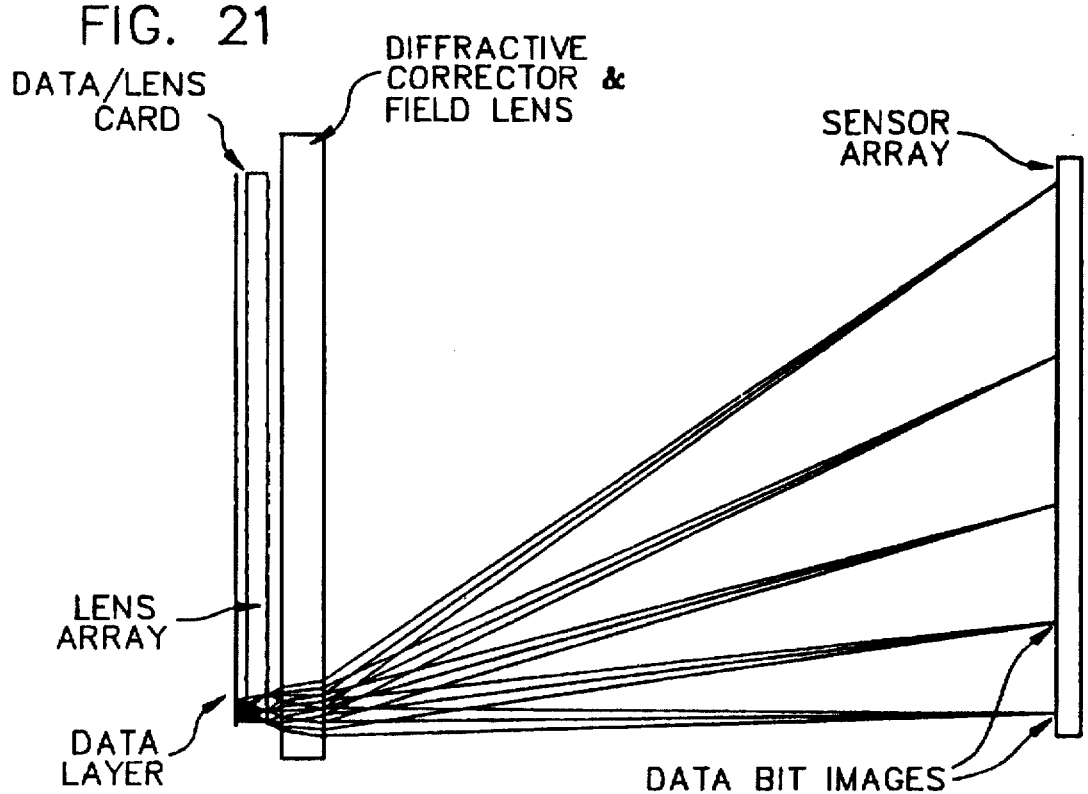
FIG. 21 shows an alternative embodiment for reading data similar to FIG. 13 but differing in that the refractive field lens has been omitted and its function of bending image rays is replaced by a modified diffractive element that both corrects and functions as a field lens.

As an alternative, Table 2 contains the spherical and aspheric data for an embodiment that incorporates the field lens function in the diffractive elements as shown in FIG. 21.

TABLE 2

LENS SYSTEM WITHOUT FIELD LENS

LENS DATA, OFF AXIS CASE:

| SRF | RADIUS | THICKNESS | APERTURE RADIUS | GLASS |
|---|---|---|---|---|
| 0 | 1.63883 | 0.46858 | 0.40000 | 1.51021 |
| 1 | — | 1.06770 | 0.48000 | 1.730 |
| 2 | -1.08912 | 0.65696 | 0.48000 | AIR |
| 3 | — | 1.71849 | 1.00000 | LASF9 |
| 4 | — | 33.00000 | 2.00000 | AIR |
| 5 | — | — | 12.00000 | IMAGE |

ASPHERIC DATA BY SRF:

| 1 | P1 | -0.02894 | P2 | -1.34813 | P3 | 5.70154 | P4 | -78.12907 |
|---|---|---|---|---|---|---|---|---|
|   | P5 | 178.56707 | P6 | 2329.4442 | P7 | -1.7700E+04 | P8 | 3.4026E+04 |
| 2 | CC | -0.48711 |   |   |   |   |   |   |

TABLE 2-continued

LENS SYSTEM WITHOUT FIELD LENS

| | | | | | | | |
|---|---|---|---|---|---|---|---|
| P1 | −0.01041 | P2 | −0.06934 | P3 | 0.13071 | P4 | −0.98380 |
| P5 | 3.41779 | P6 | −14.03236 | P7 | 57.27584 | P8 | −138.09144 |
| P9 | 132.08888 | | | | | | |

3 DFR COEF:

| | | | | | | | |
|---|---|---|---|---|---|---|---|
| S1 | −0.07525 | S2 | −0.0274 | S3 | 0.01787 | S4 | −0.01617 |
| S5 | −0.00466 | S6 | 0.02402 | S7 | 0.00246 | S8 | −0.02125 |
| S9 | −0.01578 | S10 | 0.01511 | S11 | 0.03259 | S12 | −0.02910 |
| S13 | −0.00099 | S14 | 0.00419 | | | | |

4 DFX COEF:

| | | | | | | | |
|---|---|---|---|---|---|---|---|
| S1 | −3.2687E−05 | S2 | 0.15927 | S3 | −0.08182 | S4 | −2.3305E−05 |
| S5 | −0.08060 | S6 | −6.7782E−05 | S7 | 0.00044 | S8 | 5.9404E−05 |
| S9 | 0.00039 | S10 | 0.01571 | S11 | −3.9553E−05 | 812 | 0.03137 |
| S13 | 9.6939E−06 | S14 | 0.01565 | S15 | 2.0557E−05 | S16 | −2.4753E−05 |

LENS DATA, ON AXIS CASE:

| SRF | RADIUS | THICKNESS | APERATURE RADIUS | GLASS |
|---|---|---|---|---|
| 0 | 1.63883 | 0.46858 | 0.40000 | 1.51021 |
| 1 | — | 1.06770 | 0.48000 | 1.730 |
| 2 | −1.08912 | 0.65696 | 0.48000 | AIR |
| 3 | — | 1.71849 | 1.00000 | LASF9 |
| 4 | — | 33.00000 | 2.00000 | AIR |
| 5 | — | — | 12.00000 | IMAGE |

ASPHERIC DATA BY SRF:

1

| | | | | | | | |
|---|---|---|---|---|---|---|---|
| P1 | −0.02894 | P2 | −1.34813 | P3 | 5.70154 | P4 | −78.12907 |
| P5 | 178.56707 | P6 | 2329.44442 | P7 | −1.7700E+04 | P8 | 3.4026E+04 |

2 CC −0.48711

| | | | | | | | |
|---|---|---|---|---|---|---|---|
| P1 | −0.01041 | P2 | −0.06934 | P3 | 1.13071 | P4 | −0.98380 |
| P5 | 3.41779 | P6 | −14.03236 | P7 | 57.27584 | P8 | −138.09144 |
| P9 | 132.08888 | | | | | | |

3 DFR COEF:

| | | | | | | | |
|---|---|---|---|---|---|---|---|
| S1 | −0.15865 | S2 | 0.00257 | S3 | −0.25194 | S4 | 1.26070 |
| S5 | −2.86407 | S6 | 2.37729 | S7 | 1.36299 | S8 | −2.36629 |
| S9 | 1.48033 | S10 | 1.20315 | S11 | 2.25310 | S12 | 0.17190 |
| S13 | −2.44329 | S14 | −0.03497 | S15 | 0.80123 | | |

4 DFR COEF:

| | | | | | | | |
|---|---|---|---|---|---|---|---|
| S1 | −0.01076 | S2 | 0.03052 | S3 | −0.04407 | S4 | −0.12362 |
| S5 | −0.16767 | S6 | 0.07931 | S7 | 0.04196 | S8 | −0.03445 |
| S9 | −0.02233 | S10 | 0.00881 | S11 | 0.01273 | S12 | 3.4632E−05 |
| S13 | −0.00673 | S14 | 0.00203 | | | | |

In computing these spherical and aspherical lens data, including the data for the diffraction gratings of corrector 23, the prescriptions are established using known optical design criteria.

Conventionally, a lens with an aspheric surface, or with a diffractive surface, is described with a power series. In the present case, all aspheric surfaces are axially symmetric, and the sag of the surface, i.e., the location of a surface point along the optical axis, as a function of the distance R from the axis, is given by:

$$Z = \frac{CR^2}{1+\sqrt{1-C^2(K+1)R^2}} + P_1R^2 + P_2R^4 + P_3R^6 + \ldots \quad \text{(Equation 1)}$$

where the $P_M$ coefficients are specified in a lens prescription. The term C is the basic curvature of the surface, and K is the conic constant of the surface.

Diffractive surfaces are described by a similar equation, where it is the relative phase of the light that is given, as a function of the position on the lens surface. In the present case, both axially symmetric (DFR) and general (DFX) surfaces are used. In the symmetric case, the phase is given by:

$$\phi = \frac{2\pi}{\lambda}(S_1R^2 + S_2R^4 + S_3R^6 \ldots) \quad \text{(Equation 2)}$$

It is the $S_M$ coefficients that are specified by the prescription.

The general case is more complex mathematically, and is given by the relationships:

$$\phi = \sum_{i=1}^{m} Q_i \text{ where } Q_i = \frac{2\pi}{\lambda} S_i X^j Y^k, \text{ and } i = 1/2\,[(j+k)^2 + j + 3k] \quad \text{(Equation 3)}$$

CONTROL ELECTRONICS

Figure 16A:
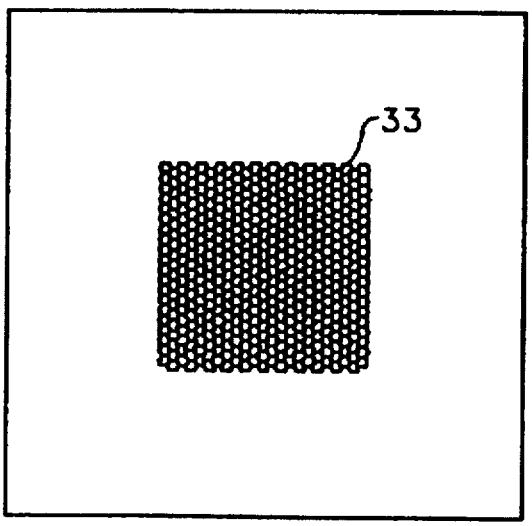
FIG. 16a, 16b and 16c show various structural components of data write subsystems of the write/read memory of FIG. 1 and 2.
Figure 16B:
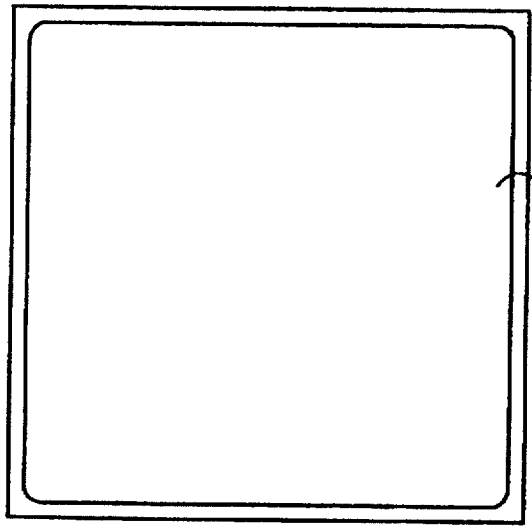
Figure 16C:
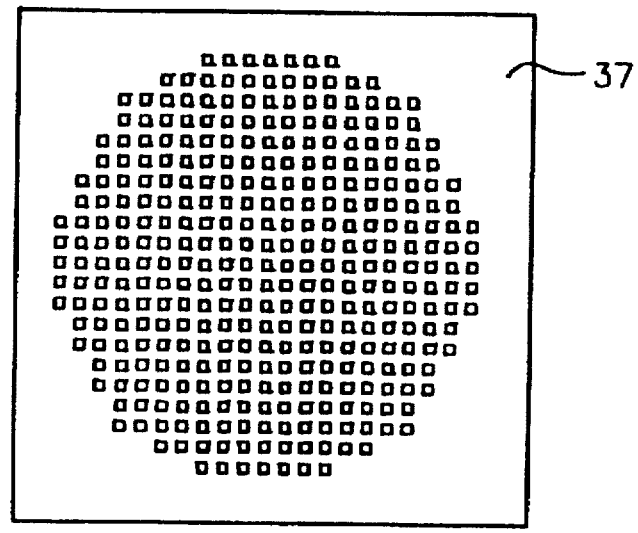

With reference to FIGS. 14a and 14b, control electronics respectively for a write mode and a read mode are shown. In FIG. 14a, the light valves 37 (see FIG. 1 and 2) that compose each page of data and, in this embodiment, are provided by an array of LCD elements, depicted in FIG. 16c, and are addressed on a row by row basis via an address interface 101 connected to an address bus 103, through an address buffer 105 and a row select switches 107 coupled directly to LCD light valves 37. As each page of data is composed by controlling the individual states of light valves 37, part of the address on bus 103 that determines the particular data page is communicated over X and Y source select buses 109 and 111 connected respectively to an X decode 113 and a Y decode 115. These in turn are connected to operate selected ones of recording light sources 33, one source being located in the proper XY position to illuminate a single data page on the recordable data layer 19. Also, taken from bus 103 are data words and word count signals which are passed via bus interfaces 101 to a word assembly register 117 and a timing and sequence control 119. Timing and sequence control 119 is a conventional sequencing device having outputs including clocking assembly register 117 and sequential signals for "load assembled row", "row increment", "pulse light source" and "done" that cooperate with row select switches 107 and recording light sources 33 to sequentially load and flash each page of data composed at light valves 37. The intensity of light imaged through light valves 37 onto data layer 19 is a function of the type of light sources 33 used and the duration and power applied to each source. For laser diodes, sufficient light energy is generated to image the pattern after being condensed through the objective lens optics onto a data layer 19 made of silver halide, dye-polymer, or a thin tellurium (Te) film. This and other materials are known per se in write-once-read-many (worm) records.

Once a data layer is written with multiple pages of data, such as by using the foregoing recording processes, or in reading mass copied data cards, an addressing control such as shown in FIG. 14b is employed. For this purpose, addressing data from a data bus 121 is connected via an interface bus 123 through an address buffer 125 to select particular rows of data after an image has been formed on sensor array 27. This is done by operating row select switches 127. To illuminate a selected data page, the address available from bus 121 includes page address data fed over X and Y decode buses 131 and 133 which cause X decode 135 and Y decode 137 to select a particular one of the multiple light sources 15 to illuminate a single page of data for imaging onto sensor array 27. A timing control 139 similar to timing and sequence control 119 provides in a manner known per se, a sequence of timing control signals identified as "pulse LED" (controls page light sources 15); "pulse CCD row" (controls the read-out of data from a charge coupled device sensor array 27); "gate MUX" (controls an output multiplexor from sensor array 27); and "data ready" (signals that the data is ready from the data output multiplexor and interface to a data user bus). As described more fully below in connection with FIGS. 15a–c, the output of data from sensor array 27 is available through a buffer register 141, a multiplexor 143, an interface to bus 145, and an output data bus 147.

SENSOR ARRAY

Figure 15B:
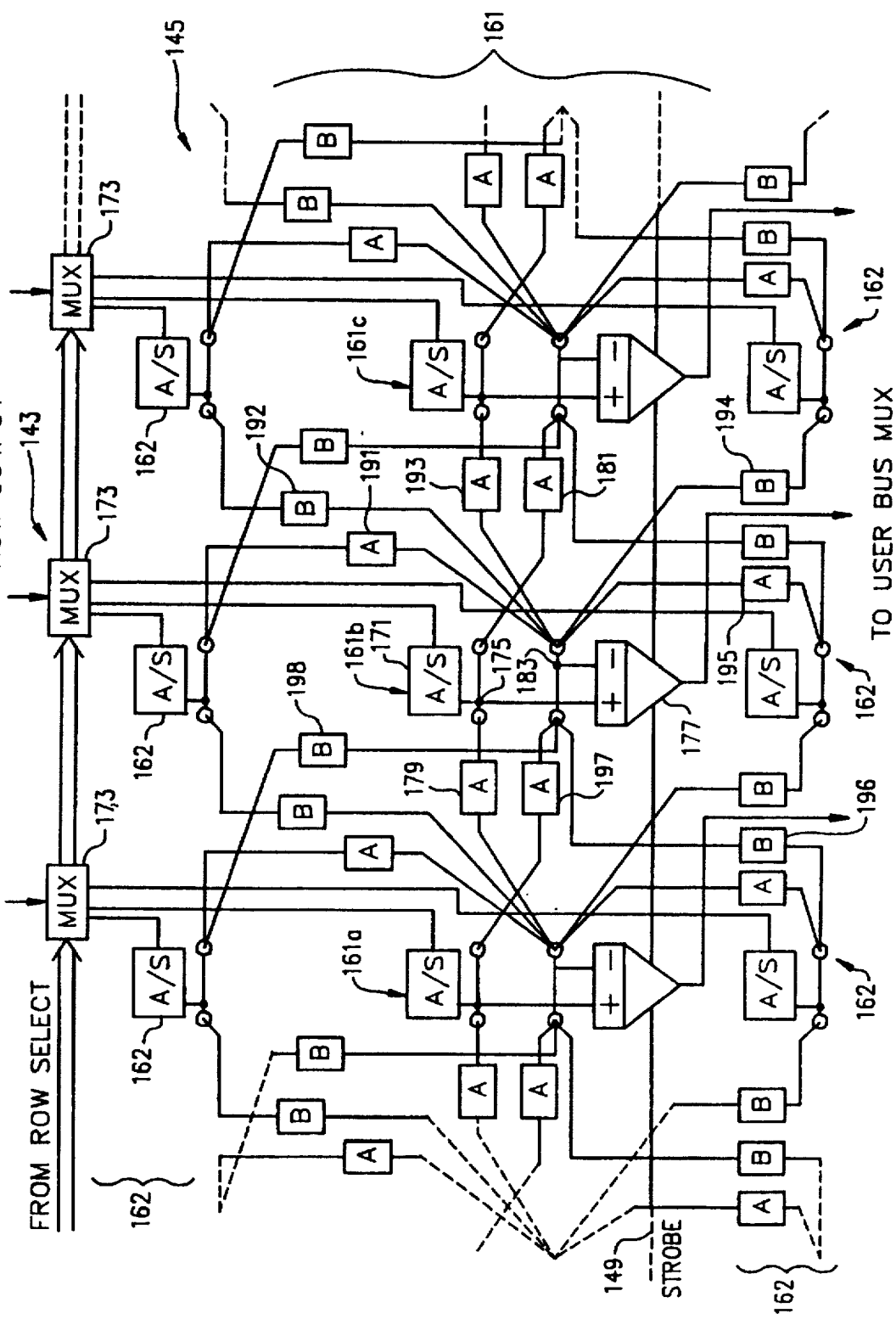

FIG. 15a illustrates a preferred sensor array 27 and interface circuitry 29 using photosensitive elements provided by a conventional charge coupled device (CCD) array formed in a large scale integrated circuit. Any of numerous CCD designs used in the video picture imaging field are suitable, such as those configurations disclosed in the article by Walter F. Kosonock, CHARGE-COUPLED DEVICES-AN OVERVIEW. 1974 Western Electron. Show and Cony. Tech. Papers, Vol. 18, Sep. 10–13, pp. 2/1–2/20. Each sensor site is located to receive a data light image representing a single data bit, either "on" (1) or "off" (0) depending upon the data pattern imaged on sensor array 27. In underlying charge storage regions of the CCD wafer forming array 27, charge coupled elements receive the level of charge (representing the strength of light illumination on the overlying photosensor elements 27a) and store the level of image data. This signal level representing data is then shifted out and converted into binary ones and zeros by a threshold sensing operation in the output electronics shown in FIGS. 15a, 15b and 15c.

Thus, in FIG. 15a, array 27 receives row select data from row select switches 127 and dumps the charge level data from each row of the stored image into the analog buffer register 141. In conventional charge coupled devices, analog buffer register 141 is normally outputted serially as may be done using a serial output amplifier 152 as shown. Preferably the charge level data representing image data is withdrawn in parallel from buffer register 141 via a plurality of parallel output amplifiers 153, one for each column of array 27. From buffer register 141 via output amplifiers 153, the charge level data, which is still in analog form, is converted to binary data by an interface circuit 145 preferably incorporating a plurality of adaptive threshold networks indicated at 161. Each of adaptive threshold networks 161 serves to automatically adjust the sensor site threshold depending on the amount of incident overlap or fringe light, i.e., light intented for adjacent sensors but partially landing on the subject sensor site. Above the threshold, circuit 145 outputs a "1" signal and below the threshold, circuit 145 outputs a "0" bit for that corresponding sensor site. In FIG. 15b, networks 161 are shown with a centermost adaptive threshold network 161b that for illustration corresponds to the sensor site of interest, i.e., subject site, and includes an amplitude/sample circuit (A/S) 171 receiving a charge level signal through multiplexor 173 from buffer register 141 (see FIG. 15c) of the sensor array. The output of A/S 171 applies the signal level which represents the amount of light energy illuminating a single one of the sensor sites in array 27 to a signal node 175 which in turn is connected to a summing input of a comparator 177. Node 175 also sends this same level signal outwardly to the laterally adjacent networks 161a and 161b in the network of circuit 145 as indicated by interconnective weighted summing resistor 179 going to the left side adjacent network 161a and another weighted summing resistor 181 going to the right hand adjacent network 161c. Additionally, at comparator 177, a subtractive node 183 receives the weighted summing resistor signal levels from each of the adjacent nodes, there being eight such adjacent nodes, via resistors 191, 192, 193, 194, 195, 196, 197, and 198 as illustrated. It is observed that in this embodiment the upper and lowermost rows of amplitude/sample circuits corresponding to circuit 171 are needed to provide the level control signals from the above and below adjacent rows of sensor sites but the comparison function provided by comparator 177 is only needed in the middle row of adaptive threshold networks 161a, 161b and 161c. At comparator 177, the sum of the proportionally attenuated light signal levels from the adjacent sensors are subtracted at subtraction node 183 from the primary site signal at node 175 to adjust the switching threshold. If the intensity of light illuminating a particular sensor and represented by a voltage at node 175 exceeds the adjusted threshold of comparator 177, the computer outputs a binary "1". The adaptive threshold adjustment is accomplished by collectively subtracting at subtractive node 183 the weighted signals, then an output "1" or "0" is sent on to the user bus 147 at the time of a strobe signal applied to strobe line 149. Thus, an adaptive threshold is provided depending upon the amount of overlap light impinging the sensor array from adjacent illuminated sensor sites, thereby greatly enhancing the reliability of array 27 to discriminate between true data light and overlap light from data imaged on adjacent sensors. The interconnective resistors are weighted either (A) weight for resistors 191, 193, 195 and 197, being from those closer sensor sites immediately to the side or above or below; or (B) weight for the corner adjacent sites for resistors 192, 194, 196 and 198, which are somewhat further away and have a lower weight according to the fall off of light intensity with distance. The actual values of these weighted resistors are determined empirically by imaging various data patterns on the sensor array and adjusting the resistor values for optimum selectivity.

Figure 15C:
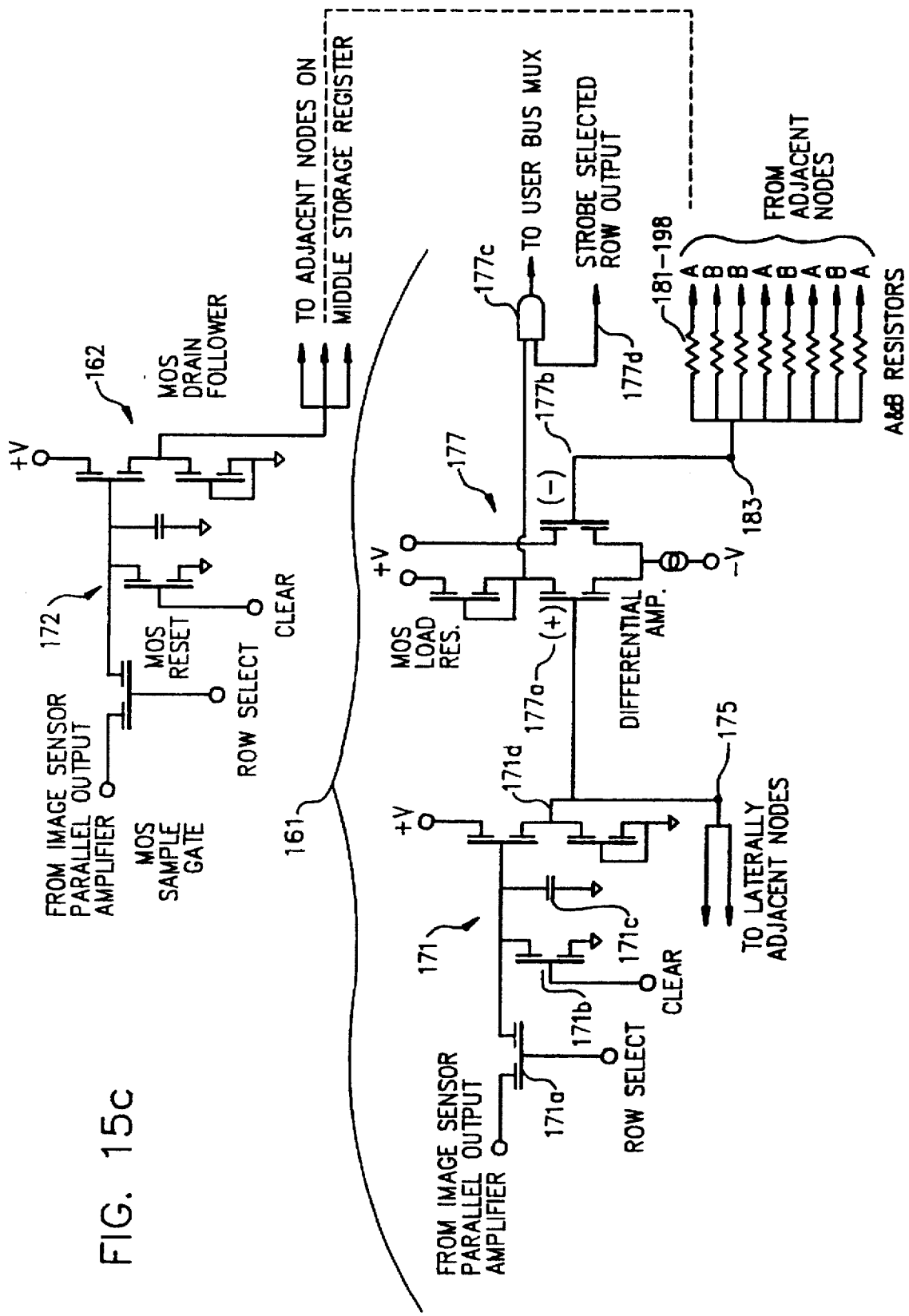

The circuit for one of adaptive threshold sensor circuits 161 is shown in greater detail in FIG. 15c. As indicated, each circuit 161 includes an amplitude/sample circuit 171 which in turn is made up of a sample gate 171a, a reset gate 171b, a sample holding capacitor 171c, and an output driver 171d that develops the sampled amplitude signal at node 175. Resistors 179 and 181 feed weighted proportional amounts of this level signal to adjacent networks 161 (see FIG. 15b). Comparator 177 similarly includes a summing junction 177a, a subtractive junction 177b, and a strobed output gate 177c. That output gate 177c, shown as an AND gate, may alternatively be a Schmitt trigger. The positive summing junction 177a receives the same output level signal developed by amplitude/sample 171 at node 175 and from that signal level the summed inputs from adjacent nodes fed over to subtractive node 187 are subtracted and the result is outputted through gate 177c at the time of an output strobe signal applied to strobe lead 177d corresponding to strobe line 149 in FIG. 15b. Another amplitude/sample circuit 172 of a network node 162 is shown in FIG. 15c for illustration, in this instance network 162 being associated with the sensor site in the row immediately above as illustrated in FIG. 15b and having one weighted (A) resistor output feeding one of eight comparative levels to node 187 of comparator 177 for adjusting the threshold of adaptive threshold network 161b as shown in FIG. 15b.

ALTERNATE EMBODIMENTS

The foregoing embodiments represent preferred apparatus and method for writing and/or reading optical data stored at exceedingly high densities, on the order of 625 megabits per square inch of data layer and organized into multiple pages that may be individually selected by optical means for high speed, large word retrieval. Numerous alternative components and design details are contemplated within the scope of the invention disclosed by way of example in the above specific preferred forms. For example, FIG. 17 shows an alternative write/read optical memory 210 occupying a more compact configuration than the memory 10 described above (FIGS. 1 and 2).

Thus, in FIG. 17, memory 210 is mounted in a compact, read/write module including a housing 211 containing many of the same elements as in the above described write/read embodiment, but here using reflective light modulators 217 to form the record image pattern. Light modulators 217 are mounted along with a quarter wave plate 219 and a source imaging lens 221 in line with one optical axis of a polarizing beam splitter 223 in which beam splitter 223 is situated in housing 211 between the read optics and the sensor array similarly to beam splitter 31 of memory 10. On the opposite side of housing 211, parallel to and in line with the optical axis of beam splitter 223 is an array of recording light sources 225, replacing light sources 33 shown in memory 10 of FIG. 1.

The remaining elements of the memory are the same as memory 10 and include light source drivers 13', light sources 15', data layer 19', and multiple lens array 21', together forming data lens card 17', diffractive corrector 23', field lens 25', sensor array 27' and sensor interface circuitry 29'. Polarizing beam splitter 223 includes the diagonal beam splitting plane 227 and in this case, the beam splitter is a polarizing device so that light emitted by sources 225 is polarized as the rays passing through the beam splitter. The light rays are then reflected by modulators 217. The recording process of the optics of memory 210 are similar to that of memory 10 described above accept that the source imaging lens 221 needs to be only one-half as strong as lens 35 and FIGS. 1 and 2 because the recording data images go through the lens twice prior to being deflected at diagonal plane 227 upwardly into the field lens 25', corrector 23', array 21', onto the recordable data layer 19'.

Reflective light modulators 217 may be provided by an array of micro-machined mirrors, but for economy of fabrication, it is preferred to use a conventional LCD array, each LCD site being individually controllable to compose a page of data and using a low loss mirror behind the LCD page composer to reflect the image back toward the imaging lens 221 and beam splitter 223. The use of a beam splitter 223 minimizes the loss of light energy, but this in turn requires the use of a quarter wave length plate 219 between modulators 217 and imaging lens 221 in order to maintain the sense of polarization through the reflection plane 227 of splitter 223. Like memory 10, each of light sources 225 is selectively energized to record one page of data on its corresponding page site on data layer 19'. The orientation of each of sources 225 in the array on the side of housing 211 together with the various optics including source imaging lens 221 serves to direct and condense the image to the proper lenslet and hence page site on layer 19'. A variation of memory 210 shown in FIG. 17 would provide for using a reflective data layer 19' or a transmissive data layer 19' with a reflective surface on the upper side thereof to provide an alternative to the read light sources 15' by using the light sources 225 for the dual purpose of recording and/or reading. During a read mode, individual ones of light sources 225 would be turned on or pulsed at a power level below the recording threshold and all of the reflective light modulators 217 would be set to reflect all impinging light which in turn would be condensed to fill one of the lenslets of array 21'. The result is to reflect light off the reflective record at layer 19' which then passes downwardly through beam splitter 223 to form the data image on sensor array 27'.

Still another embodiment of the write/read system is shown in FIG. 18 as memory 212. In this embodiment, the write mode is implemented by an array of recording light sources. 251 arrayed in the pattern of a data field to compose each page of data. Light sources 215 are here mounted to one face of a drive circuitry module 253 in which both the array of sources 251 and circuitry 253 are flat structures such as printed circuit cards or boards disposed within housing 255 parallel to one of the housing side walls adjacent a beam splitter 31'. Between beam splitter 31' and recording light sources 251 is an array of micro lenses 257 functioning as a field lens, and being carried in a set of eight electromechanical X,Y movers serving to adjust the position of the image forming recording rays onto the preselected data page site of data layer 19' through lens array 21'. Movers 259 are shown in greater details in FIG. 19 and, as shown, eight such movers are disposed in pairs at the four corners of field lens array 257 so as to effect X and Y translation of the array plane for moving the image into a position for precise registration of the source rays onto data layer 19. Movers 259 are conventional electro-magnetic transducers—e.g., moving magnet devices—although other suitable known transducer devices for converting electrical positioning signals into movement may be used. These movers need only operate at a relatively slow electromagnetic speed to set the optics prior to the recording of each page of data composed on recording light sources 251. LCD or other light valve type shutters 260 screen out lenslets and hence data pages that are not to be recorded.

Figure 22:
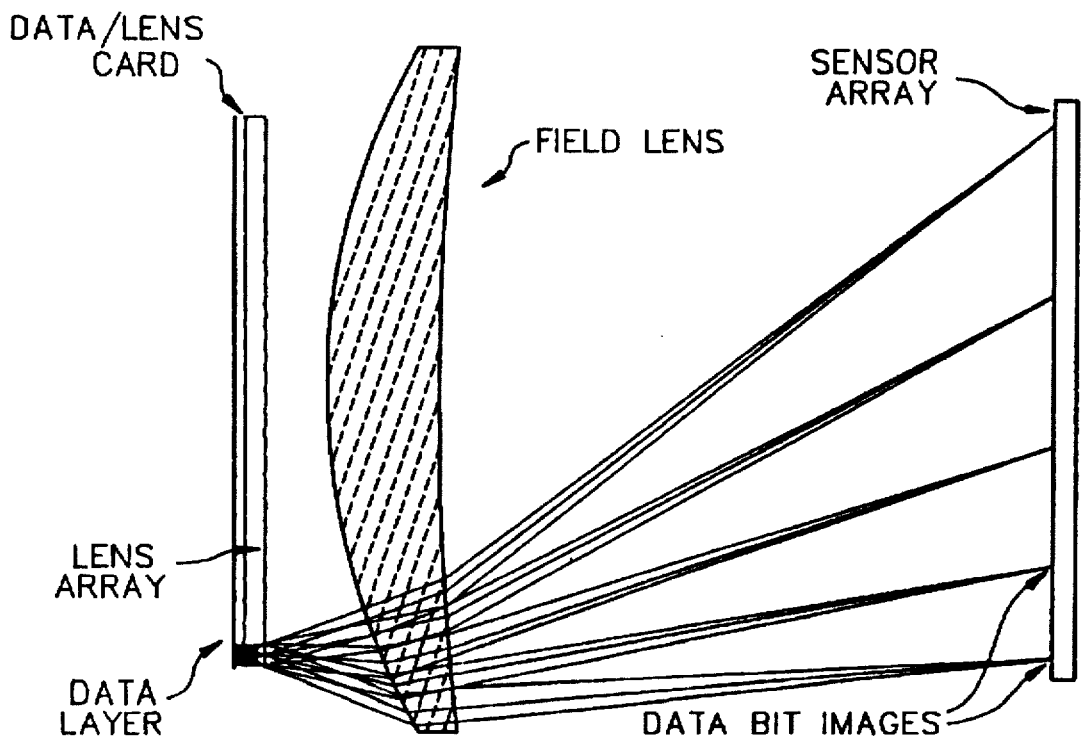
FIG. 22 shows a further alternative embodiment using the field lens but without the diffractive corrector.

FIG. 21 shows another alternative embodiment in schematic form by which data is imaged from the data/lens system through a diffractive corrector directly onto a sensor array without an intervening field lens. In this embodiment, the four optical surfaces of the lenslet and diffractive corrector are prescribed as, for example, in Table 2 above, to perform the substantially equivalent optical imaging otherwise performed by the omitted field lens of the previously described embodiment in FIG. 13, prescribed in Table 1. FIG. 22 is still another alternative embodiment of the invention again shown in schematic form depicting a data/lens system with the data being imaged through a field lens but omitting the diffractive corrector resulting in lower density that may be acceptable in certain applications. A higher density variation on this FIG. 22 embodiment would provide diffractive gratings placed on one or both of the field lens surfaces in order to provide further correction of the optical aberrations as needed to enhance resolution required by a particular application.

FIG. 23 shows an alternative version of a write/read memory in which the sensor array is modified to incorporate both sensors and emitters disposed in an interspersed, side-by-side by-side pattern on a common plane. Thus, the same plane serves both to receive the imaged data for sensing, as well as an object plane to compose record data by selective driving of the interspersed emitters. The composed record page is then imaged back onto the data layer through the same optics as the read imaging but in reverse, condensing fashion to write (record) onto the selected record page.

Figure 24A:
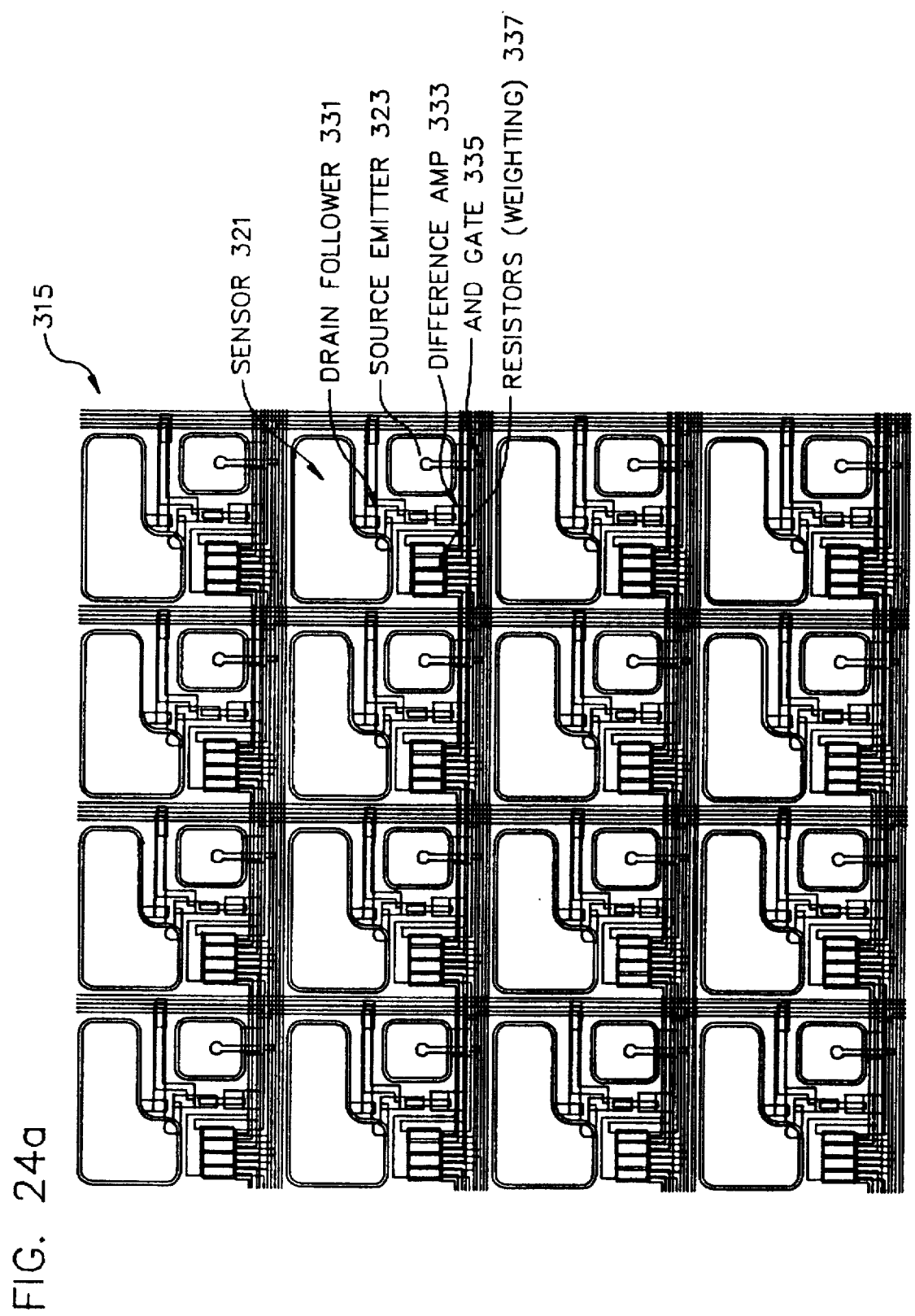

The set of FIGS. 24a, 24b and 24c shows various portions of a large scale integrated (LSI) circuit fabricated for use as the composite sensor and emitter array 315 of memory 310 described above in connection with FIG. 23. Thus, as shown in FIG. 24a, the array 315 includes a plurality of sensor/ emitter units 315', arrayed so that all told there exists a number S of such units equal to the number of bits that are imaged or generated at array 315 for each page or region of data layer 19'. Each such sensor/emitter unit 315' includes juxtaposed sensor 321 and emitter 323 arranged in approximate juxtaposition so that a light bit imaged on unit 315' will strike sensor 321 even though some of the imaged light falls outside of the area of the sensor. Similarly, during a write operation in which emitter 323 is energized at each unit 315', the emitted light from, in this case, the somewhat smaller area emitter surface is sufficiently located within the overall area of unit 315' to create a source image bit at that particular array location. In addition to the semi-conductor areas forming sensor 321 and emitter 323, each unit 315' has integrated therewith the adaptive threshold circuit and the interconnects to the counterpart sensors in adjacent units corresponding to 315' and here including drain follower 331, difference amplifier 333, AND gate 335, and the weighting resistors 337 shown somewhat pictorially in the diagram of FIG. 24a. In this embodiment, each sensor 321 has a separate adaptive threshold circuit that alters the switching threshold of that particular sensor unit as a result of the amount of light falling on the immediately surrounding or adjacent unit sensors. The theory and operation is similar to the adaptive threshold sensors described above in connection with the embodiment shown in FIGS. 15a–15e except that the adaptive threshold circuit and operation is integrated with and co-functions with the operation of each sensor site on array 315. Thus, with reference to FIG. 24b, an enlarged fragment of the sensor/emitter unit 315 is shown in a schematic/pictorial diagram to provide sensor 321 as a diode 321a, here being a PIN type diode but which could also be a CID (charge injection diode) or other photosensing element, in which the irregular polygon area 321b depicts that surface area of the semiconductor material that forms one electrode of the schematically indicated PIN diode 321a. The cathode of diode 321a is then connected as indicated to MOS drain follower 331 (corresponding to MOS drain follower 162 in FIG. 15c described above). The output of drain follower 331 is then fed to difference amplifier 333 (being the counterpart of differential amplifier 177 in. FIG. 15c described above) which performs the threshold comparison and outputs data through AND gate 335 for data light incident on sensor 321. The adaptive threshold operation which effects the switching threshold of differential amplifier 333 in conjunction with output diode 335 is provided by a network of weighting resistors 337 which feed input signals to differencing amplifier 333 from the adjacent sensor sites in a manner similar to the operation of the weighting resistors A and B described above in connection with FIG. 15c.

In this embodiment, each unit 315' of the array also includes a light source here in the form of a solid state diode emitter 323. Emitter 323 is shown schematically and pictorially to include an emitter 323 formed by a light emitting diode 323a and a land area 323b constituting an electrode of the diode 323a at which photo emission occurs, forming the source of light. The area of each unit 315' is, in this embodiment, substantially 0.03 mm by 0.03 mm square such that the entire array 315 as shown in FIG. 24a will be composed of an array of 1000×1000 for a total of $10^6$ such units.

With reference to FIG. 24c, the schematic diagram of the sensor and its associated adaptive threshold circuit, as well as the separate source or emitter circuit are shown to include PIN type diode sensor 321a connected with its cathode to an MOS drain follower 331 and to an MOS reset device 337 for clearing the storage of any signal on follower 331 during a read cycle. The output of drain follower 331 is fed to an input 333a of difference amplifier 333. In addition to sending its output signal to one 333a of difference amplifier 333, follower 331 also sends the output signal for that particular sensor to the A and B weighting resistors 337 that are distributed to the adjacent sensor units of the array as described above. Similarly, the comparison input 333b to difference amplifier 333 receives the weighted light sensing signals from the adjacent sensor sites through the network of weighting resistors 337 to adapt or adjust the switching threshold of amplifier 333 as it responds to the output of PIN diode sensor 321a through follower 331. An output of difference amplifier 333 thus has the switched adaptive thresholded output signal which is applied through a strobed AND gate 335 to a user bus multiplexer representing the output bit signal for that particular sensor site.

As a schematically separate circuit from the sensor, the photo emitting source or diode 323a is connected across X and Y address or select leads as shown so as to be energized whenever that particular bit of the array 315 is to be illuminated for a record mode.

As an alternative to the composite sensor and emitter array 315 shown in FIGS. 24a, b and c, a similar LSI circuit may be used as a sensor-only array by omitting the source or light emitter 323 from each array unit 315'. In such case, the sensor area 321b, as shown in FIGS. 24a and 24b, can be enlarged to a regular rectangular shape by shifting some of the adaptive sensor circuitry components down into the space otherwise occupied by the source 323. Otherwise, the circuitry as schematically shown in FIG. 24c for the sensor portion of the array and the basic arrangement of elements shown in the plan view of this LSI circuit would remain the same. Another variation on the embodiment of array 315 of FIGS. 24a, b and c is to provide at each site a single solid state element, using a variation of either diode 321a or diode 323a, which serves as a dual functioning sensor and emitter in the same physical element. During read, the common element is operated as a sensor; during write, the element is driven as an emitter to provide one bit of the page composer.

While only particular embodiments have been disclosed herein, it will be readily apparent to persons skilled in the art that numerous changes and modifications can be made to the devices and method steps disclosed herein, including the use of equivalent means and steps, without departing from the spirit of the invention. For example, other optics may be used in place of the preferred and above described refractive and diffractive lens subsystems, including all refractive and all diffractive lens systems, and different combinations of refractive and diffractive surfaces. Although a preferred form of the lens array 21 uses a sheet or layer of glass for the refractive lenslets as described above, an alternative embodiment may use individually fabricated lenslets mounted in a close-packed array held together by a bonding matrix of a suitable bonding polymer. The sensor array similarly may be provided by different structures, including a modified D-RAM array with an overlay of transparent material to allow data image light to strike solid state junctions in the RAM memory storage elements, or by superposing an array of solid state photosensing elements, e.g., diodes, on top of a D-RAM array and then coupling the photodiode outputs by metallization downward from the top photo sensing layer to a storage element of the underlying D-RAM for each sensor site. The imaged data is then output from the D-Ram using conventional addressing circuitry.

ADDITIONAL ALTERNATE EMBODIMENTS
Achromatizing Diffraction Lens Systems

With reference to FIG. 25, an alternative embodiment of the invention is shown in which the refractive lens surfaces used in the device of FIG. 11 above are replaced by diffractive surfaces and incorporate achromatizing optics. In this color correcting or achromatizing diffraction lens system 400, image rays from data layer 19 pass through a first diffractive surface 402, then through an anomalous or phantom lens 404 that corrects for color aberrations caused by the diffractive surfaces, and then through a second diffractive surface 406 from which the imaging rays extend to the field lens (not shown in FIG. 25).

The resulting lens system has the advantage of being a diffractive objective system giving rise to a substantially flat field, compact dimensions and light weight. The anomalous or phantom lens 404, which only serves as a color correction factor, can be omitted in those applications in which a narrow band light source is used, such as provided by a laser diode. However, for those systems in which laser diodes are too costly, LEDs and other types of light sources produce a wider band of light and hence may produce undesirable aberrations or distortions in the imaged data due to different source wavelengths interacting with the powerful diffractive surfaces 402 and 406. The reason is that the rays passing through the diffractive element are "bent" (actually, diffracted) by an interaction of the groove spacing and the wavelength of the light. The angle of diffraction is a primary function of the wavelength. In contrast, the chromatic aberration of a refractive lens is due to the change in the index of refraction with frequency, a secondary effect.

The classical way to color-correct a diffractive element is to combine it with a refractive element, because the effects are in opposite direction. Unfortunately, because the refractive effect is much smaller, the optical system to be corrected must have most of the power in the refractive lenses, leaving the diffractive elements to a roll of correcting for some of the shortcomings of the refractive elements. That can be a good arrangement in many instances, especially where the system has a large f number and/or a small field of view.

In this invention, however, the optical system has a relatively small f number and a large field of view for the reasons described above. If a single refractive lens is made strong enough to correct for the chromatic error of a diffractive element in this environment, the field may curve to an unacceptable extent.

An obvious solution as mentioned is to avoid color effects by using very narrow bandwidth light sources to image the data pages. A diode laser, even a multi-mode laser, would be satisfactory. A plasma lamp might be satisfactory depending on the pressure and the gas chosen. An LED when combined with an interference filter would work to narrow the bandwidth, but again that will rob needed intensity. The other devices mentioned are either too costly or lack intensity.

The object of this embodiment is to provide new ways to correct a diffractive lens system for color aberrations. The novel feature is to include one or more refractive surfaces within the system, where the surface is the interface between two materials, in effect a buried refractive surface. The two materials are chosen such that the index of refraction is the same for both at the middle wavelength, but the dispersion is different. That is, at wavelengths different from the center wavelength, there will be a difference in the index, so at the center wavelength (or any other selected wavelength) the lens has no effect at all; it is not there. It is a "phantom" lens. At a wavelength different from the center or selected wavelength, the lens is effective, and will act as a positive lens for wavelengths on one side of the selected one, and a negative lens on the other. Which is which depends on the sign of the curvature of the surface, and which material has the greater dispersion. In this way, the lens corrects primarily for chromatic aberration, and has minimal effect on field flatness or other aberrations. At a wavelength extreme there will be some effect other than color, but it is very small and can be neglected in this embodiment.

In selecting a glass or plastic with a high enough dispersion to give enough index change over a small wavelength range, the following approach is used. As an example, an LED that has a center wavelength of 0.645 microns, has a bandwidth of about 0.02 microns. This would be the full width at half maximum. As sources go, (not including lasers) this is a narrow wavelength range. And the index of ordinary glasses does not change enough over that range.

The fact that the index changes at all in normal transparent materials is due to absorption bands that are in the infrared and in the ultraviolet. It is a fact of nature that as one approaches a resonance in any system, the phase changes rapidly. In an optical system, this is manifest as a change in the index as an absorption band edge is approached. The index always decreases as the wavelength increases up to the edge. On the other side of the edge, the index jumps to a higher value, but still decreases as the wavelength continues to increase. There is a very rapid change with the opposite slope in the region of the band edge, but at that point the absorption is at a maximum, so the dispersion is very difficult to observe. A discussion of this effect can be found in most physical optics texts often under the subject "anomalous dispersion", e.g., Jenkins and White, "Fundamentals of Optics" 2d ed., p. 466, or R. W. Wood "Physical Optics" Chapter 15, 3d edition.

The implementing process for the phantom or anomalous less 404 in FIG. 25 is to dissolve a dye in the plastic (glass may also be used as an alternative), where the dye band edge is near the light source wavelength. The edge could be either above or below, but for this embodiment, the dye is selected to be on the short wavelength side of the source. With the above LED chosen, the dye would be a green absorber, so it would appear red or purplish. Because the dye will absorb, the thickness of the dyed material must be kept relatively small. This is not an optical problem, as a very thin layer can do the job, although in a particular system there might be constructional problems if it is too thin.

FIG. 25 is one example of an all diffractive system that has very good characteristics, except for color errors. The addition of the planoconvex phantom lens 404 embedded in plastic between the diffraction surfaces 402 and 406 correct for the color aberration very effectively. The lens is preferable in a Fresnel form, as best shown in FIG. 26 so that the absorption loss would be minimized. The dispersion chosen for the lens is thought to be reasonably attainable.

Figure 32:
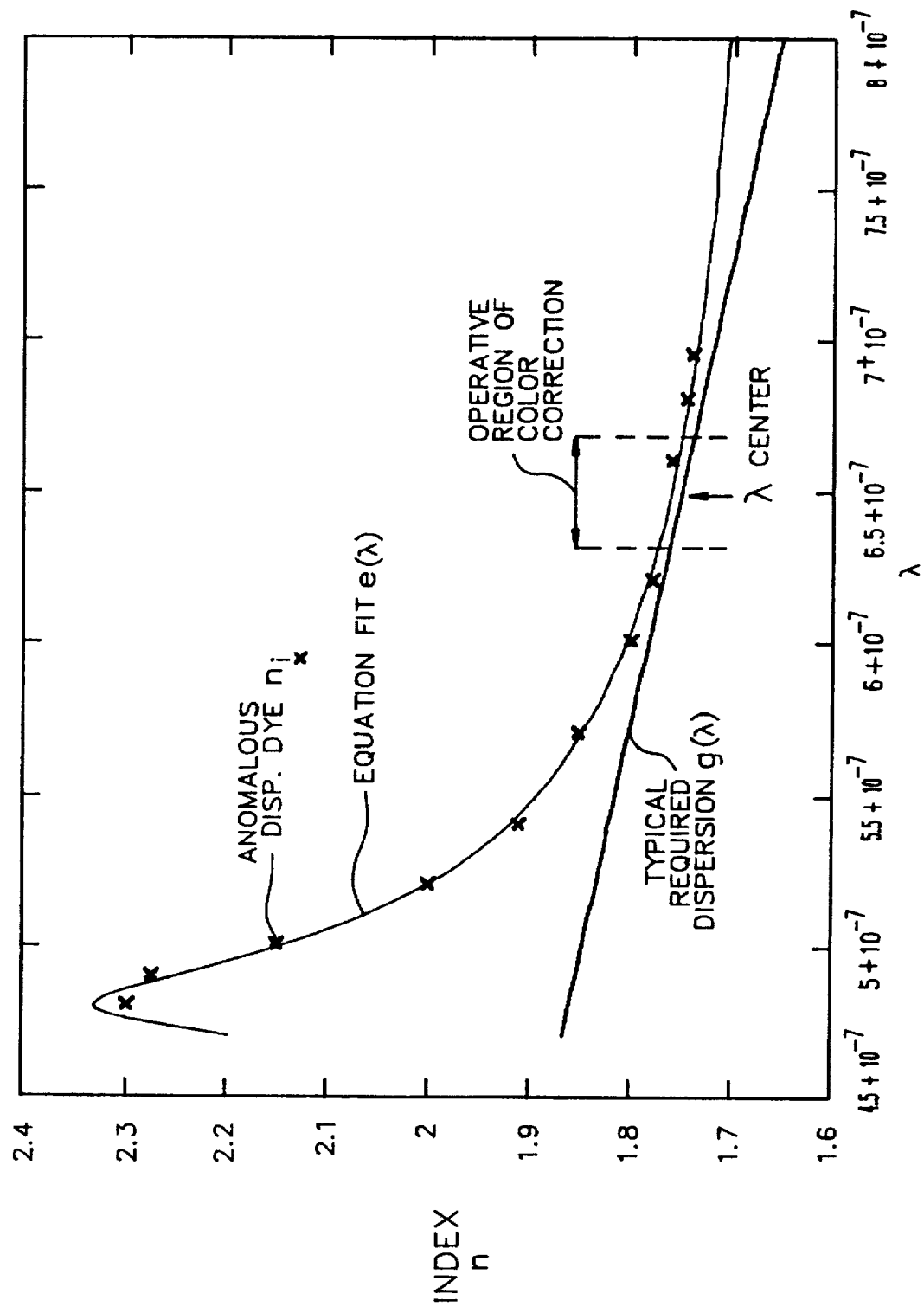
FIG. 32 is a graph of the index of refraction relative to wave length of a suitable dye used to form the anomalous lens in the embodiments of FIGS. 25-31.

For example, as shown in the graph of FIG. 32, the index as a function of wavelength is plotted for a dye known as Nitrosodimethylanaline. The "x" marks are taken from experimental data that are given in Wood, page 508, supra. The continuous curved graph is a best match that is based on anomalous dispersion theory (see e.g., Born and Wolf, PRINCIPLES OF OPTICS, Pergamon Press, 6th Edition, p.92 eqn 31). FIG. 33 shows equation e ($\lambda$) for index as a function of wavelength ($\lambda$) for a single optical absorption line (band). Revised equation solved for p (which is actually n squared), and a dissipative term added as suggested at the bottom of page 92(Born and Wolf). The term 1 is the wavelength of the absorption band center, lambda ($\lambda$) the variable. The match is not perfect, mainly because the equation assumes a single absoption line, when in fact there are usually several in a typical solid. Further, there may be other bands, particularly in the infra red, that are not accounted for in the simple equation. However, the straight line of FIG. 32 shows the dispersion required to make the phantom lens 404 work, and it should be noted that that particular dye is more than adequate from a wavelength range of about 0.68 microns to 0.58 microns. The dispersion is much larger at even shorter wavelengths, but absorption would begin to have a more serious effect.

Figure 28:
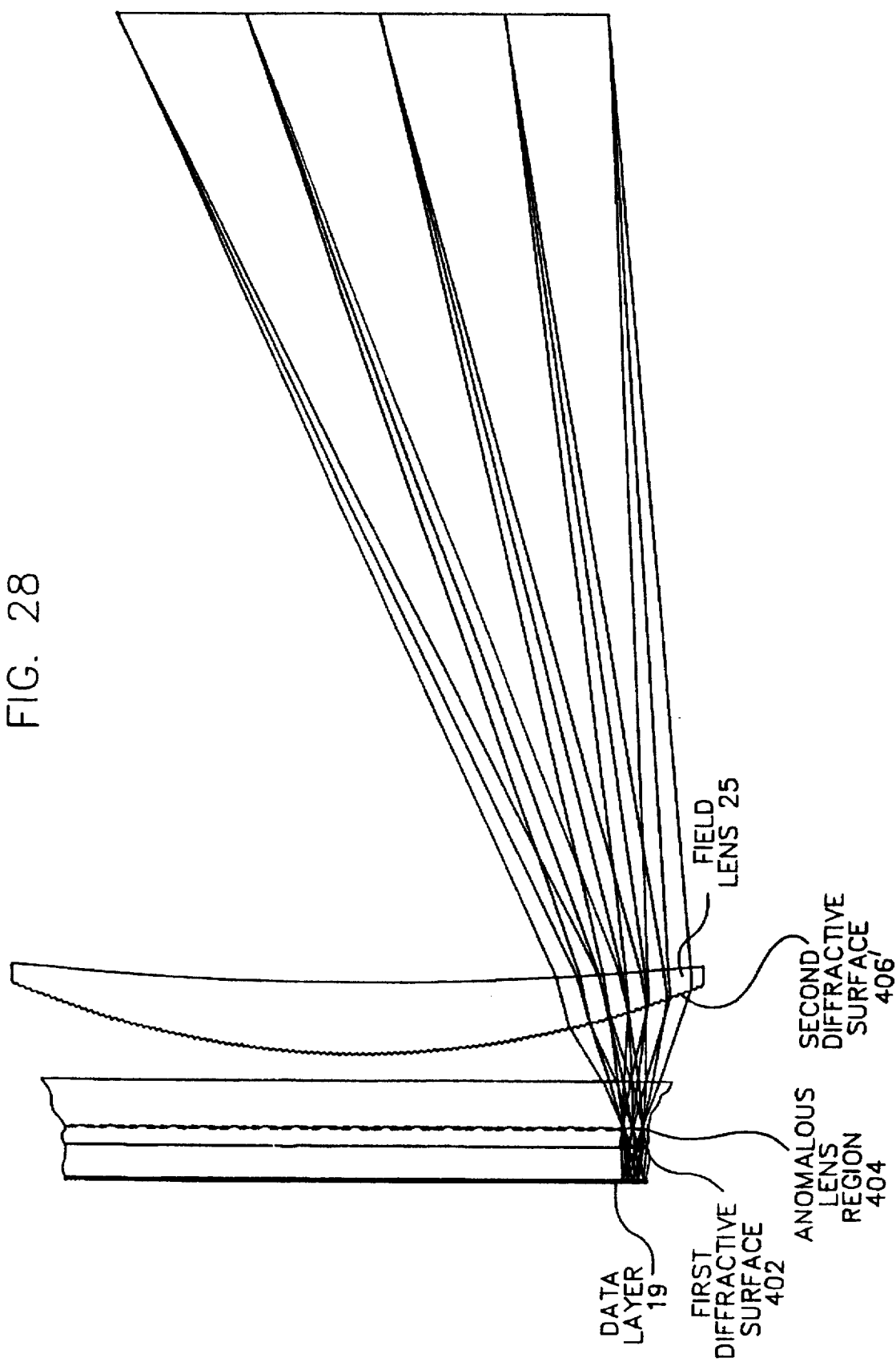
FIG. 28 is a view similar FIG. 27 showing an alternative embodiment of the optical system in which the second diffractive surface of the lens system is placed on the first refractive surface of the field lens.

With reference to FIG. 28, another variation of the embodiment of FIGS. 25–27 is shown in which the second diffractive surface 406' has been moved from the data lens card to the first surface of field lens 25. The anomalous or phantom lens element 404 for color correction remains embedded in a plastic material that is bonded to the first diffractive surface 402 and to data layer 19 to form a data lens card.

Figure 29:
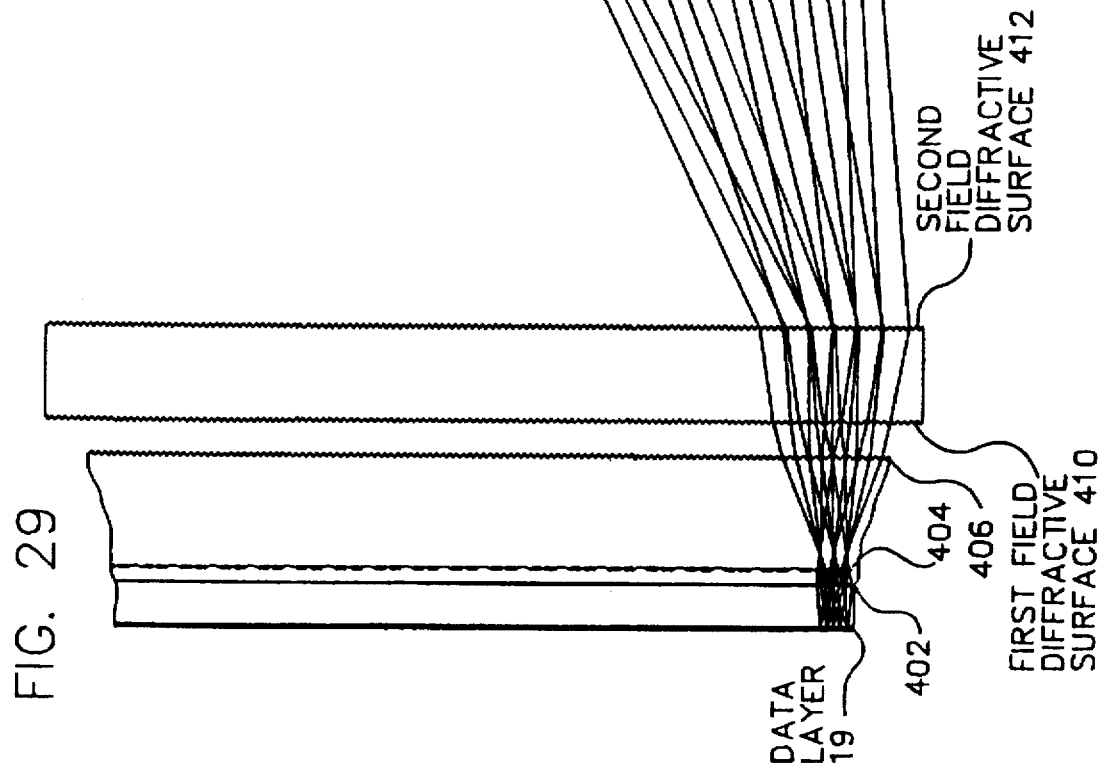
FIG. 29 is a view similar to FIGS. 27 and 28 showing still a further alternative embodiment of the optical system using all diffractive surfaces including a diffractive field lens and incorporating the color correcting anomalous lens element between the first and second diffractive surfaces that form the lens system objective.

With reference to FIG. 29, another embodiment of the anomalous or phantom lens for color correction is found in a system that provides the data and objective lens elements as a card as in the embodiment of FIGS. 25–27, but replaces the refractive field lens with an all diffractive field lens system provided by a diffractive field lens surface 410 and another diffractive field lens surface 412 separated by a spacer material of optical plastic. The advantage of this all diffractive system for both the objective and the field lenses is that it further enhances the system compactness.

Figure 30:
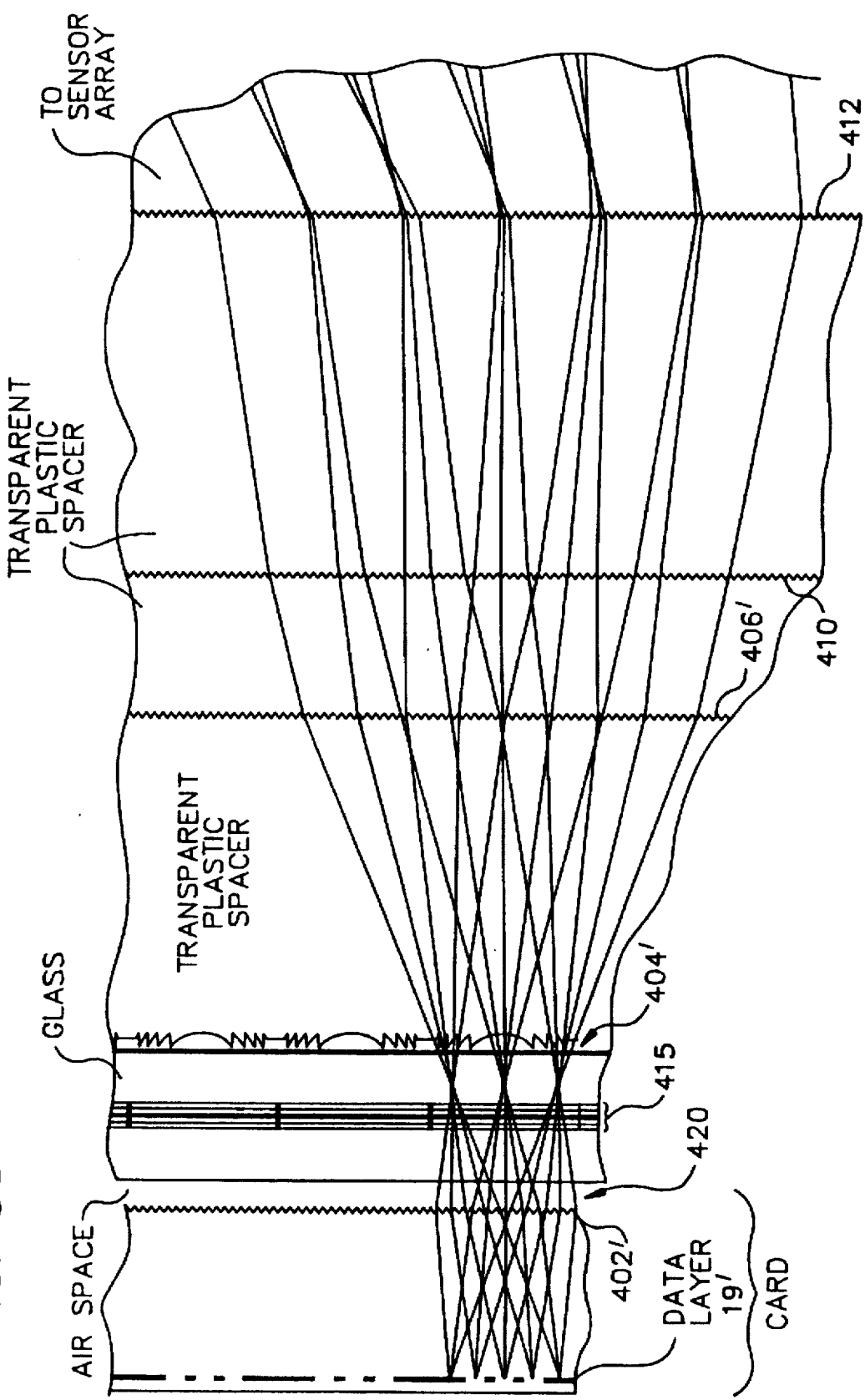
FIG. 30 is a view similar to FIG. 26 above showing an all diffractive lens system including the color correcting anomalous element and further incorporating a shutter LCD layer for shuttering light rays to and from each data page for recording and reading functions.
Figure 31:
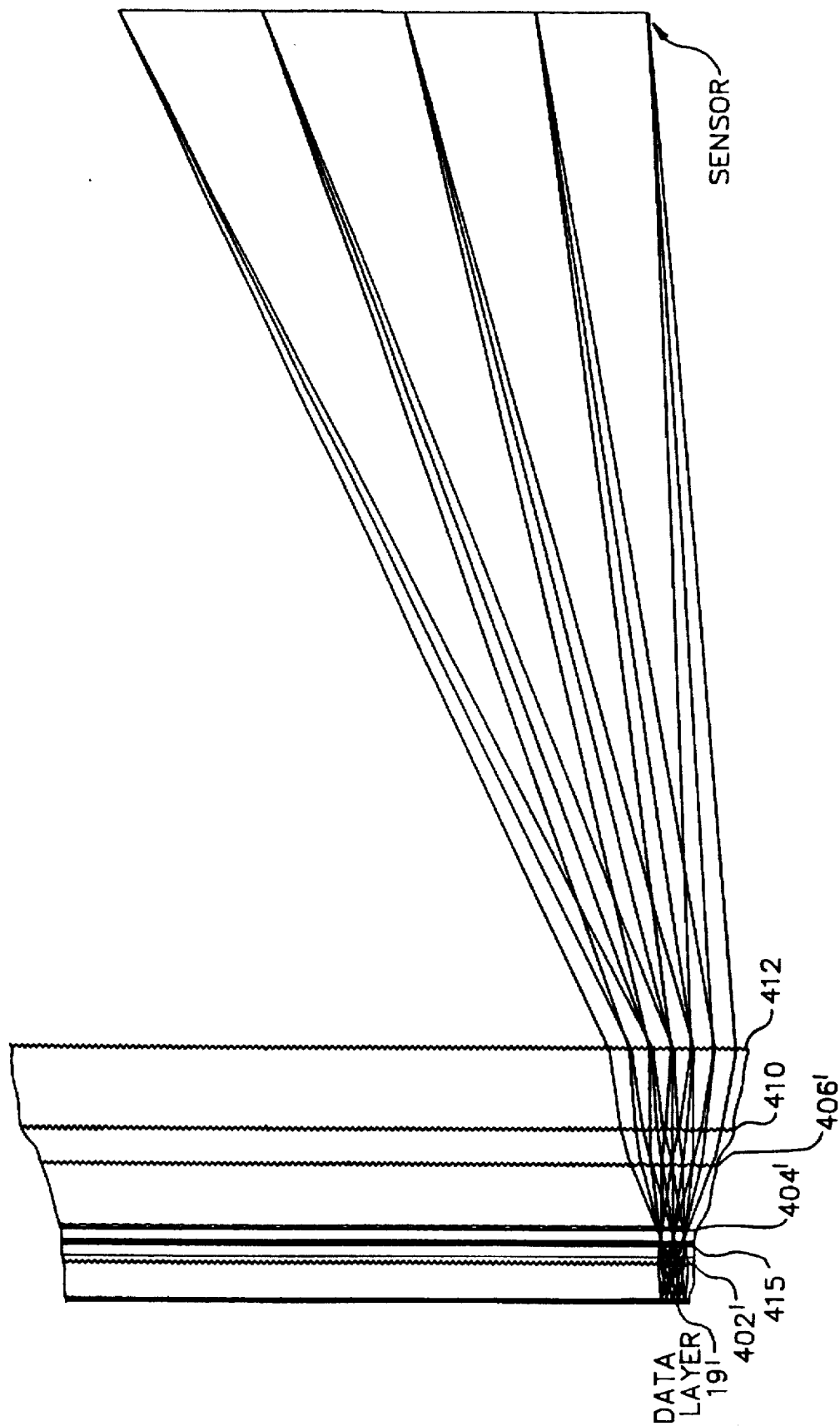
FIG. 31 is an overall schematic view on a reduced scale of the all diffractive shuttered lens system of FIG. 30 and showing in this view the imaging of data bits on the distal sensor plane.

FIGS. 30 and 31 illustrate an embodiment of the all diffractive lens system including the anomalous or phantom lens 404, here again being of Fresnel form, combined with an intervening LCD page shutter element 415 including polarizing layers and being located proximate the first objective diffractive element 402'. For this embodiment, the data lens card is made of data layer 19 and an optical bonding plastic on which the first objective diffractive surface 402' is formed as indicated followed by an air space indicated at 420 separating the next system of LCD shutters and lens elements which include shutter LCD 415, anomalous element 404' for color correction, a second diffractive objective element 406', and then first and second field diffractive elements 410 and 412 all of which are held together by plastic spacer and bonding as indicated. The LCD shutter 415 is located in a region where the light rays from adjacent pages are not overlapping, hence LCD 415 is located adjacent the first diffractive surface 402'. In this lens system and using two objective diffractive elements 402' and 406', the LCD shutter element must go after the first diffractive element so that a single page shutter is not distorting an image by cutting off or letting through rays from adjacent pages. For this purpose, it is efficient to make the data lens card of just the data layer 19' and the first diffractive element 402'. The shutter LCD 415, color corrector anomalous lens element 404', second diffractive layer 406', and the field diffractive 20 layers 410 and 412 are conveniently bonded together as a unit. Either air space or a solid optical plastic may be used between the second diffractive field element 412 and the sensor array.

Figure 34:
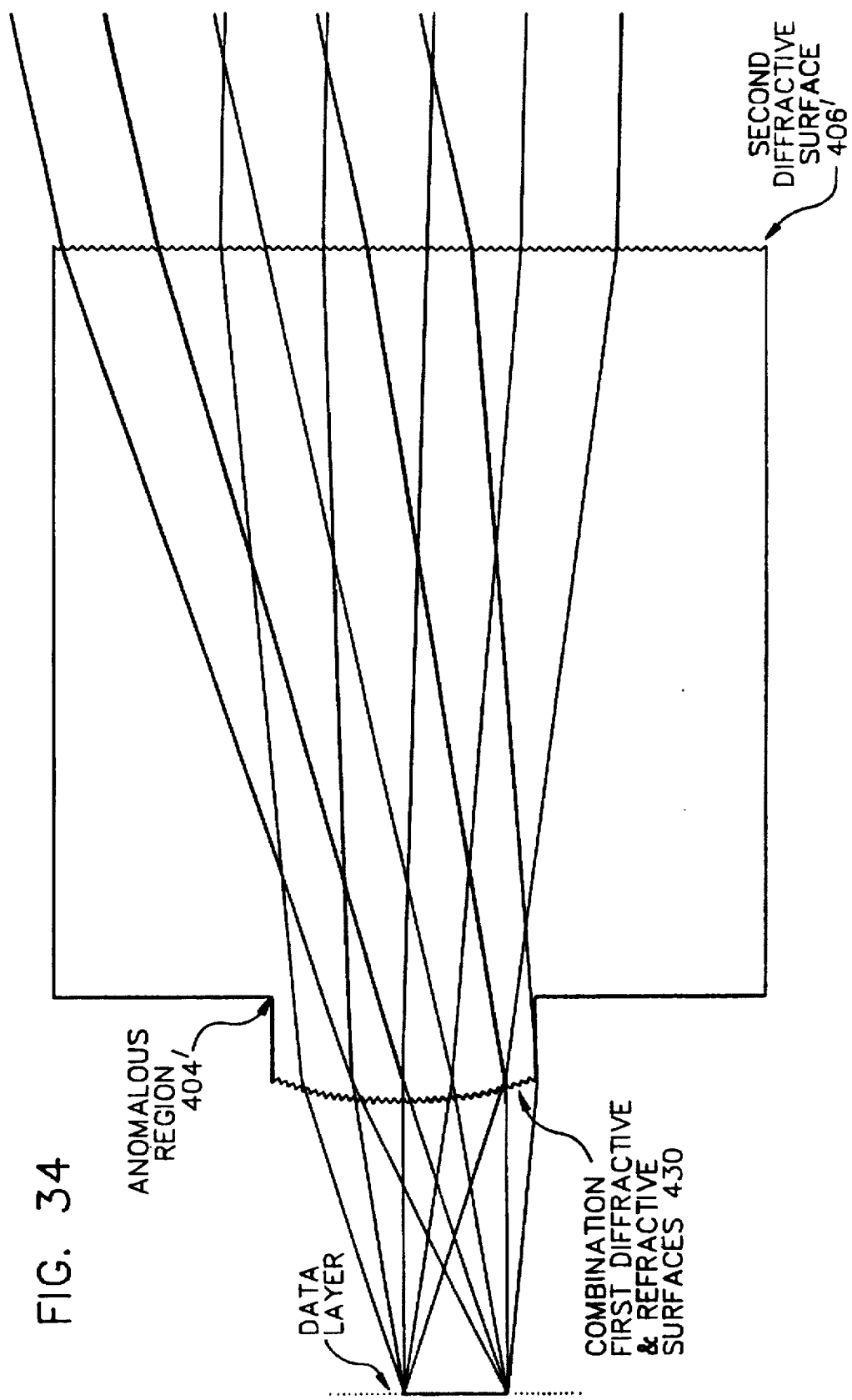
FIG. 34 is a diagrammatic view similar to FIG. 12 of the above embodiment, but having an alternative configuration of a combined refractive and diffractive lens system in which the first objective surface is a combination curved refractive element having a diffractive surface molded thereon followed by a color correcting anomalous lens region and then a second diffractive surface.

With reference to FIG. 34, still another embodiment of the lens system is shown in which a first objective lens element is a composite of refractive and diffractive surfaces indicated at 430. The anomalous or color corrective phantom lens region 404' lies between this composite refractive and diffractive element 430 and the second diffractive surface 406'. By shifting some of the objective imaging power from the first diffractive surface into the refractive component of the composite surfaces 430, the grating can be less fine and hence easier to fabricate, and secondarily, the amount of color correction or achromatizing is reduced and hence the prescription for the anomalous or phantom lens region 404' is less stringent, thereby permitting a wider selection of doping materials or dyes. In making these choices it is also preferable to keep the refractive power relatively small to minimize field curvative.

GRIN Lenses Using Anomalous Dispersion Dyes

Figure 35:
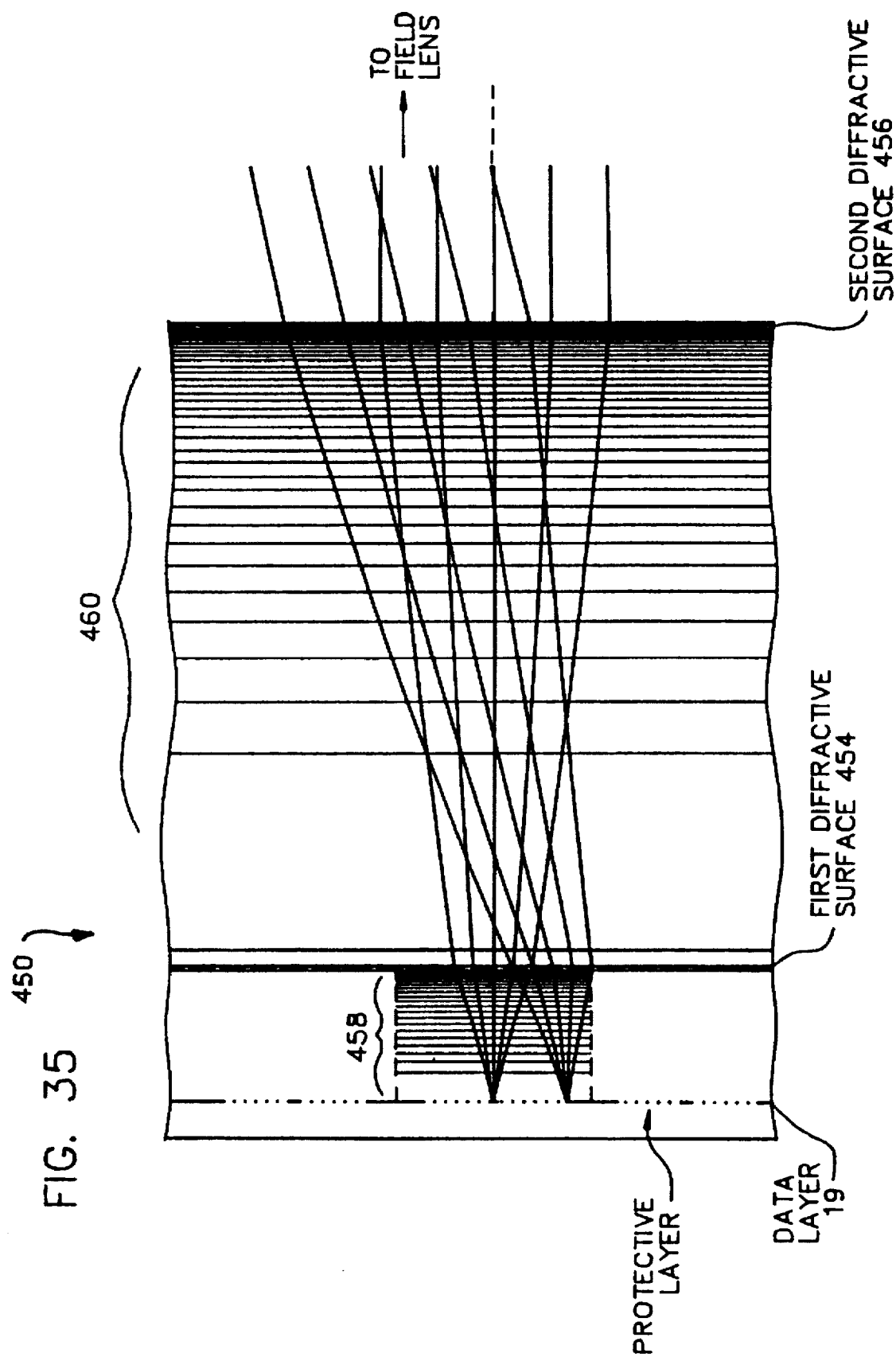
FIG. 35 is an enlarged schematic view of an arrangement of lens elements similar in view to FIG. 13 above, depicting an alternative objective lens system for imaging data through a succession of diffractive surfaces and interposed variable index gradient lens elements of the longitudinal gradient type.

With reference to FIG. 35, another embodiment of the objective lens system for imaging the multiplexed data pages uses a gradient index lens system 450 bonded to the data layer 19 as a data lens card 452. The composite card 452 includes a first diffractive lens surface or element 454 followed by a second diffractive lens surface or element 456 wherein both diffractive elements are augmented by a gradient index lens effect in the intervening optical plastic areas indicated at 458 and 460. The advantage of the gradient index lens or GRIN lens is to allow for the same overall imaging power with less strong and hence less rigorous requirements for the diffractive elements. In other words, some of the imaging power of the lens system is shifted from the diffractive elements over to another type of optical lens element, namely the gradient index lens areas 458 and 460 of lens system 450 used in the card 452. Simplified, the GRIN is fabricated in this instance by a change in the index of refraction of the material in the direction along the lens axis from the data layer toward the field lens and sensor, hence longitudinally of the lens axis. By using a base plastic, or it can be glass, material between the diffractive elements and the data layer, and then increasing the index of that optical material longitudinally (axially) from data layer toward the field lens, an optical effect is achieved that is the functional equivalent of a refractive lens element. In this case, the device is fabricated by a build up of different layers of increasingly higher index optical plastics, either by selecting the stock material or by selective doping of the layered material.

Figure 36:
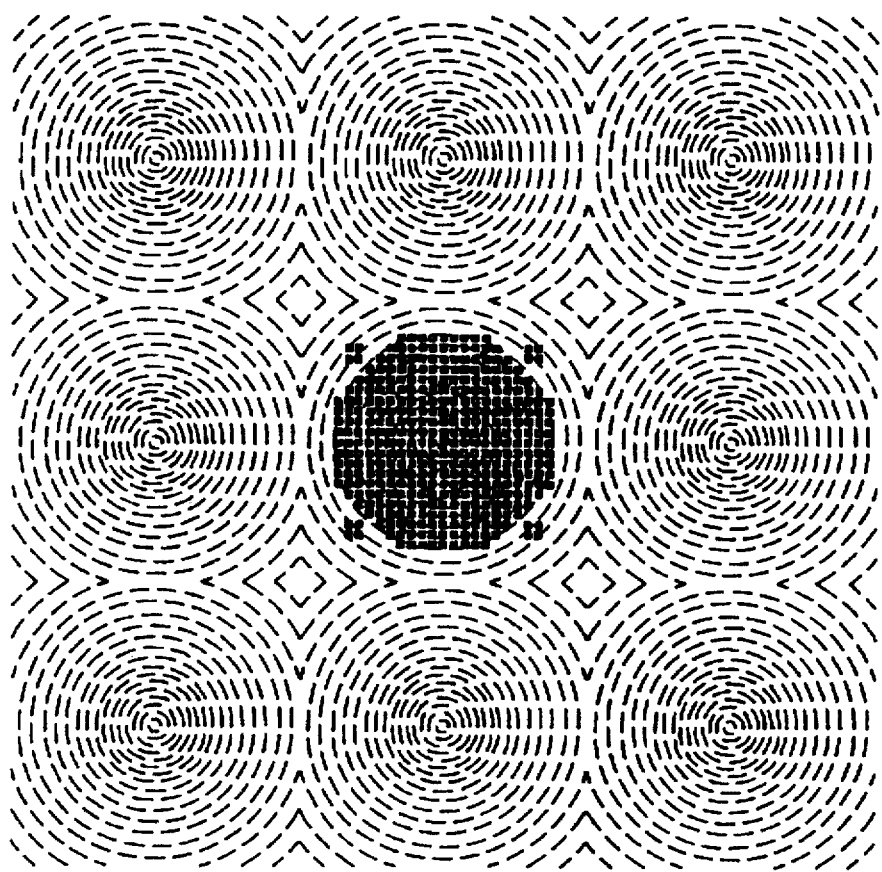
FIG. 36 is an enlarged schematic view of an arrangement of lens elements similar to the embodiment of FIG. 35 above, depicting a further alternative objective lens system for imaging data through a succession of diffractive surfaces and interposed variable index gradient lens elements of the radial variant type.

In an alternative embodiment, a GRIN lens configuration can be used in which the index of refraction varies as a function of radius. In fact, lenses made with a radial GRIN are widely known and used because the optical effect is more similar to a conventional refractive spherical lens element. Thus, in the embodiment shown in FIG. 36, a lens system that is an alternative to the longitudinal GRIN of FIG. 35 is shown using a radial gradient variation. In fabricating both a longitudinal (FIG. 35) and radial (FIG. 36) GRIN lens as components of the present invention, the following considerations apply.

A gradient index lens (GRIN lens) is an optical element where the index of refraction of the lens material varies as a function of distance. One type of GRIN is known per se, and is a device shaped like a right cylinder, with the index of refraction varied as a function of radius. It turns out that if the index decreases as the inverse square of the radius, the cylinder will function like a standard positive spherical lens. The power of the GRIN lens depends on the total change in index (the value of the proportionality constant), the length of the cylinder, and the diameter.

Known GRIN lenses are currently manufactured of glass. The glass that is used is a mixture of two or more components, where at least one component is more soluble in some reagent than the others. The technique has been to put a glass cylinder in a leaching bath, which will remove the one component as an inverse function of the square of the distance. In this way, a GRIN lens can be made with the proper radial distribution of index.

Alternatively, and in accordance with my novel embodiment, a gradient is generate along the axis of an optical path which will give optical power similar to a conventional lens element and an example of such is used in the embodiment of FIG. 25.

The preferred fabrication on such lenses is to diffuse a dye into a plastic base material. The dye will increase or decrease the base index depending on the location of the dye absorption band relative to the operating wavelength of the optical system.

In the case of a radial index distribution, there are two ways to make an element. The first way is to immerse a plastic cylinder in a bath of dye that is dissolved in a solvent that is compatible with the plastic. The dye will diffuse into the plastic on an inverse square basis without further arrangements. In this case, it is desired to have the lower index at the surface of the cylinder (for a positive lens), so a dye would be chosen such that the absorption band is at a wavelength that is longer than the operating wave band.

Alternatively, a radial index distribution could be diffused into a relatively thin section of a cylinder by printing or painting dye/solvent on the cross-section surface of the cylindrical section and diffusing the dye into the plastic, as above. The process would resemble frosting a cookie. The dye will diffuse in a radial direction as well as axial, so the section must be thin relative to the required index variation, i.e., the cookie must be thin.

Note that a positive lens can be made by either reducing the index of the outer radii, or by increasing the index of the central regions. The choice depends on the available dye.

On the other hand, if longitudinal gradient is desired, it is only necessary to uniformly coat the section surface of a cylindrical piece, and again diffuse the dye into the plastic. There is somewhat more flexibility in the manufacturing process in that there is no pattern to worry about, and the diffusion can take place from either side, depending on the type of dye available.

In the ray trace programs which may be used to design GRIN lenses, the index is specified as two power series, where one independent variable is the radius, and the other is the axial (the direction of the light) distances $$n(r,z)=n_0+n_{z1}z+n_{z2}z^2+n_{z3}z^3+\ldots+n_{r1}r^2+n_{r2}r^4+n_{r3}r^6\ldots$$

Basic Relative Motion Mechanism
Separate Source and Sensor

Figure 37:
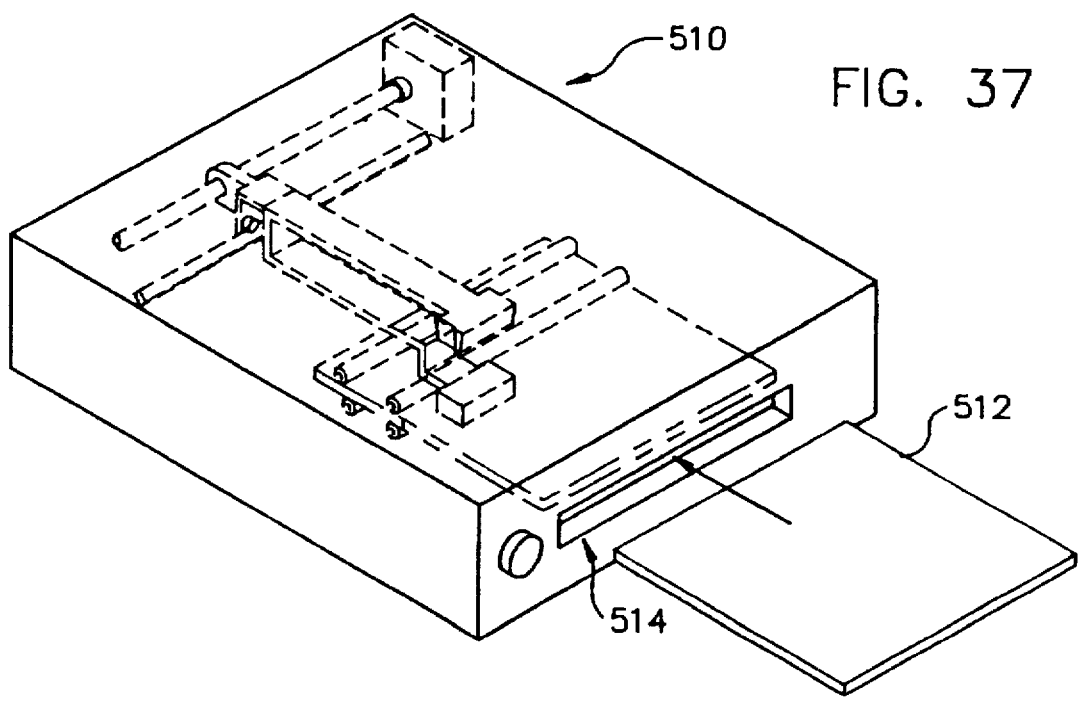
FIG. 37 is an isometric view of an optical data card read and/or write device in a read only configuration.
Figure 38:
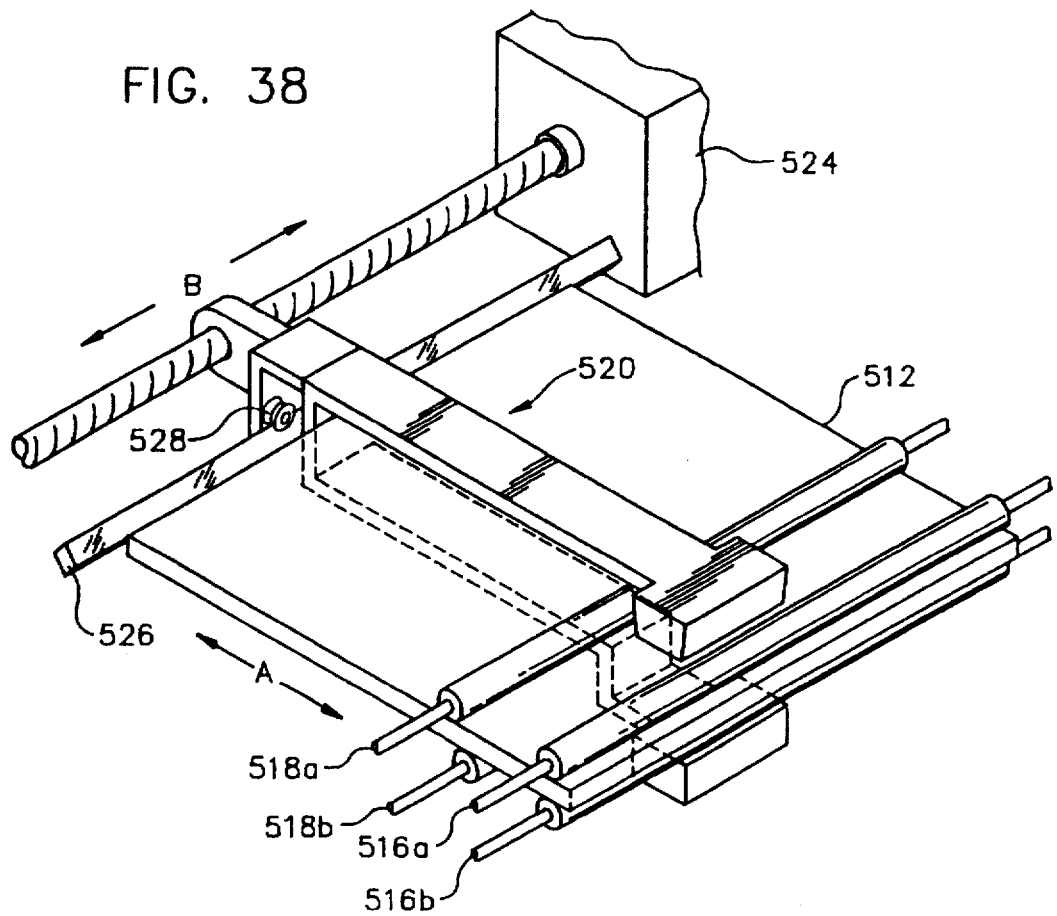
FIG. 38 is an isometric view of the internal elements of the embodiment shown FIG. 37.

FIG. 37 shows an alternative embodiment in the form of an optical data card read and/or write device 510 (R/W device) in a read only configuration for a single optical data card 512. R/W device 510 has a slot 514 for introducing card 512 into R/W device 510. FIG. 38 depicts card 512 fully drawn into the internal mechanism of R/W device 510. Card 512 is gripped by translation rollers; upper rollers 516a and 518a cooperating with lower rollers 516b and 518b. The pairs of rollers translate card 512 back and forth in direction "A".

Figure 39:
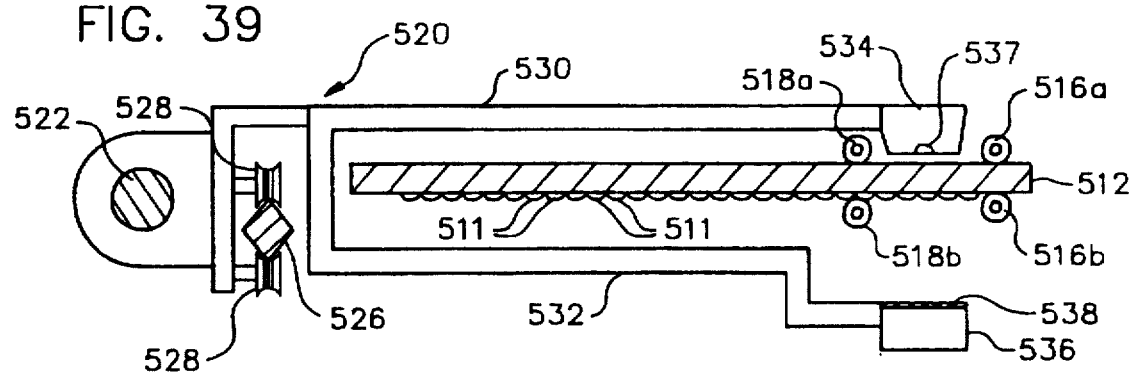
FIG. 39 is a side elevation view of the elements shown in FIG. 38.
Figure 40:
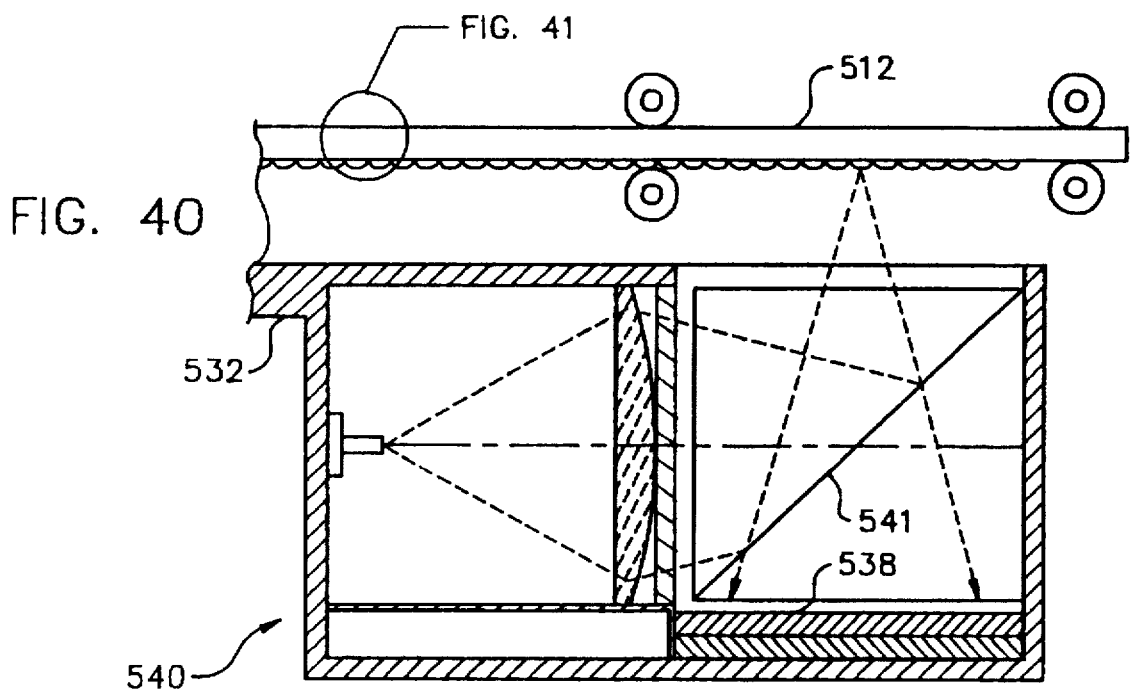
FIG. 40 is an alternative embodiment of the device of FIG. 37 in a read/write configuration.
Figure 41:
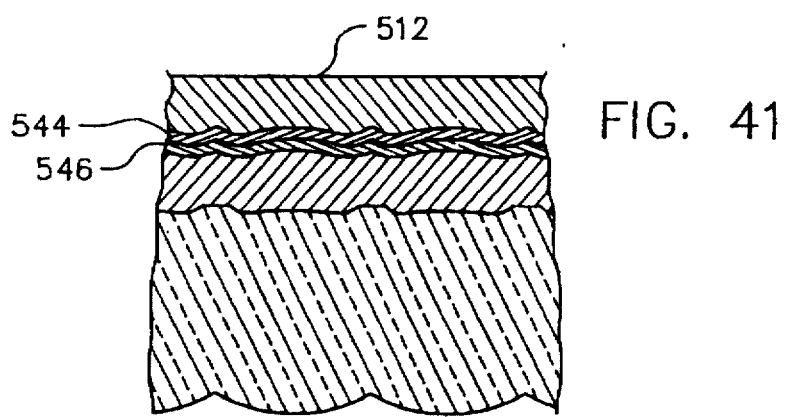
FIG. 41 is a cutaway side view of a data card with a reflective layer utilized in the read/write configuration of FIG. 40.
Figure 42A:
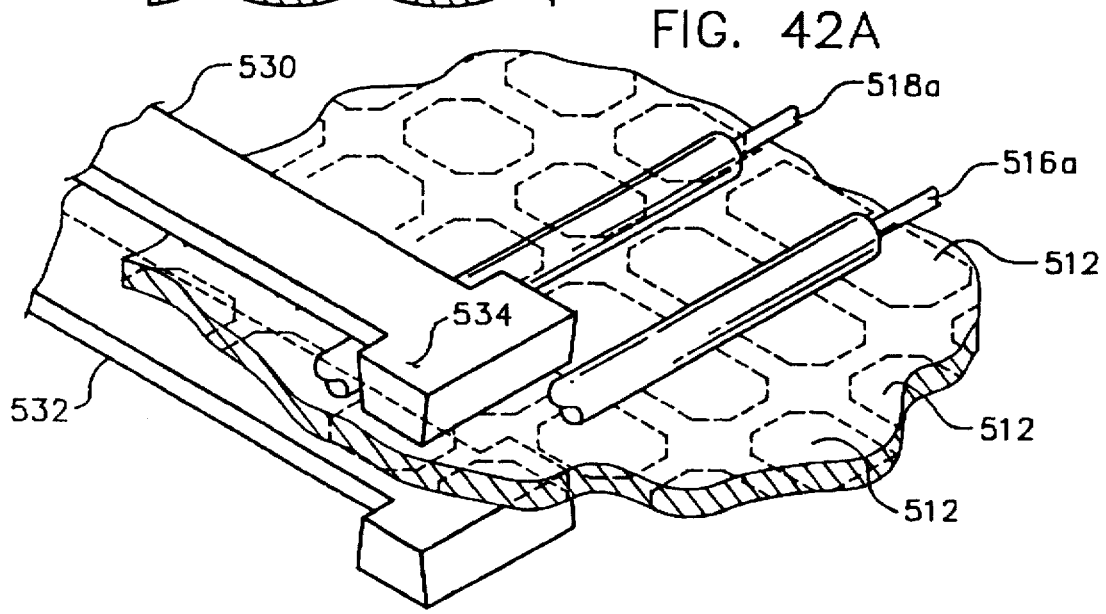
FIG. 42A is a cutaway isometric view similar to that of FIG. 38 but depicting multiple data chapters in which each chapter is illuminated by a full chapter light source.
Figure 42B:
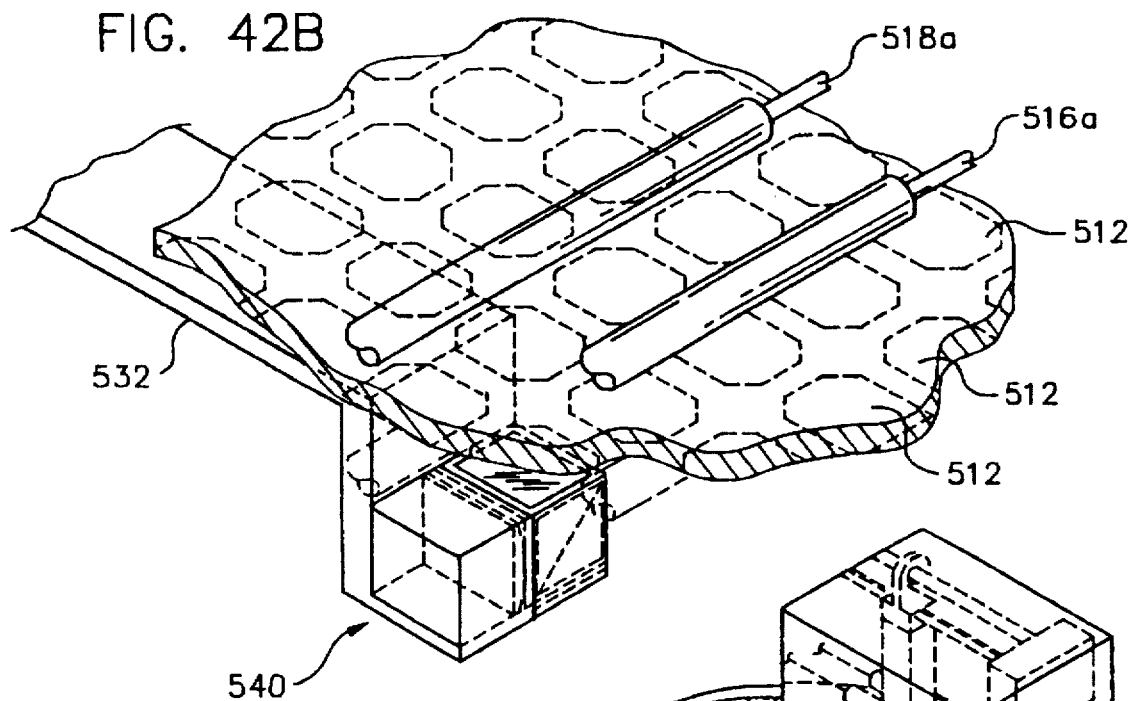
FIG. 42b is an alternative the embodiment of FIG. 42A shown in a read/write configuration.
Figure 44:
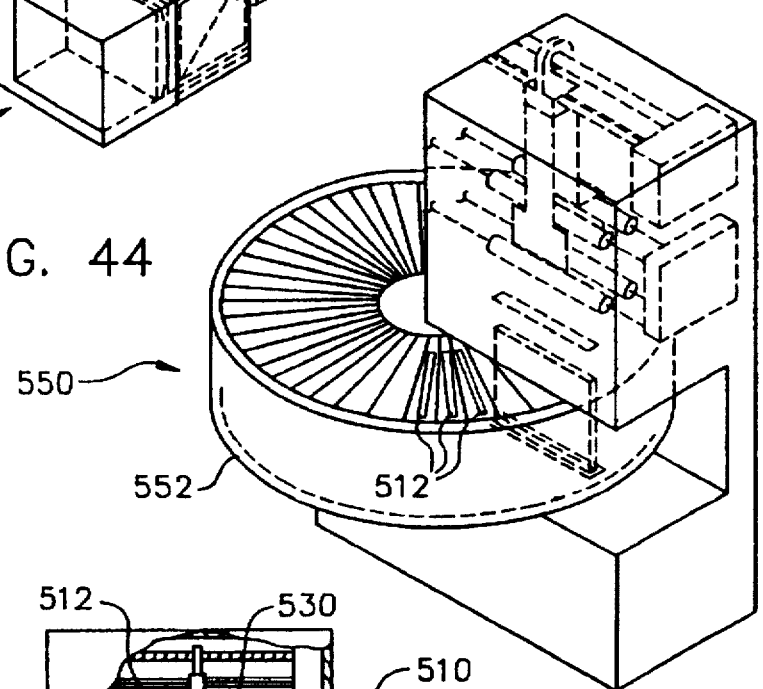
FIG. 44 is an isometric view of an embodiment featuring a carousel data card reader.
Figure 45:
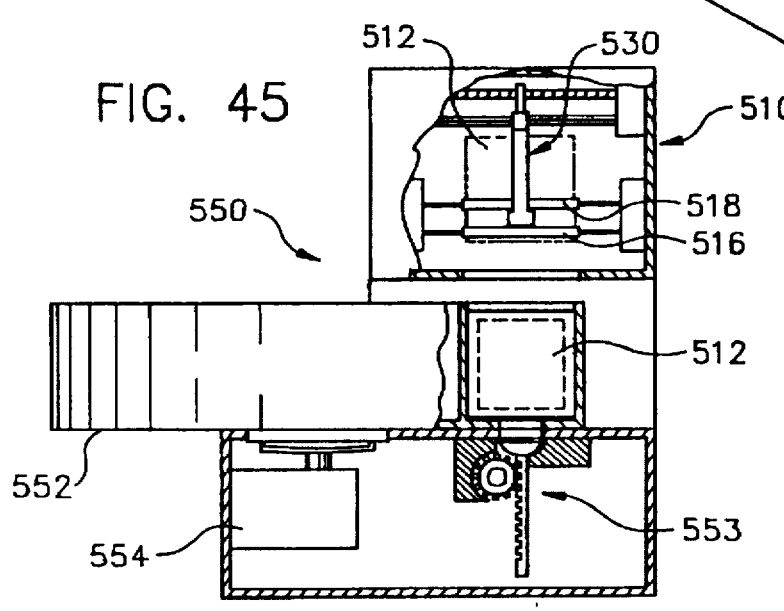
FIG. 45 is a partial cutaway side elevation view of the embodiment of FIG. 44.
Figure 43:
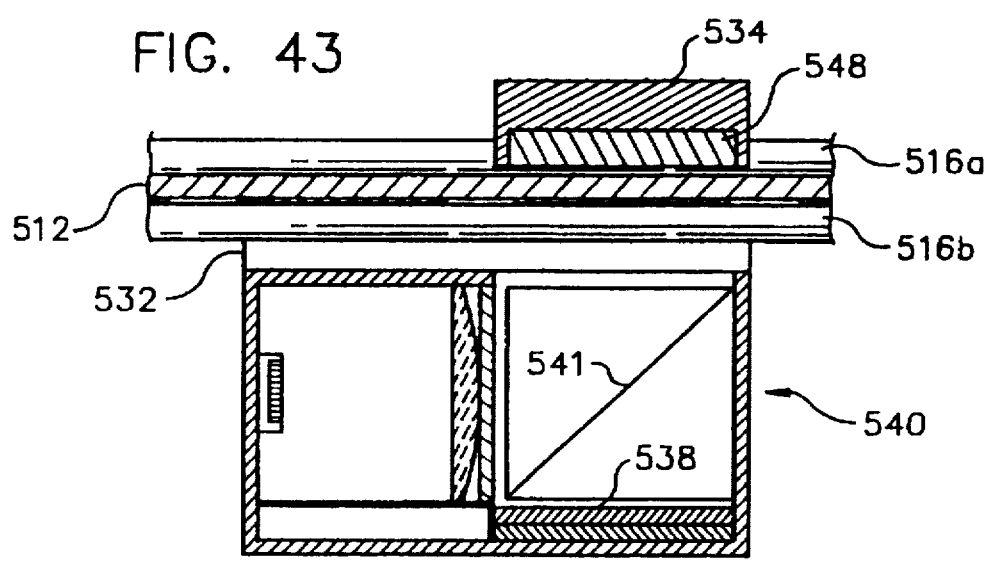
FIG. 43 is a front elevation view of the embodiment of FIG. 42A.

Yoke 520 is urged to translate in direction "B" by worm shift 522 which is driven by stepper motor 524. Yoke 520 is supported by support rail 526 bearing upon support wheels 528. Referring now to FIG. 39, yoke 520 has an upper arm 530 and a lower arm 532. Arm 530 has at its distal end light source means 534 while lower arm 532 has at its distal end sensor means 536. The relative position of card 512 and light/sensor means 534 and 536 is controlled by conventional devices and methods for this purpose as well as additional features of this invention discussed herein.
Single Page Source Still referring to FIG. 39, in one preferred embodiment, light source means 534 is a single light source 537 which illuminates a single page of data on card 512. A sensor means 536 embodies a sensor array 538 which receives light rays from single light source 537.
Single Page with Reflective Data Layer A variation on the embodiment just described is shown in FIG. 40 wherein a read/write module 540 with beam splitter 541 is located at the distal end of lower arm 532. Module 540 provides the light sources necessary to read and/or write data card 512 with a reflective layer 544 as well as the sensor array 538. FIG. 41 shows a portion of card 512 illustrating a reflective layer 544 behind data layer 546. The incorporation of read/write module 540 obviates the need for upper ate 530.
Multiple Chapters Both of the immediately previously described methods of reading a single card can be employed in a R/W device 510 that accommodates an array of data representing multiple cards or chapters 512 as depicted in FIGS. 42A and 42B. In a preferred embodiment, light source means 534 would be a full chapter light source 548, shown in FIG. 43, which can be selectively controlled to illuminate single pages. Alternatively, in some applications a read/write module 540 could be utilized, thus eliminating the need for an overhead full chapter light source as depicted in FIG. 42B.
Carousel Another preferred embodiment adapts R/W device 510 into data card carousel reader 550 depicted in FIG. 44. Carousel 552 stores a plurality of data cards 512. The upper portion of carousel reader 550, as shown in FIG. 45, houses R/W device 510. The lower portion of carousel reader 550 houses data card transport means 553 and carousel rotation means 554. Transport means 553 may be a simple rack and pinion device as shown which lifts a card 512 up to a point where rollers 516 can grip the card and further transport it into the grip of rollers 518 and proceed to be read or written to as desired. An alternative embodiment, not depicted, incorporates a transport means in the upper portion of carousel reader 550 in effect would reach down and lift a data card up into contact with rollers 516, thereby permitting the overall housing size to be made more compact.

Diffractive Lower Surface of Data Card

In all of the above described embodiments employing an R/W device utilizing rollers as shown in FIG. 37, an alternative formation of data cards 512 incorporates a diffractive layer in place of the lenslets 511 depending from the lower surface of card 512 as shown in FIG. 39. The advantage of employing a flat diffractive surface, as opposed to the bumpier lenslet surface, is to enhance the smoothness of translation of card 512 through rollers 516a,b and 518a,b and to aid in maintaining the proper geometry relative to light sources and sensors.

Continuous or Indexed Data Tape Relative Movement

Figure 46:
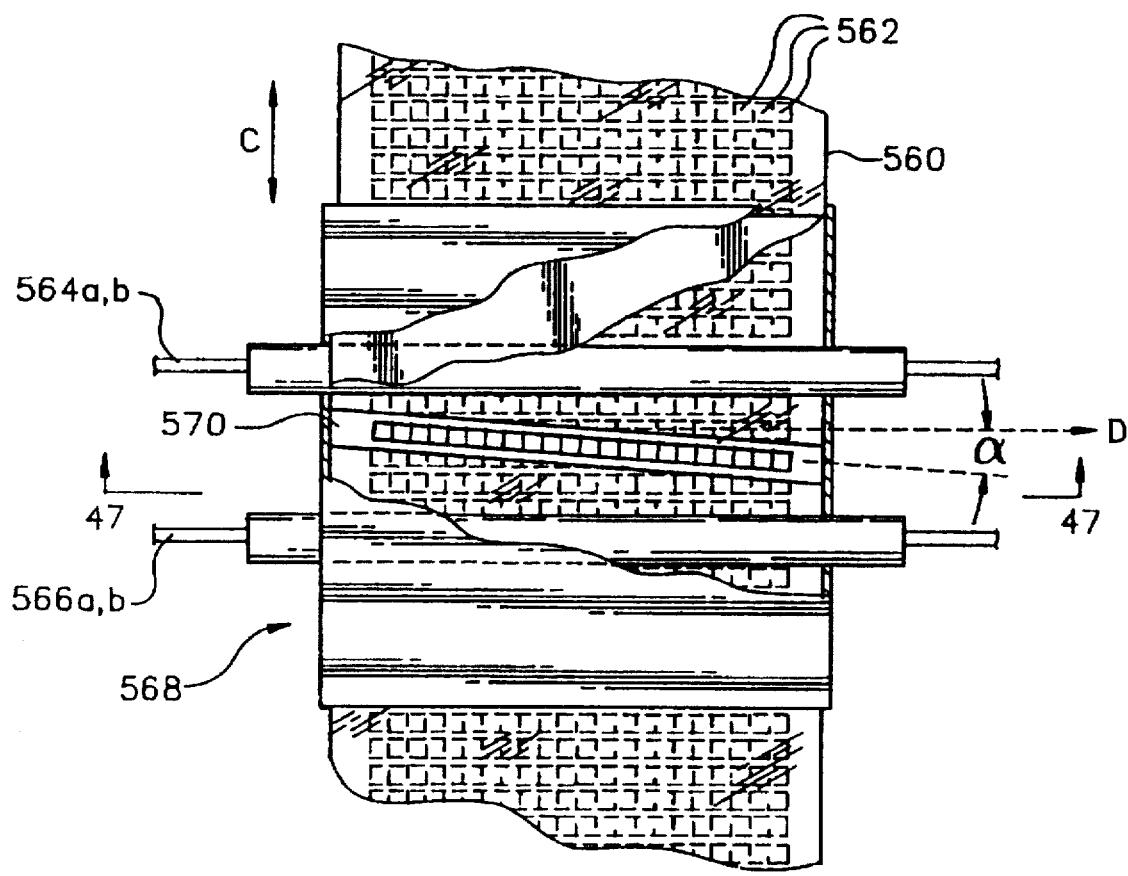
FIG. 46 is a plan view of a continuous motion data tape reader.
Figure 47:
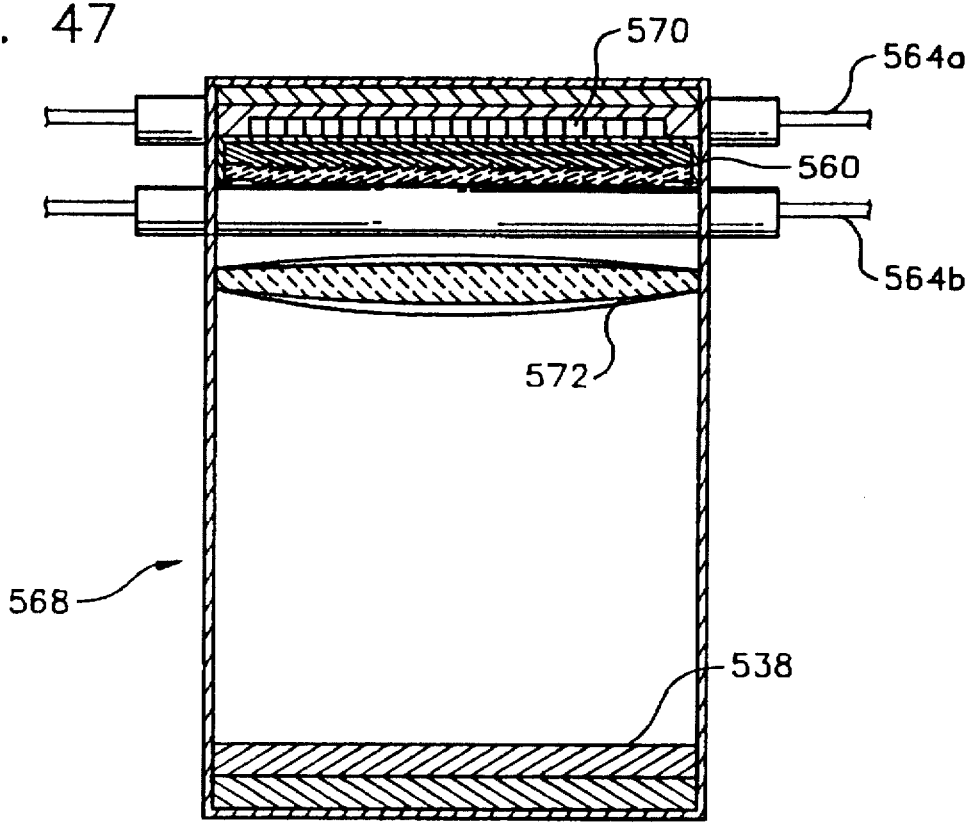
FIG. 47 is a section view of the embodiment of FIG. 46 taken along line 47—47.
Figure 48:
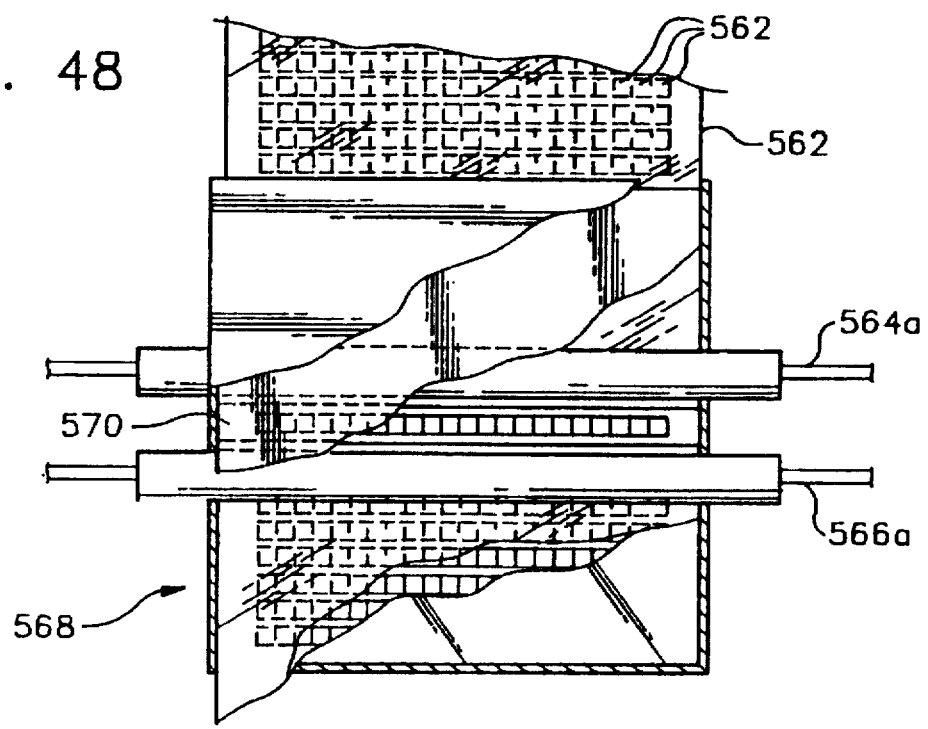
FIG. 48 is a plan view of an indexed data tape reader.

An additional preferred embodiment provides for continuous relative movement between a medium supporting a data layer, such as a continuous tape, and corresponding light sources and sensors. FIG. 46 depicts an overhead view of a portion of a data tape 560 with rows of data pages 562. Pairs of rollers 564a,b and 566a,b assist in feeding the data tape through a reed module 568, shown cutaway, and maintaining flatness of the data tape as it passes through the module in direction "C". A light source strip 570 is mounted in the top of module 568 at a skew angle alpha relative the data tape edge normal direction "D". The skew angle alpha is chosen to permit light source strip 570 to span from the beginning page in a data page row to a data page at the opposite end of an adjacent row. A cutaway front side view of module 568 is shown in FIG. 47. Below data tape 560 is a field lens strip 572 and sensor array 538. In this embodiment, lens strip 572 is canted at the same skew angle as light source 570. Reading of data tape 560 is accomplished by multiplexing individual light sources in light source strip 570 sequentially from left to right or vice versa depending on the direction of travel of the data tape. The reading of a continuously moving data tape can be accomplished by skewing the data page rows as opposed to the optical components. By maintaining the optics elements in orthogonal relationship to the direction of tape travel as depicted in FIG. 48, a tape can be indexed and whole data page rows can be read at one time then stepped to the next row to be read and so on.

An alternative embodiment incorporates a read/write module 540 (described above and shown in FIGS. 40 and 43) so that data can be recorded on data tape 560. Although, in this embodiment, ordinarily only a single row of data pages will be written at one time.

Tape Synchronization

In either of the data tape embodiments discussed above, continuous or indexed, synchronization of the data page on the tape with the reading mechanism may be accomplished by one of several methods.

Multi-flash Indexing

One preferred embodiment flashes the light source 570 at a high rate while the sensor array looks for fiducial data mark images (fiducial data marks are discussed below in relation to FIG. 49), after the tape drive system has transported the tape to approximately the correct position for the next read. The tape drive system is controlled to provide the correct overall data rate so the position of the next data page is reasonably well known.

An example of the multi-flash technique follows. Assuming the data tape system is designed for TV, the data rate required is approximately 25 Mbit/sec. with "ordinary" compression. Also assume the data tape is 16 mm wide, a data page is 1 mm in diameter and 1 Mbits of data is stored per page, in a 1000 bit by 1000 bit array, yielding 16 Mbits/data page row. The suggested data rate of 25 Mbits/sec. then requires reading 1.6 data page rows/sec which translates into tape movement of 1.6 mm/sec or 1600 rows of bits per second. Flashing the light source at a frequency of 6400 flashes/sec provides control of the reading of the data to within ¼ of a bit which is good enough for an accurate read. Since as mentioned above the overall tape position is reasonably well known, it is only necessary to begin flashing the light source in a search for the fiducial marks when the tape is within approximately 5% of the position in which it will be stopped for about 0.6 seconds before indexing to the next row of data pages.

For continuously moving tapes, indexing of a read operation must be accomplished for each data page. As described above, either the light source or the data page rows are skewed in a continuous moving device. The operation of flashing the light source and looking for fiducial marks is repeated in this configuration as described above.

Applying this technique to the TV data rate example described above follows. Again approximately 25 Mbits/sec is required. Since each data page contains 1 Mbits, 25 pages are read each second. Since the data rows or the light source is skewed by the diameter of 1 page (1 mm) and the tape is 16 pages (16 mm) wide the tape must advance 1.56 page diameters (1.56 mm) to permit reading 25 Mbits of data. This rate of tape advance also translates into 1560 rows of bits per second. A flash rate of about 6250 Hz provides for indexing of about ¼ bit which again is sufficient for an accurate read of a data page.

Separate Detectors

An alternative preferred embodiment utilizes a separate detector which reads index marks recorded on an edge of the data tape. The marks correspond to the locations of either rows of data pages or individual data pages in the skewed arrangement. The index marks sensor is accurate to approximately ¼ bit (¼ micron). A conventional feedback mechanism utilizing the voltage generated by the mark detector controls the read function. An alternative to this approach incorporates double detectors that would register a balance across a mark thereby permitting the index mark to be larger in size, such as 3 to 4 microns.

The multi-flash technique can also take advantage of index marks positioned at the edge of the data tape wherein the detector(s) signal(s) the imminent arrival of the page fiducial, so only a small number of flashes would be required.

Fiducial Data Marks

Fiducial data marks are used for several purposes including registration adjustment for reading or prior to writing if previously recorded fiducial data marks exist, where the adjustment is provided by electronic and/or mechanical means as described elsewhere and for data tape synchronization. The fiducial data marks may be pre-recorded or recorded at the same time that data pages are recorded. One preferred configuration of fiducial data marks 580 is shown on a single data card in FIG. 49.

Slow Registration

The preferred embodiments may employ the aid of mechanical adjusters to achieve the necessary optical registration between the light source, data medium and sensor array elements of the invention. A typical application of registration adjustment means is shown in FIG. 50. In the embodiment of FIG. 50, registration adjusters 600 are shown depending from the top of a read only optical memory module 602. An optical data card (chapter) 604 is shown being held up against a full chapter light source 608 by springs 606. FIG. 51 is a top view of module 10 of FIG. 50 showing registration adjusters 600 in position proximate the corners of data card 604. Adjusters 600 are controlled via a conventional feedback loop (not shown) to push chapter 604 along orthogonal axis "x" or "y" depending into a position of optical registration. Further, chapter 604 can be urged through an angle Beta into angular alignment by adjusters 600 since the force vectors generated, F1, F2, F3 and F4, do not act through the center of chapter 604.

FIG. 52A depicts one preferred type of registration adjuster 600. The device is symmetrical about its central axis "A" and incorporates a resistive heating element 610 which Is surrounded by a flexible sheath 612. The space within the sheath is filled with a wax, such as Cantowax J, or polymer with a known coefficient of expansion during a phase change from a crystalline state to a liquid state. While undergoing a phase change, the sheath expands as indicated by the phantom lines. The expanding sheath bears upon an edge of a chapter 604 as shown in FIG. 51 and discussed above. An alternative to the embodiment shown in FIG. 52A is shown in a side view in FIG. 52B and a top view in FIG. 52C. Depending on space limitations and type of application (to be discussed below) this embodiment may be preferable. The variation shown in top view in FIG. 52D and in side view in FIG. 52E has the added element of a perforated diaphragm 614 which is designed to only permit expansion of adjuster 600 primarily in one direction thus concentrating the forces and movement in a desired direction.

Another preferred embodiment of is shown in side view in FIG. 53A and partial top view in FIG. 53B. Adjuster 600 embodies a solenoid coil 616 and a translating core 618. The rounded end 620 of core 618 pushes upon a beveled edge 622 of chapter 604 when the solenoid is energized. The components $N_{x,y}$ of the normal forces "N" acting in the plane of chapter 604 provide the required orthogonal and angular registration.

Alternative embodiments to the wax filled embodiments or solenoid embodiment described above include using a heated bi-metallic strip with a predictable coefficient of expansion or a stack of piezoelectric elements to provide the forces necessary for registration.

In other embodiments, the adjusters may provide registration by adjusting the relative position of a sensor array as opposed to a data card, or they may act upon guide means for a continuously moving or indexing data tape.

Single Chapter Fixed Registration

Figure 54A:
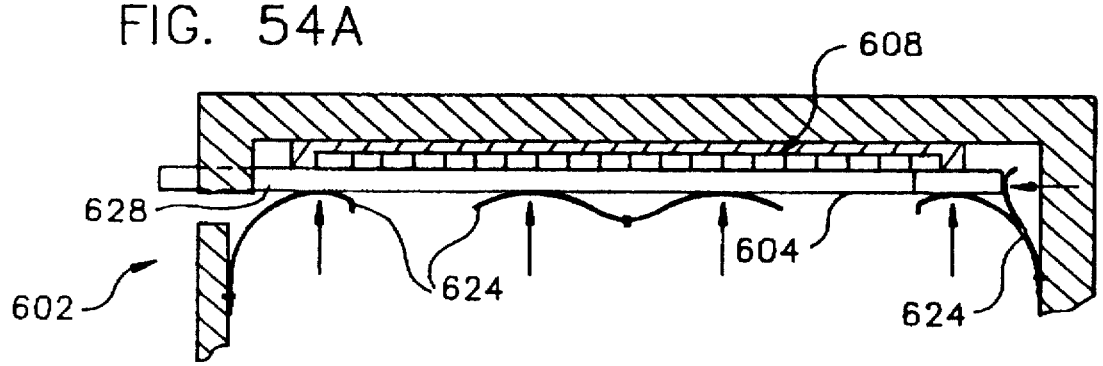
FIGS. 54A and 54B are cutaway side and plan views respectively of an optical memory module using springs to bias a single chapter of optical data against reference surfaces.
Figure 54B:
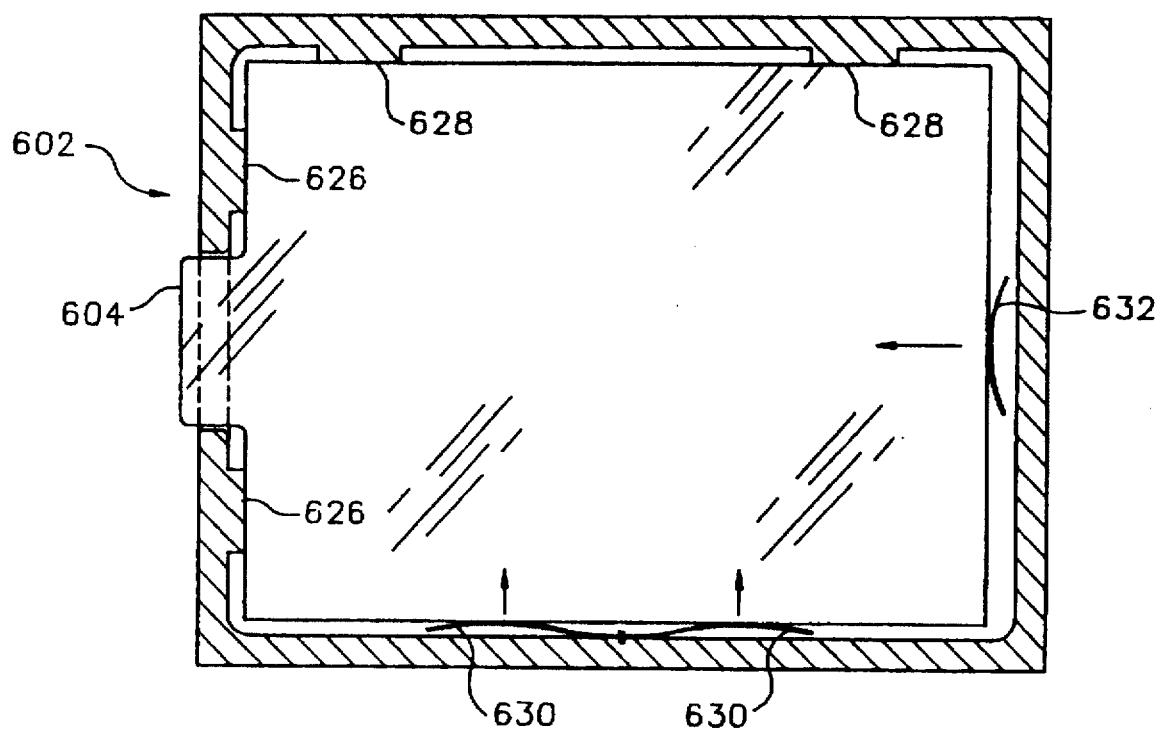

Another alternative to utilizing registration adjusters to shift the position of a single chapter is to create a module with precision reference surfaces against which a chapter is brought into contact. FIGS. 54A and 54B show such an embodiment. FIG. 54A is a partial cutaway side view of a read only module 602 showing a chapter 604 held up against a full chapter light source 608 by upward force springs 624. FIG. 54B shows a cutaway top view of a module 600 with front reference surfaces 626 and side reference surfaces 628. Side spring 630 biases chapter 604 against side references surfaces 628 while rear spring 632 biases the chapter against the front reference surfaces 626.

Such a module can be constructed by precision molding processes utilizing filled polymers or metals. Alternatively a rough molded or cast part can be machined to provide the precision reference surfaces.

Solid Cube

A further alternative to the module discussed wherein a chapter may be replaceable and module incorporates some registration means is to simply pot the elements of a functional module in polymer of appropriate optical properties. Such a module could be used to permanently store software of the type that is often accessed but not altered such as a computer operating system.

Game Cartridge

Figure 55:
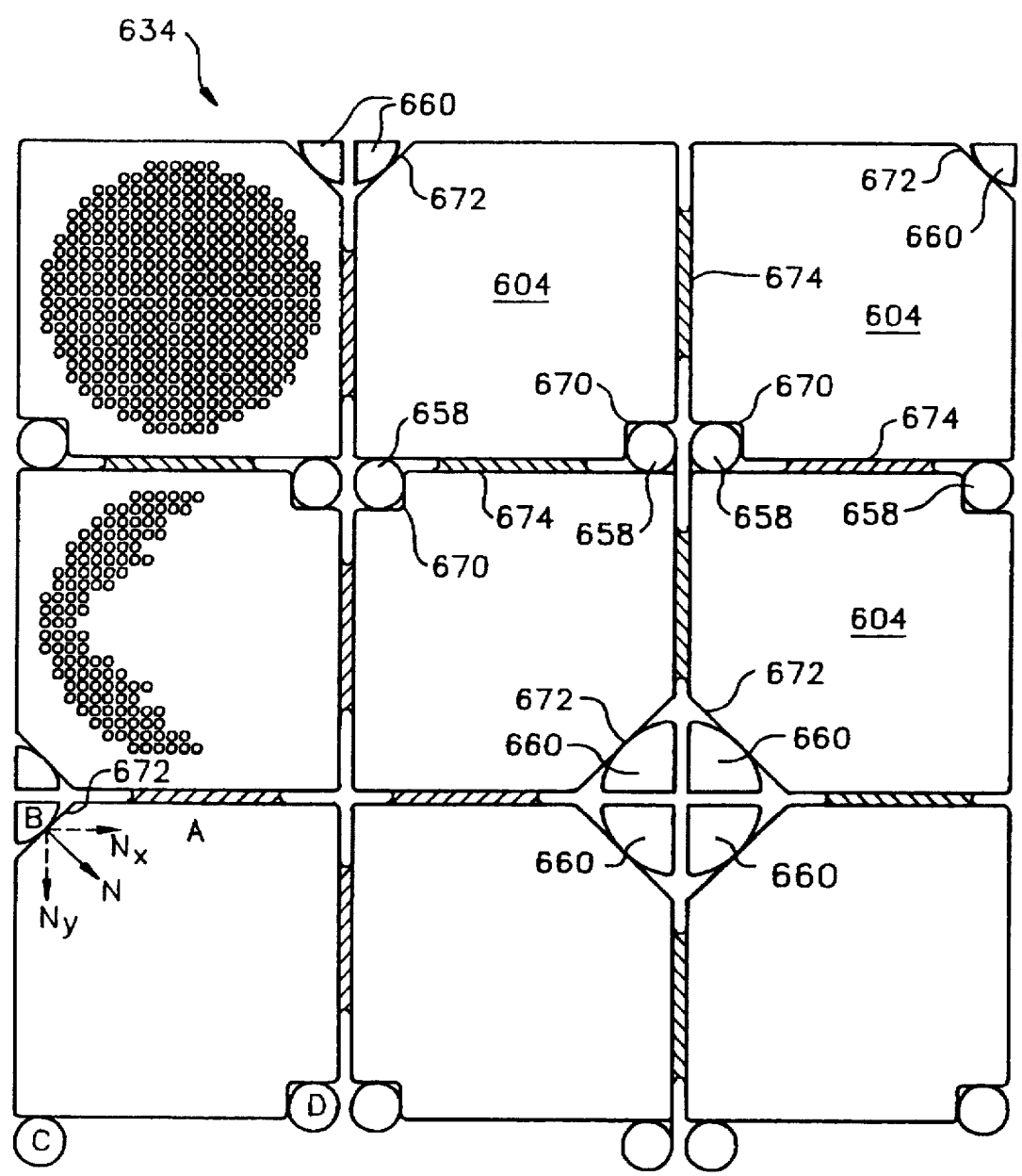
FIG. 55 is a plan view of a 3×3 array of optical data chapters.
Figure 56:
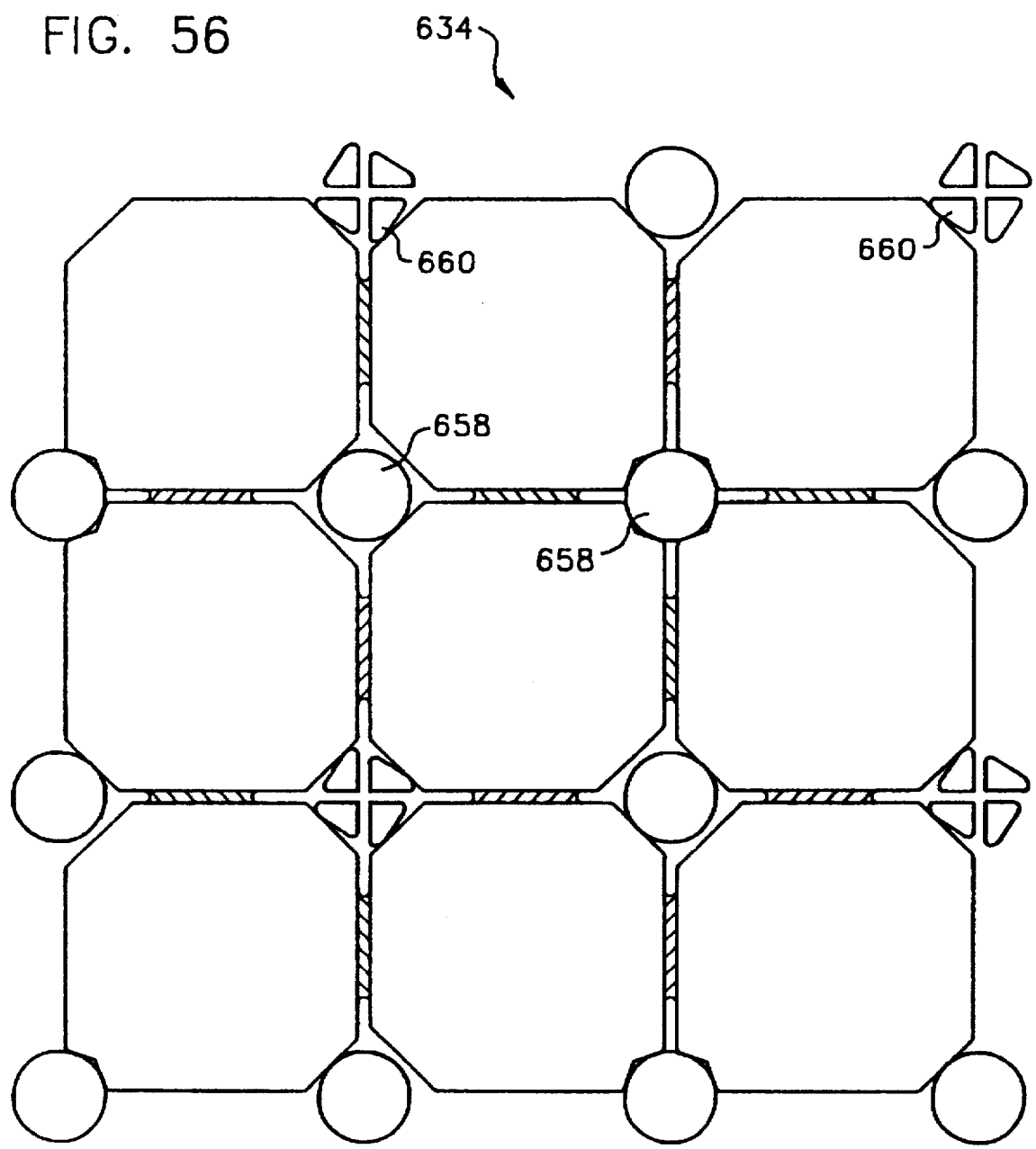
FIGS. 56 and 57 are alternative embodiments of the array of FIG. 55.
Figure 57:
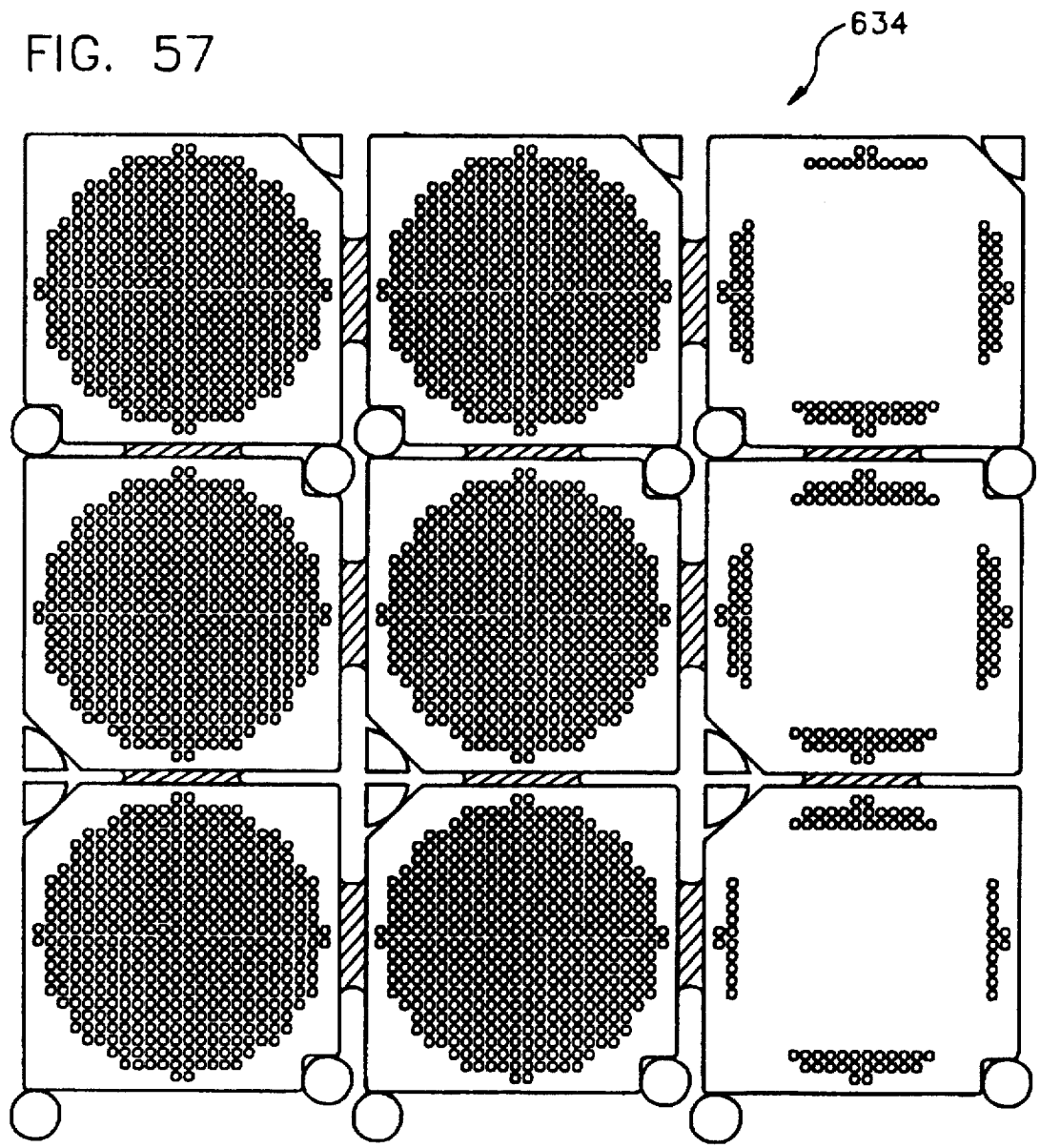

Another preferred embodiment incorporates an array of data cards or chapters 604 into an array 634, one version of which is shown in plan view in FIG. 55. Other versions of chapter arrays are shown in FIGS. 56 and 57. These will be discussed in more detail below.

A preferred application of an array 634 is in a cartridge similar to the type used in video games. A cartridge 636 is shown in a cutaway side elevation view in FIG. 58 installed in a game player unit 638. Cartridge 636 is comprised of a case 640 with a top, a bottom, sides and a front. The back of the cartridge is equipped with a door (not shown) similar to those commonly found on VCR cassettes. Array 634 is suspended in the interior of cartridge 636 by elastic suspension members 642 depending from the front and side walls of the cartridge. Abutments 642 are molded as part of case 640 and depend downward from the top of the case.

The game player unit 638, in addition to video display drivers and other conventional elements, includes a player sensor array 644 of field lenses 646 and sensor arrays. The player sensor array is cantilevered in the interior of player unit 638 so it can fit into the interior of cartridge 636 underneath the chapter array 634. The player unit also includes a light source array 650 with full chapter light sources. The light source array is flexibly cantilevered in the interior of player unit in a position above an installed chapter array. Attached to the top of light source array 650 by living hinges 652 are pressure bars 654. The pressure bars are cooperatively connected by a pushrod 656. FIG. 59 shows the pressure bars 654 from the rear of the cartridge in a fully deployed position. Depending downwards from light source array 650 are a plurality of registration pins 658, which mate with registration holes 662, and also depending downwards are a plurality of registration springs 660 which contact angled chapter edges 672.

Figure 58:
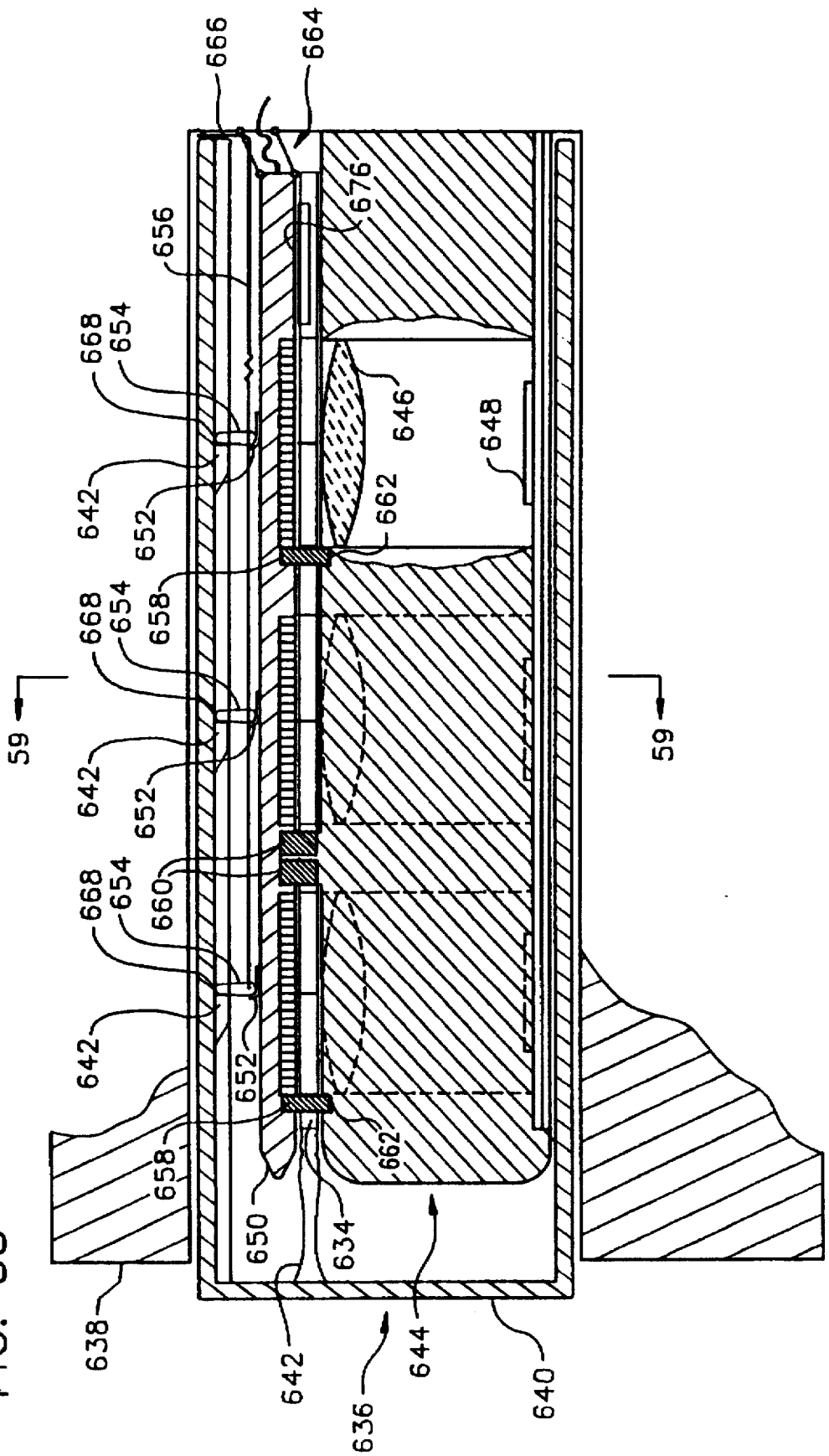
FIG. 58 is a side elevation sectional view of an array of optical data chapters embodied in a game cartridge inserted into a game player unit.

FIG. 58 shows cartridge 636 fully inserted in a game player unit. Prior to insertion of a cartridge in a player unit, the light source array 650 is biased upwards by biasing means 664, such as springs. During insertion, the leading edge of the case top contacts flange 666 of pushrod 656. As the pushrod is forced rearwards, the pressure bars begin to raise up and lobes 668 make contact with abutments 642. Further insertion causes the pressure bars to rotate further about living hinges 652 into a vertical position thus forcing light source array 650 downwards in such a manner to sandwich chapter array 634 between it and player sensor array 644. Coincident with the downward motion of the light source array is the passage of registration pins 658 by registration notches 670 (shown in FIGS. 55, 56 and 57) in the chapter array into registration holes 662 and the contact of registration springs 660 with angled chapter edge 672.

Refer now to FIG. 55. Registration of array 634 is accomplished as follows. Individual chapters 604 are flexibly interconnected at their edges to other chapters by elastomeric means 674. The flexible interconnection allows for small relative movement between chapters to provide the proper registration between each chapter and associated light sources, lenses and sensor arrays. Refer now to chapter "A" in the lower left hand corner and the associated registration spring "B" and registration pins "C" and "D". During insertion of a cartridge into a game playing unit, a portion of registration spring B exerts a normal force "N" against angled chapter edge 672. The orthogonal components of normal force "N" in the "x" and "y" directions urge chapter "A" against registration pin "D" which establishes the orthogonal registration of chapter "A". Similarly, the component of normal force "N" directed in the "y"0 direction urges chapter "A" against registration pin "C" which prevents angular displacement of chapter "A" in the planar area it occupies.

Each chapter 604 in array 634 is registered in the same manner as just described. A single registration spring 660 may provide normal forces to multiple chapters depending on where it is located in the array. The normal forces generated by registration springs are sufficient to overcome the tendency for the elastomeric means to restore each chapter to its pre-insertion position relative to one another. FIGS. 56 and 57 are alternative embodiments of array 634 showing alternative chapter geometry, registration spring configuration and placement of the registration springs and pins. The registration springs may also be formed of a resilient non-permanently deforming material, such as silicon rubber, that will generate sufficient normal forces to provide adequate registration when brought into contact with an angled chapter edge.

Referring back to FIG. 58, an alternative embodiment of the cartridge includes a semiconductor chip 676 on array 634. Such a chip can provide control over the function and capabilities of separate portions of the chapter array, e.g., read only, write and read or erasing functions, as well as providing processing, processing parameters, authorization codes, electronic serial numbers, ID codes or the like.

Another preferred embodiment provides for adjusting position of the sensor arrays 648 by incorporating registration adjuster means 600 (discussed above). This embodiment allows for greater latitude in the tolerances of interacting registration parts such as chapter dimensions and registration pin placement and size.

Alternative Record/Writing Embodiments

Yet another apparatus and method is described in connection with FIGS. 60A through 60C for directing the recording light data page to a selected page on the data layer. This scheme uses an ultrasonic lens module in place of the mechanical movers 259 for the microfield lens array shown in FIG. 18 while still providing recording light intensity of that system. Also, while the LCD shutters are retained in the preferred form of this embodiment, certain applications may omit the shutters and rely solely on the selective light guidance of the ultrasonic lens.

Thus, with reference to FIG. 60A, a write/read or write only memory 712 is shown having a generally cubical shape similar to memory 212 in the above described write/read system of FIG. 18, but here replacing the movers 259 of that embodiment with a dynamic ultrasonic lens module 715 best shown in the front elevation view of FIG. 60B. Between ultrasonic lens module 715 and a data page composer consisting of recording light sources 251' is an array of fixed field lenses 718 which are similar to the microfield lens array 257 of the embodiment of FIG. 18, but in the embodiment of FIG. 60A, these field lenses remain stationary, relying on the ultrasonic lens module 715 to selectively guide the recording light from the recording bit sources 251' toward the selected page on data layer 19'. In some applications the ultrasonic lens may provide all of the needed light directing function in which case the fixed field lenses 718 can be omitted.

In accordance with the theory of ultrasonic optics, as known per es, longitudinal (i.e., compressional) ultrasonic pulse is injected into an edge of a glass plate 720 causing the density of the glass to be dynamically increased at the compressed area, hence causing the index of refraction to be increased. At the rarefactions, the density is decreased and there the index of refraction also decreases. By shaping the launched ultrasonic pulse properly, the compression forms a positive lens. And if the rarefactions are used, the lens is negative. Of course, the lens is transitory in time/position, i.e., dynamic, so the ultrasonic waves must be synchronized with the desired motion of the lens through the glass. A continuous ultrasonic sine wave is introduced along two axes X,Y of glass plate 720 by edge transducers 730 and 732 (see FIG. 60B). The glass plate is placed adjacent the array of laser diodes used as page composer of recording sources 251'. An array of fixed field lenses is positioned between the light sources 251' and the glass plate 720. The sine waves are not standing waves, they are absorbed at the opposite edge by ultrasonic absorbers 734 and 736 (FIG. 60B). At any instant, there will be many points on the glass plate where compressions intersect. At these points, the two waves define an approximation of a positive spherical lens.

The ultrasonic frequency applied to transducers 730, 732 is chosen so that the wavelength of the compressions in the glass corresponds in an integral way to the pitch of the sources, and when the compressions are in the correct location, the recording light sources are pulsed. Note that there is a negative lens between each positive lens. With the recording light wavelength equal to the pitch, each ultrasonically created lens diameter will be ½ the pitch. Since the source beam diameter from recording sources 251' will be larger than ½ the pitch at the glass plate, the ultrasonic wavelength preferably twice as large (or an integral multiple larger). When twice as large, there will be negative lenses over adjacent sources, so that it is necessary to pulse the sources 251' alternately to coincide with the positive lens in the glass plate 720.

The direction of the beam after the lens depends on the location of the center of the lens relative to the center of the source. By timing the source light pulse a little early or late (or by shifting the phase of the ultrasound), the beam direction is adjusted to direct the source light bit to the position of the chosen page.

Furthermore, this is a 2 dimensional system, so that a change in the source timing causes the beam to move on a diagonal across the data card. In order to sweep the beam in 2 dimensions to control the recording bit placement, it is necessary to change one phase plus the timing, or change both phases with a constant source timing. In this embodiment we change the phase to one transducer 732 and vary the timing of the recording light strobe as shown in FIG. 60C.

The objective of the system is to direct the light from each source into the desired page microlens. Therefore each source beams met be at a different angle. To do this, the wavelength would be adjusted slightly less than the source The wavelength in the glass is a function of the temperature of the glass. Therefore the direction of the beams will depend not only on the phases and timing, which are easily controlled, but also on the temperature. There are a number of ways to control this temperature variable including the disclosed feedback 756 described below. Alternatively, the temperature of the glass can be controlled with an oven or other thermal regulated module of known design for electronic components. The temperature can be measured, and the phases adjusted according to an analytical or empirical dependence. The LED read light sources can be used as light detectors. In the latter case the light intensity through the data mask is compared to a reference and to the intensity through the nearest neighbor data pages. The phase and frequency of the two ultrasonic drive circuits are then adjusted by feedback to maximize the intensity at the desired data page.

As an example, the source pitch is given to be 30 microns, and a glass with a velocity of 4000 m/s is used, and a wavelength of 60 microns is desired. Then the frequency of the sinusoid driving the ultrasonic transducers is about 66.6 Mhz, with a period of shout 15 nanoseconds. The maximum full range of timing or phase adjustment will be half of that, 7.5 nsec, corresponding to the time width of a lens. The strength of the lens which is set by the intensity of the ultrasonic wave is then adjusted to give a maximum optical power.

Figure 60C:
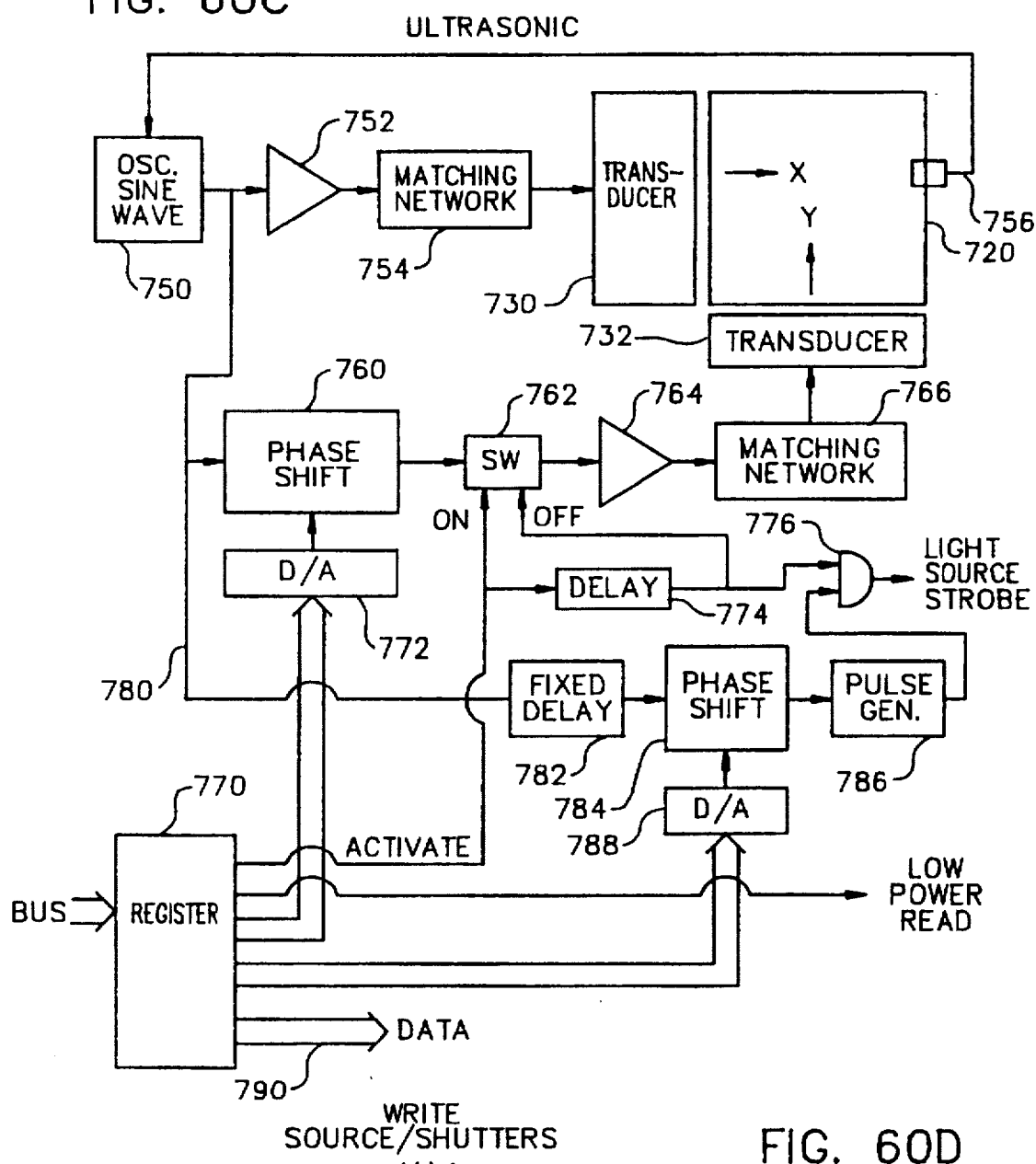
Figure 60D:
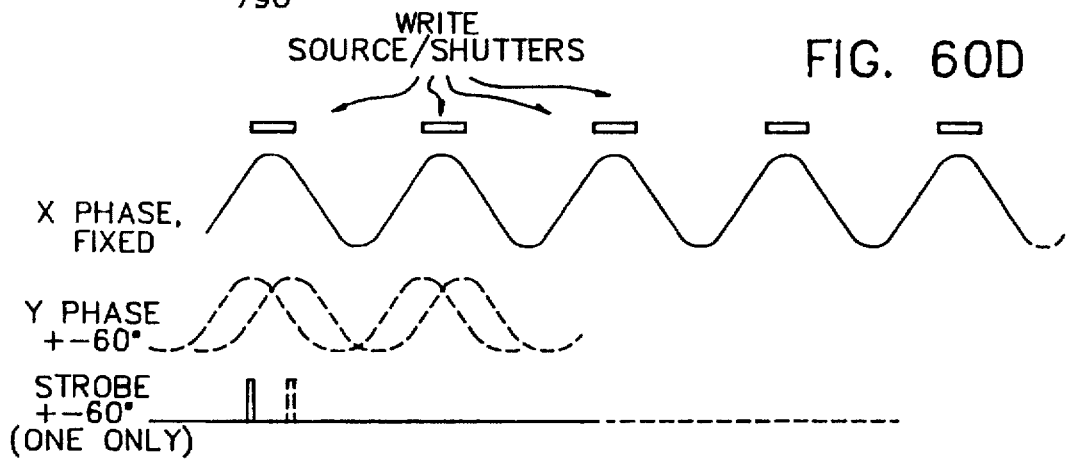

The control end ultrasonic drive electronics is shown in FIG. 60C and includes an oscillator source 750 generating the primary sine wave which is then passed through an amplifier 752 to drive the X-axis transducer 730 through a matching network 754. Feedback 756 responds to an acoustical sensor (transducer) on the glass opposite transducer 730 and controls the fundamental frequency of oscillator 750 to establish the desired wavelength in the glass; i.e., it requires a specified phase at the edge of the glass. Tapped from oscillator source sine wave source 750, the same fundamental frequency is fed through a phase shifter 760 and an initialization on/off switch 762, amplifier 764 to drive the Y-axis transducer 732 via a matching network 766 as shown. Switch 762 is normally off so that feedback 756 calibrates or initializes the circuit in response to X axis waves only. This switch is turned on when activated by data in register 770 and turned off after a delay 774 that allows the ultrasonic waves to fill the glass plate. As described below, this delayed activate signal causes gate 776 to be enabled for strobing by a delay phase shifted oscillator pulse. Phase shift 760 is one of the primary circuits for determining the lens position so as to direct the recording light bit to the desired page and this is achieved through an addressing scheme including a page address fed to a register 770 that includes address bits that operate through a digital-to-analog converter 772 to provide the predetermined page directing lens timing by supplying the desired phase shift to phase shifter 760 in accordance with the address. Similarly, the address in register 770 activates the "on" switch 762 and provides a delayed enable logic level to a light source strobe gate 776. Also the delay 774 turns off the switch 762 after the data has been recorded to allow reinitialization. The timing pulse to gate 776 is taken from the main sine wave oscillator 750 through a fixed delay (see ±60° phase shift in the wave forms of FIG. 60D relative to the master oscillator wave driving the X-axis transducer). Thus, the tapped master sine wave form is fed over line 780 through another fixed delay 782, then through a controlled time phase shift 784 which triggers a pulse generator 786 that provides the strobing or output pulse to gate 776 that in turn strobes the light source associated with that lens address. The timing of phase shift 784 is controlled through a digital-to-analog converter 788 that is addressed by register 770 in manner similar to the addressing of digital-to,analog converter 772 controlling phase shifter 760. The data on bus 790 is fed to the page composer light sources for enabling those particular light source bits that are to be recorded to be illuminated on the page composer. The output from register 770 called lower power read, selects low power for the lad feedback function, and/or for reading the data (rather than the normal writing mode) when a reflection surface is provided behind the data as described above in an alternative embodiment, thereby obviating the need for the usual lad read light sources.

Multiplexing The Light Sources

In the embodiments of the optical memory shown in FIGS. 1–24, each page of data has a corresponding LED light source (or group of sources jointly driven) for reading the data in that page.

FIGS. 61A, 61B and 62–64 illustrate alternative embodiments to conserve on the number of light sources for lower cost applications without sacrificing the number of accessible pages.

This is achieved in one aspect of the invention by multiplexing the light sources in conjunction with read LCD shutters or other light valving or direction function. The general scheme is to make one light source serve selectably several data pages.

Figure 61A:
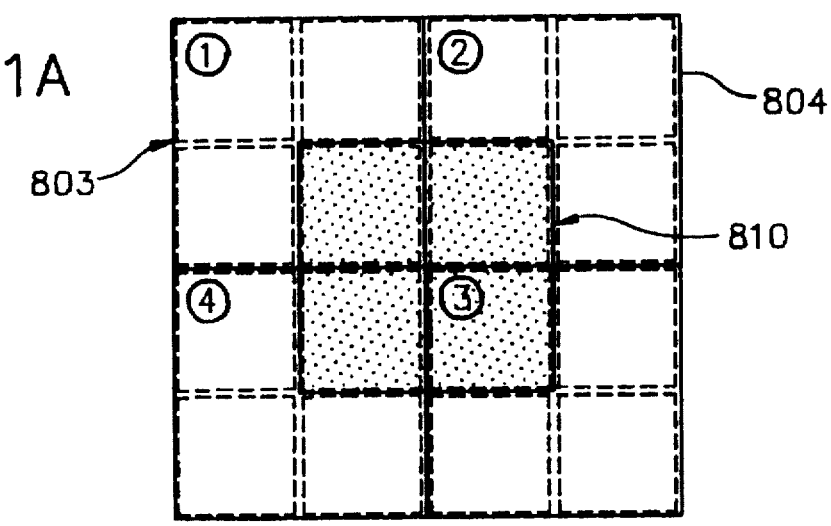
FIGS. 61A and 61B are, respectively, a diagrammatic view of an alternative embodiment for selecting data pages to be illuminated and imaged on the sensor array by selective coordinated operation of multiple page light sources and multiple page LCD shutter module shown in the enlarged, fragmentary isometric view of FIG. 61B.
Figure 61B:
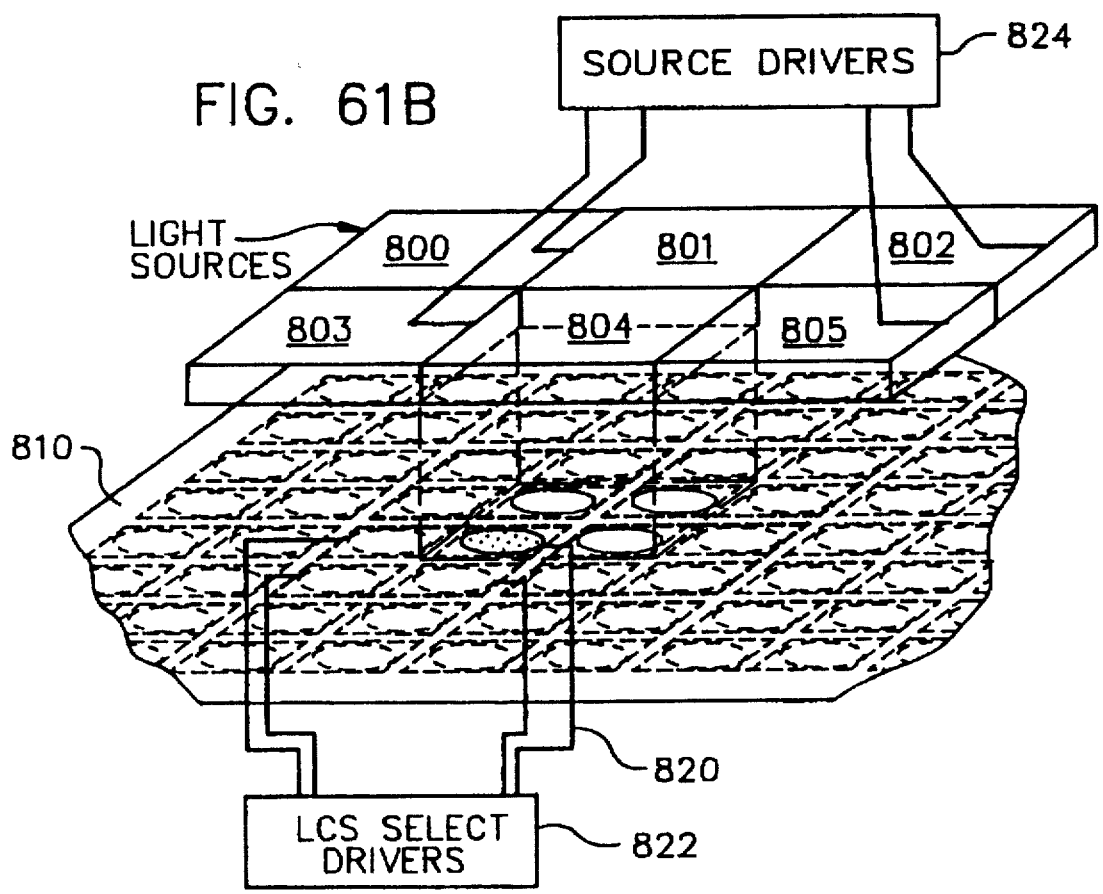

In the embodiment of FIGS. 61A and 61B, each light source (e.g., sources 800–805) is arranged to illuminate a 2×2 array of 4 pages as best Shown by source 804 illuminating one of the array of 4 pages in FIG. 61A. A matrix of liquid crystal shutters (LCS) 810 is located close to the plane of the data pages. The LCS could be on either side of the page plane, but in this embodiment it is on the side next to the sources 800–805. Each element of the LCS array is the same size as the source illuminated 2×2 page array, but offset one page in both X and Y. That is, each square LCS element can control the light though only one page of the four that are illuminated by a particular source as indicated by LCS control lead 820 from drivers 822. When source 804 is turned on by the drivers 824, the LCS opened by control lead 820 selects one of 4 pages for reading on the common sensor.

This arrangement would reduce the number of sources by a factor of 4, and if every other LCS element is on (in both X and Y) then for a particular setting of the LCS, one quarter of the total data can be accessed, one page at a time, by sequencing the sources only. The other three quarters of data pages can be accessed by the same sources, but after the LCS "checkerboard" has been shifted one element in X or Y or both.

As an example, where there are 50×50 pages in a chapter, there would need to be 2500 sources on a page/source basis. In this embodiment, only 625 sources are required.

Figure 62:
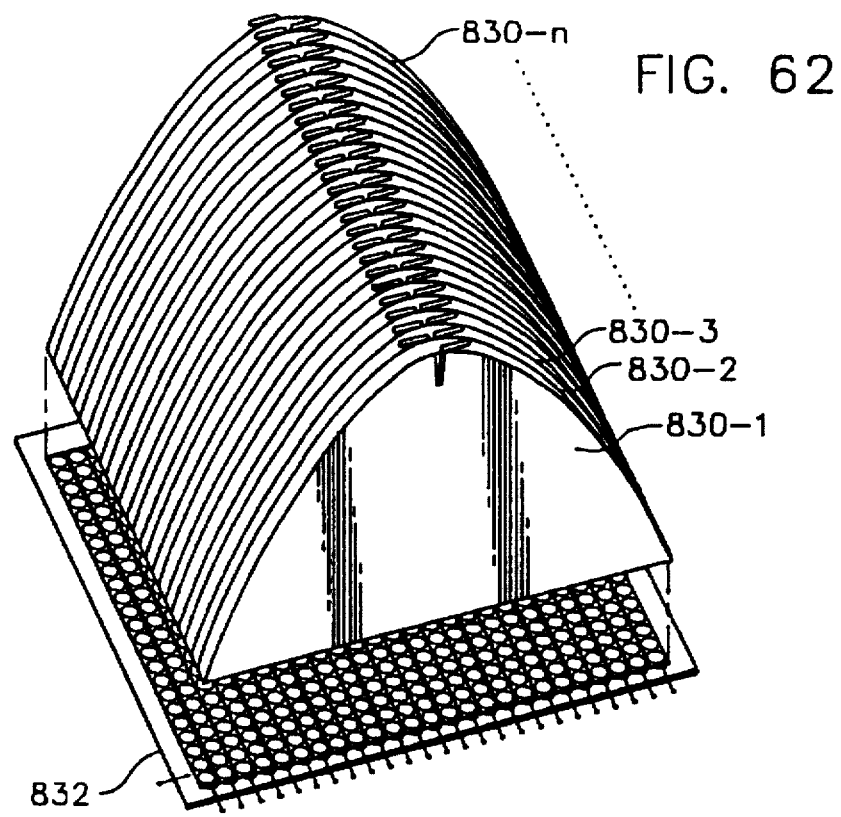
FIG. 62 is an alternative embodiment combining elliptical LED light guides for illuminating multiple, but LCD shuttered pages in order to conserve on the number of multiple LED sources while still obtaining the selectivity of one page at a time for imaging on the sensor array.

In the embodiment of FIG. 62 each light source such as an LED is connected to a light pipe or light guide 830. Each guide here is a flat wafer, roughly one half of an ellipsoid in shape, with the source at the focal point and the truncated ellipsoid face congruent with a column of data pages. The outside surfaces are aluminized (reflective) so as to distribute all light to the truncated face in an efficient manner. The thickness of each guide 830-1---n is equal to one page, and the light filled face of the ellipsoid would be as long as a column of pages of a chapter. Between the truncated face of the guide and the pages is a set of LCS 832, where each LCS element is 1 page wide and as long as a full row of pages. Only one element would be on at a time. In the example of a 50×50 page array, 50 sources and 50 LCS elements would be needed. Fifty pages could be accessed with one setting of the LCS array.

Figure 63:
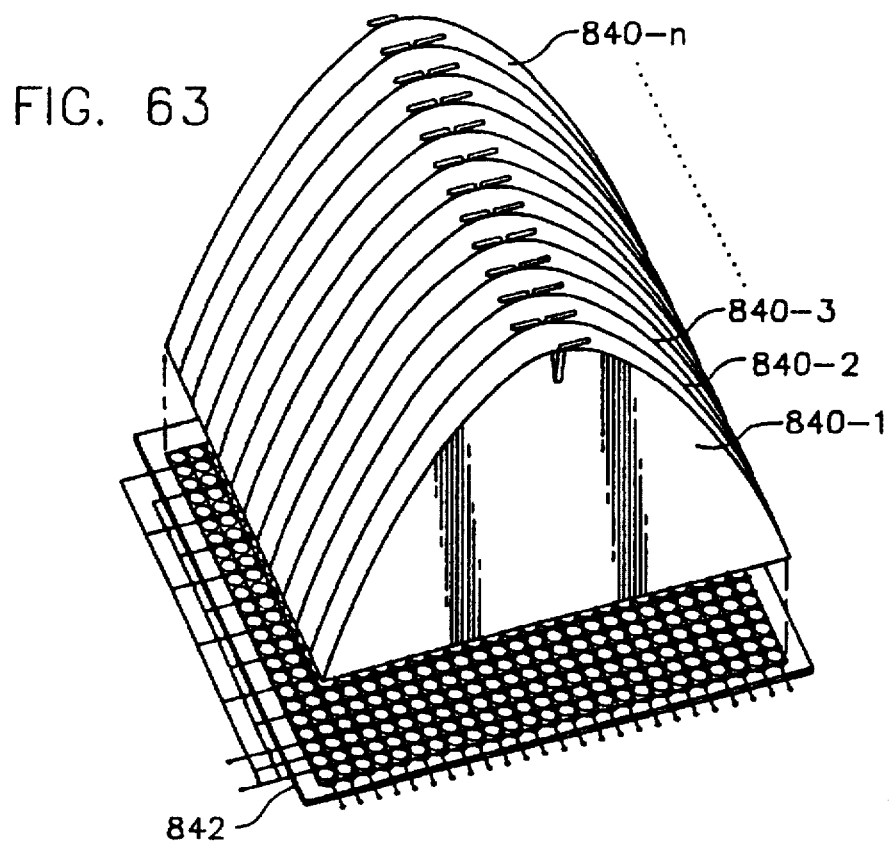
FIG. 63 is an isometric view similar to FIG. 62, showing an alternative form of the LED light guide and shuttered page assembly of the type shown in FIG. 62.

In the embodiment of FIG. 63 guides 840-1, 840-2, through 840-n are 2 pages wide and each element of the LCS array 842 is one page wide and 2 pages long (in the case of a 2-page wide guide), and made to overlap the guides one page. The LCS elements are wired alternately along all columns, so that either the even or odd ones are on. This will select rows two at a time. The particular row is selected by the LED source. Columns are selected separately, so only one column has any open shutters at a time. In the case of, say, 50×50 pages in a chapter, there would be 25 light sources, and 25 guides. With one setting of the LCS, the system could access 25 pages by source sequencing.

Figure 64:
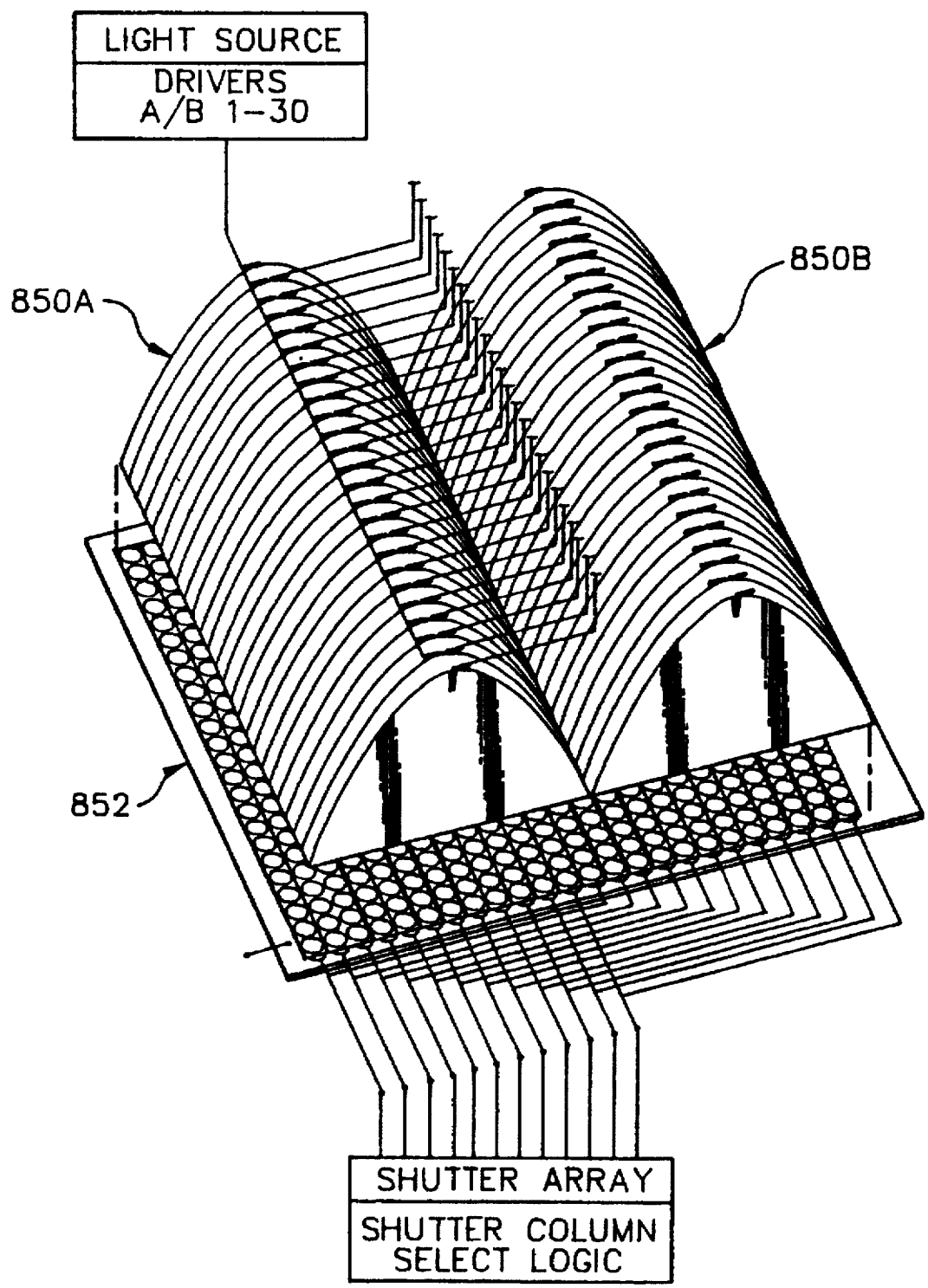
FIG. 64 is still another isometric view similar to FIGS. 62 and 63 showing still a further alternative embodiment in which the light guides for each LED illuminate one half of a row of arrayed pages and an LCD shutter assembly responds to a command for opening two columns of pages, one column in registration with only one of the sets of LED light guides.

Alternatively, in FIG. 64, the guides 850A and 850B are ½ (but could be ⅓, ¼, etc.) of the chapter dimension, with a corresponding inverse increase in the number of sources. The advantage is 2×, (or 3×, 4×, etc.), increase in the number of pages that can be accessed with one LCS 852 setting- There would be only one LCS element on (open) in each group of guides.

As an alternative to the above light guides, they can be replaced by holographic beam distributor elements, known per es. Such an element is essentially a set of gratings, set at various azimuth angles and periods. A (narrowband) light beam (source) directed into the element is split into as many subbeams as there are gratings, and each subbeam is directed to a specific location. The application here is to apply a matrix of LCS elements near the data pages as before. However, the pattern of the elements can be somewhat arbitrary due to the beam output of the holographic distributor, and hence selected to simplify manufacturing. For example, the pattern can be 5×5. In this case, for a chapter as above, each element would cover 2500/25=100 pages. Now there would be 25 gratings on each read light source, so each source would direct light to one specific page in each LCS element area. But only one element would be on at a tame, so a particular source would only illuminate one specific page. By sequencing the sources, 25 pages can then be read without changing the LCS. In this case, 100 sources would be required.

In the above multiple guide examples, and the holographic example, a diffractive element near each page is a desirable feature in order to further direct the beam in the proper page direction.

Submultiplexing Of Data Pages

Figure 65A:
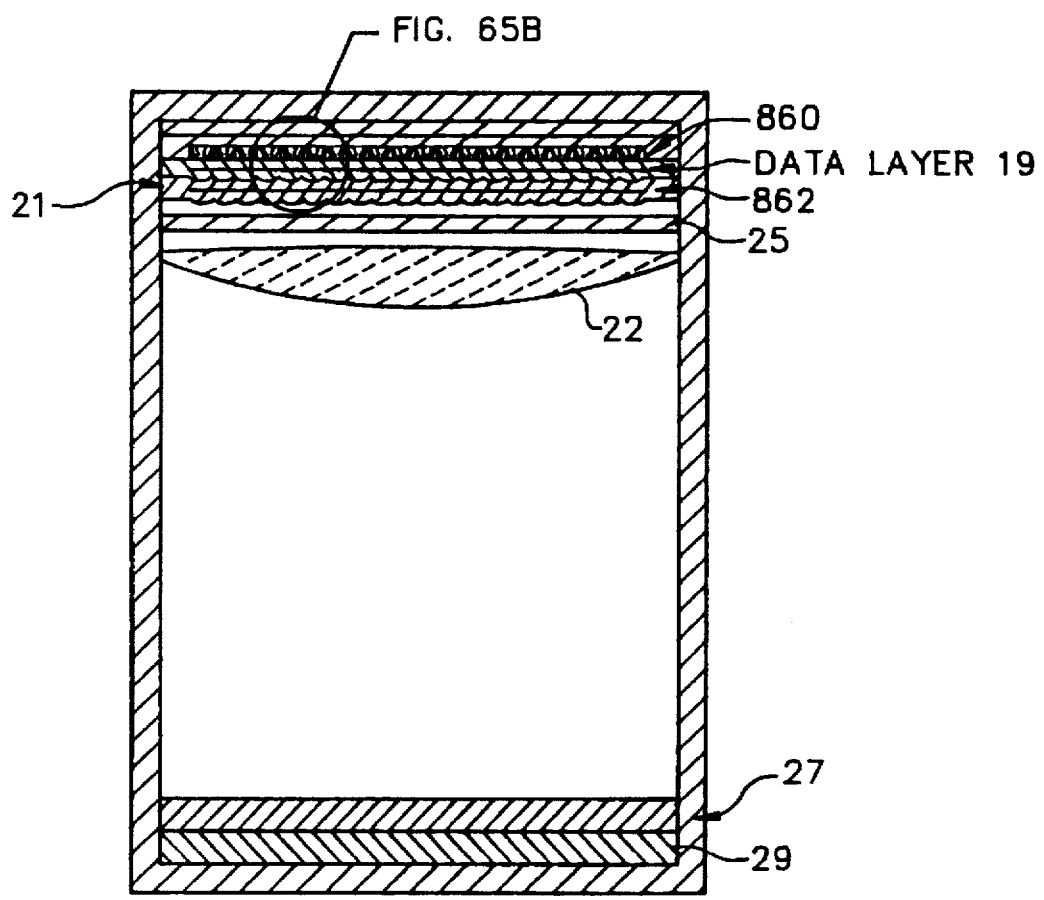
FIGS. 65A and 65B show, respectively, a vertical cross-section of an alternative embodiment and an enlarged fragment thereof for submultiplexing each data page by using angled light sources and HOEs (holograpic angle filters) so that only a portion, in this instance one quadrant of a full data page, is selectively imaged on the sensor array.
Figure 65B:
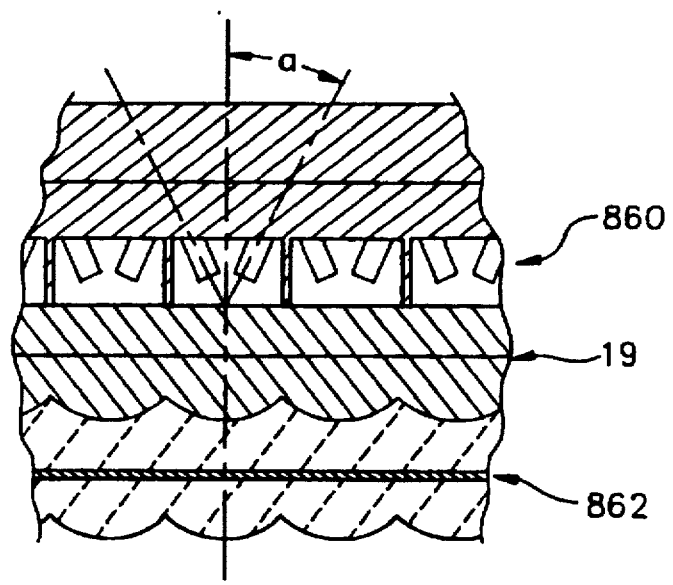
Figure 65C:
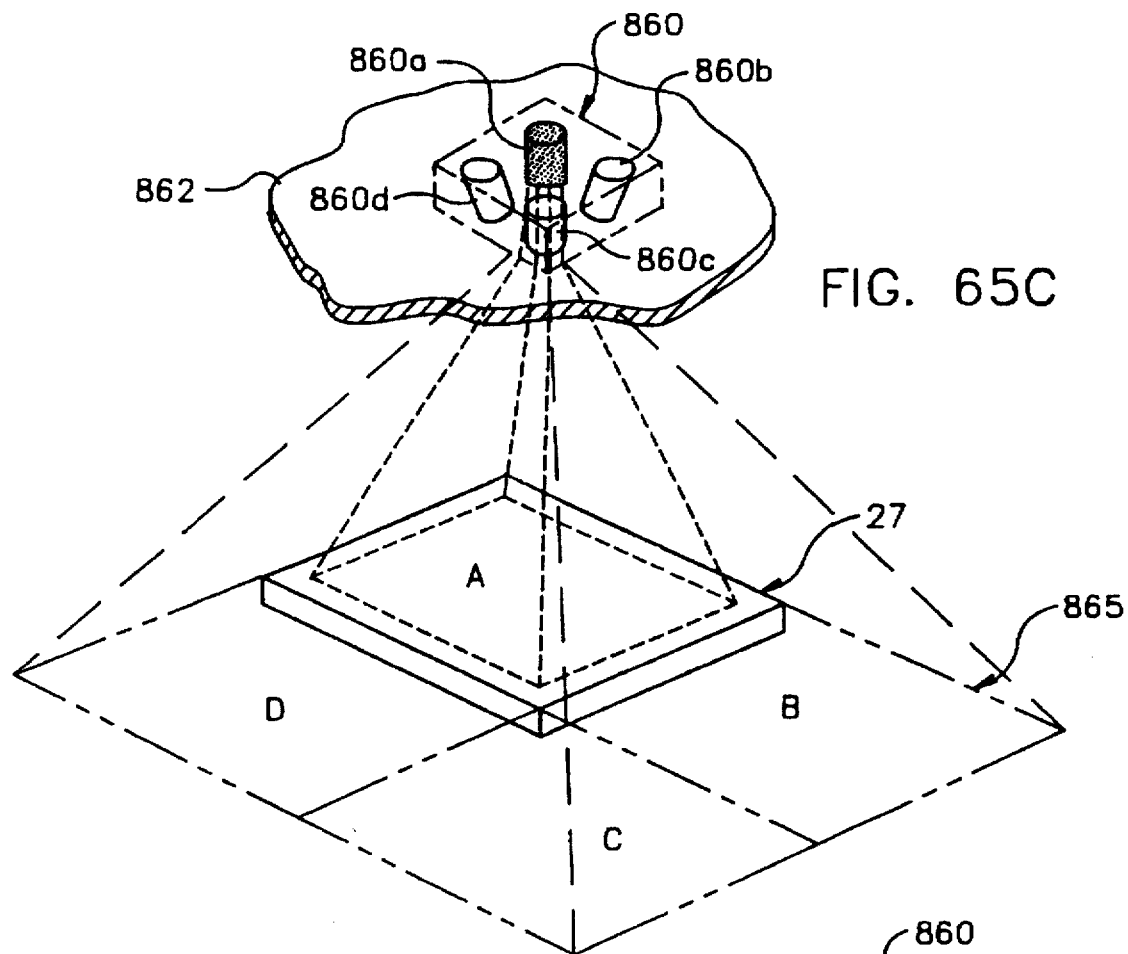
FIGS. 65C and 65D diagrammatically illustrate how the angled light sources in conjunction with an HOE filter illuminate selected quadrants of the full data page onto the sensor array.
Figure 65D:
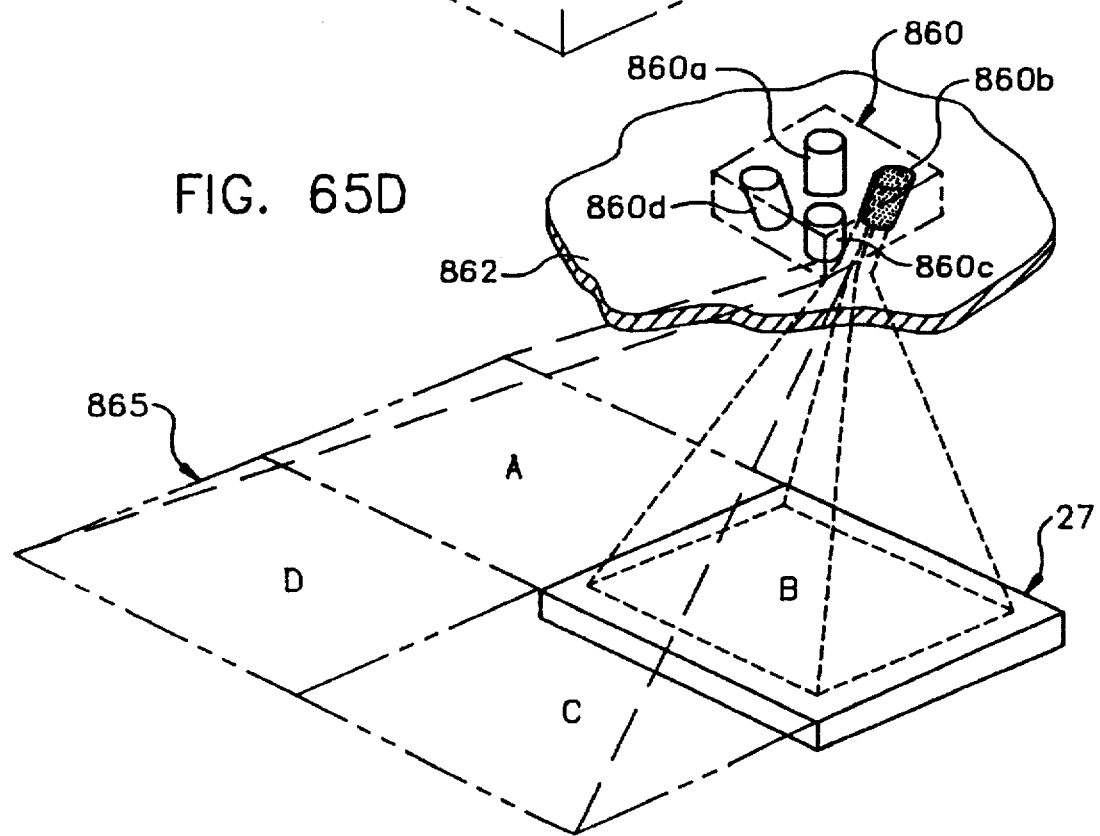

With reference to FIGS. 65A–65D and 66A–66C, a read optical memory embodiment is provided similar to the above described read memory in FIG. 3A, in which the multiple read light sources are modified so as to selectively illuminate and hence read portions of full data pages onto the underlying sensor array. Thus in the embodiment shown in FIGS. 65A and 65B, read light sources 860 are disposed at selected angles of emission in groups of four as best shown in FIGS. 65A and 65D, and combined with an array of holographic gratings, HOEs (holographic optical element), 862, that respond to the angle of light sources 860 to cause one of four selective quadrants of the data page to be imaged on the underlying sensor array 27. The BOB array 862 array 862 can be located just before or just after the first surface of the lens system, and in this case is located between the first and second refractive surfaces of lens array 21 as illustrated. The individual light sources 860a, 860b, 860c and 860d are, in this embodiment, arrayed in a group of four, each group of four corresponding to a single page of the data layer 19 and have an angle of emission canted inwardly toward a central axis as best shown in FIG. 65C and 65D. This angle A as shown in FIG. 65B of each of the sources 860 relative to a central optical axis through the page lens system coax with HOE 862 to shift the imaging rays that are formed by data layer 19 at each page so that portions of the data page are selectively shifted on the sensor array 27 as best illustrated in FIG. 65C and 65D. Thus, in FIG. 65C, one of four angled sources 860a, which may be provided by lads, is turned on. Imaging light from source 860a in fact picks up data rays for the entire associated data page. However, only quadrant A of the data page is imaged on sensor array 27, the raining data page quadrants B, C and D, although partially illuminated by source 860a, are shifted outside the sensing area of array 27. Thus, a quarter of the data page is read on sensor array 27, lessening the size requirements of array 27 to only one fourth of the number of sensor bits as contained in the entire four quadrants of the data page 865. In FIG. 65D, for comparison, another one of the four sources 860b is turned on causing the same data page 865 to be illuminated; however, by the coaction of the angle of source 860b and the array of 862, quadrant B of page 865 is now imaged on sensor array 27 and read in accordance with the processes described above in connection with the main embodiments. No increase in overall density of the memory is achieved, but for certain applications, there is an important reduction in the overall size of the sensor array 27 while maintaining the same size and density of the recorded pages in data layer 19.

In FIG. 66A, an alternative embodiment is shown similar to the optical memory of FIG. 65A, but here the group of four light sources 870a, b, c, and d, are differently colored light sources or sources of the same broad wavelength augmented by different color filters and combined with a color selective HOE 872 sandwiched between first and second diffractive lens elements 877 and 879. Light sources 870a, b, c, and d, can, for example, be provided by a yellow, green, red and near infra-red LRD device available from manufacturers such as Hewlitt Packard Corporation of Palo Alto, Calif.. The HOE diffractive elements in array 872 shift the light rays that carry the data images as a function of source wavelength to achieve the selective reading of different quadrants of the full data page 875 onto sensor array 27 as best shown in FIGS. 66B and 66C. In FIG. 66B, color source 870d acts through HOE array 872 to image quadrant D of data page 875 onto sensor array 277 while in FIG. 66C, source 870c images quantrant C onto array 27 with the remaining quadrants of data page 875 being shifted off of array 27 as illustrated.

Holograhic Beam Splitter For Multiple Read Modules Sharing Common Sensor

Figure 67A:
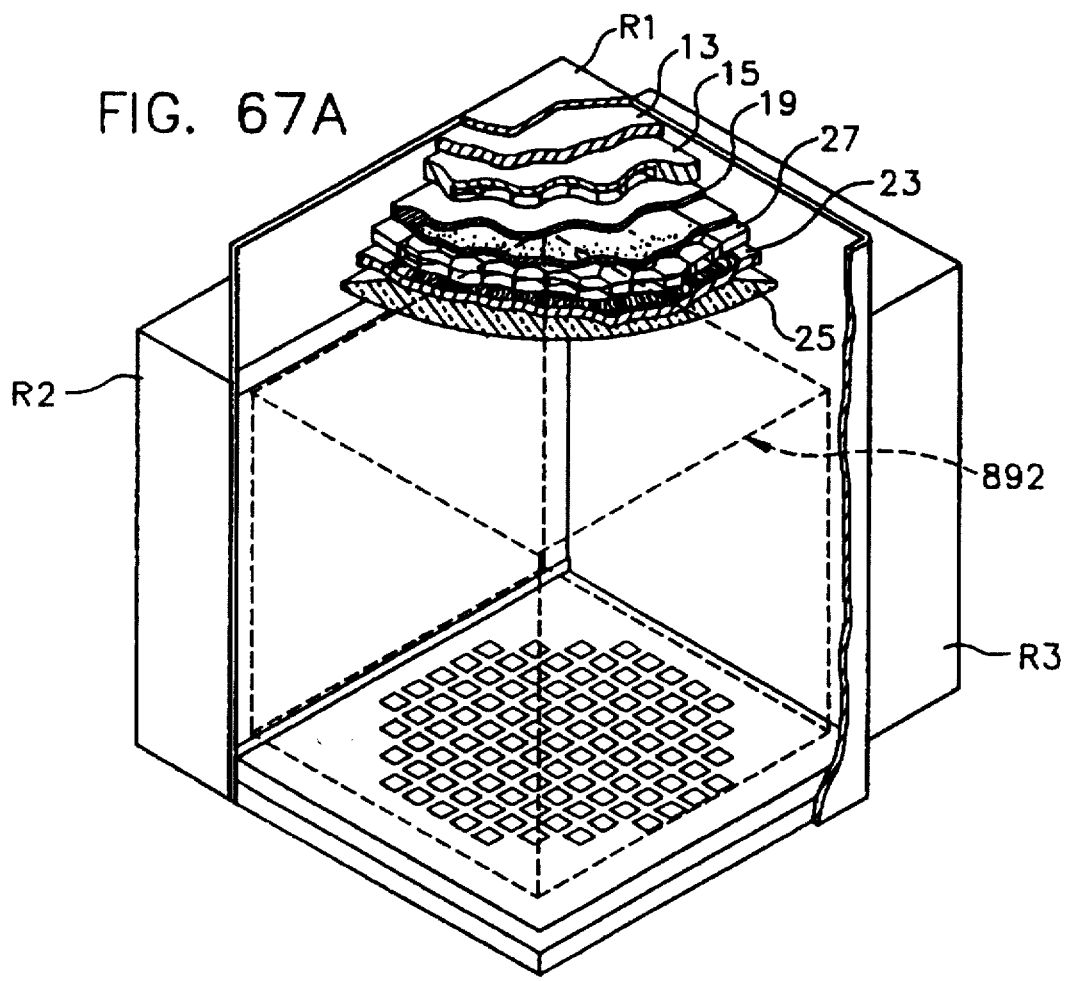
FIGS. 67A and 67B are, respectively, an isometric cut-away and an isometric diagram of a holographic beam splitter used in a read only embodiment in which multiple data chapters forming separate read modules are selectively arranged on the sides and top of the cubical assembly to image data from selected pages, one page from any one of the given read modules onto a common read sensor array.
Figure 67B:
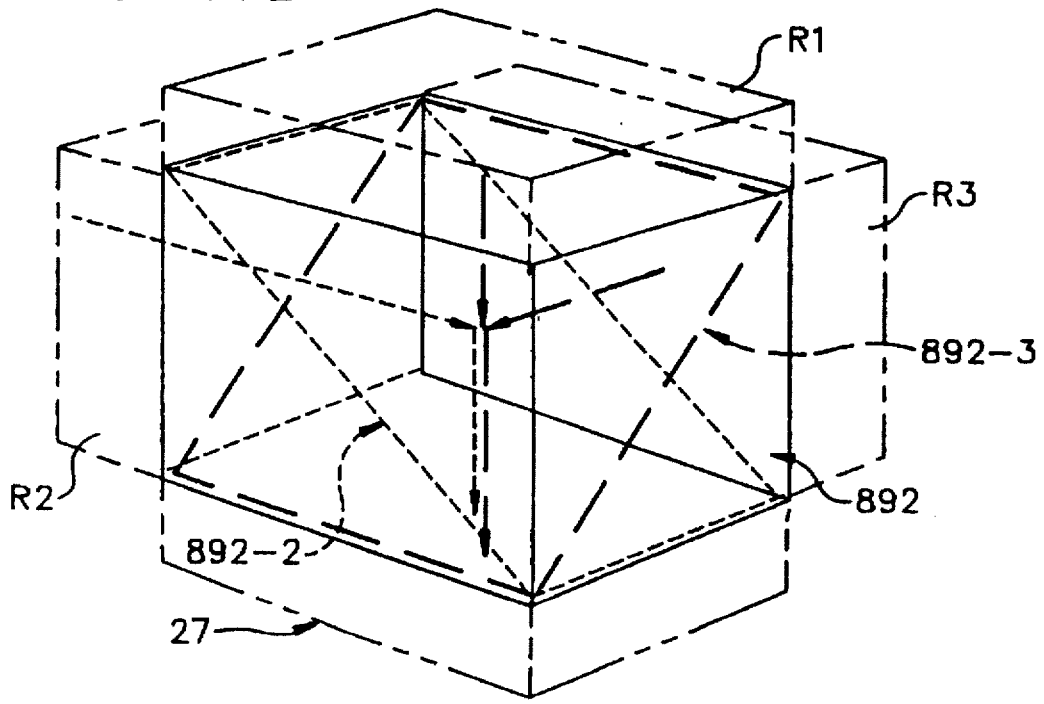

In the embodiment shown in FIG. 67A and 67B, a multiple read module memory 890 is provided, formed about the essentially cube-like configuration of the above read memory shown in FIG. 3A and described above, but here having a plurality of separate, fully implemented read modules, R1, R2 and R3, arranged about the top and, in this case, two sides of the central image expansion region now occupied by a multiple-way holographic beam splitter 892. Beam splitter 892 is essentially of regular polygon configuration, here a cube, in which data read from any one of multiple separate read modules R1, R2 and R3 is directed onto common sensor array 27. Each of module R1, R2 and R3 is of like construction shown by the cutaway of R1, including light source drivers 13, light sources 15, data layer 19, lens array 21, diffractive corrector 23, and field lens 25.

Holographic beam splitter 892 has a compound or multiple-way beam splitting function illustrated by splitting planes 892-2 and 892-3 for the side read modules R2 and R3 (the image from read module R1 passing through beam splitter 892 to sensor array 27). The read images for R2 and R3 are turned 90° as illustrated onto sensor array 27, thus enabling the same sensor array 27 to read data from any selected illuminated page from any one of the multiple read modules R1, R2 and R3 without requiring a separate sensor module.

In constructing the multiple-way holographic splitter 892, photopolymer materials are used to form separate segments of the beam splitter defined by the splitting planes 892-2 and 892-3 and after such segments are formed using holographic exposure techniques, known per se, the individual pieces of cubical splitter 892 are adhesively reassembled. To expose the materials for forming the splitting planes, each plane is illuminated by a combined reference beam and image beam using coherent wavelength sources and each surface is formed with an operating hologram that causes read data images from each of the read modules R1, R2 and R3 to be reconstructed on the sensor array 27.

Density Increase By Color

The data record can also be composed of 2 or more layers of subtractive color filter material forming composite layer 19. The data consists of transparent spots in each layer. The layers are usually presumed thin so that the focal planes for each color substantially coincide. Light sources of different colors are used to read and record. Each layer contains data, thus greatly increasing storage density.

In such an alternative embodiment, it is difficult to build a lens system that does not have any lateral chromatic aberration, i.e., the image magnification is a secondary function of the wavelength. A shift in magnification of as little as 0.1% could mean a mis-match of one bit between the data image and the sensor array.

The first part of the solution is to employ a method of recording through the lens (or an equivalent lens) as described above in connection with FIG. 1, so that the readback is automatically corrected for magnification. But when the lens system is made up of diffractive elements, the focal length will be inversely proportional to wavelength. with a multicolor system, the selected wavelengths might range from, say, 0.8 to 0.4 microns, a factor of 2. Such a shift in focal length would distort the image.

The second part of the solution is to make one or more of the diffractive elements that make up the lens system out of binary elements using the same dyes that are used in the data mask. That As, the diffractive elements would be of the absorptive type (such as a classical zone plate) where the absorptive parts are composed of a subtractive color dye. The point is that the element is only effective at the wavelength(s) that As absorbed by the dye. Therefore, several elements may be stacked together, one for each color that is to be used, and where each element As designed to correctly focus specific color. The disadvantage of this approach is that absorptive diffractive elements are not efficient, so stronger light sources or longer sensor integration times will be required. But this may be acceptable for applications that require higher density, and where speed is not as crucial.

Density Increase By Depth

Again, as before, this alternative embodiment provides multiple data layers separated by spaces that are substantially larger than the depth of focus of the lens system. Different layers of data are selected by shifting the focus. In previous art, this shifting of focus was mechanical, i.e., an objective lens (there was only one) is moved to focus in on the required layer. This movement can be augmented by color selection.

With the present array system, the problem is how to select the proper data layer. Mechanical devices and/or beam splitters have disadvantages for this application and are not preferred.

It is preferred to use colored sources for data layer selection. The optical system is constructed so that longitudinal chromatic aberration is not fully corrected. This means that the focal distance of the lens system will vary with wavelength. With appropriate design, the lens will focus each separated data plane on to a single sensor on the basis of color. This system is different from the multi-color record system, in that the data planes are monochrome, probably are inverse sense, i.e., the bits are opaque and the surrounds are transparent, and are spaced a few (3–6) microns apart.

Density Increase By Polarization

Two different sources are employed to illuminate the data, with polarizations at right angles. Two data planes are composed of polarizing material also set at right angles. The bits are holes in the material. This technique will provide for only two data planes.

Spaced Sensor Rows

Figure 68:
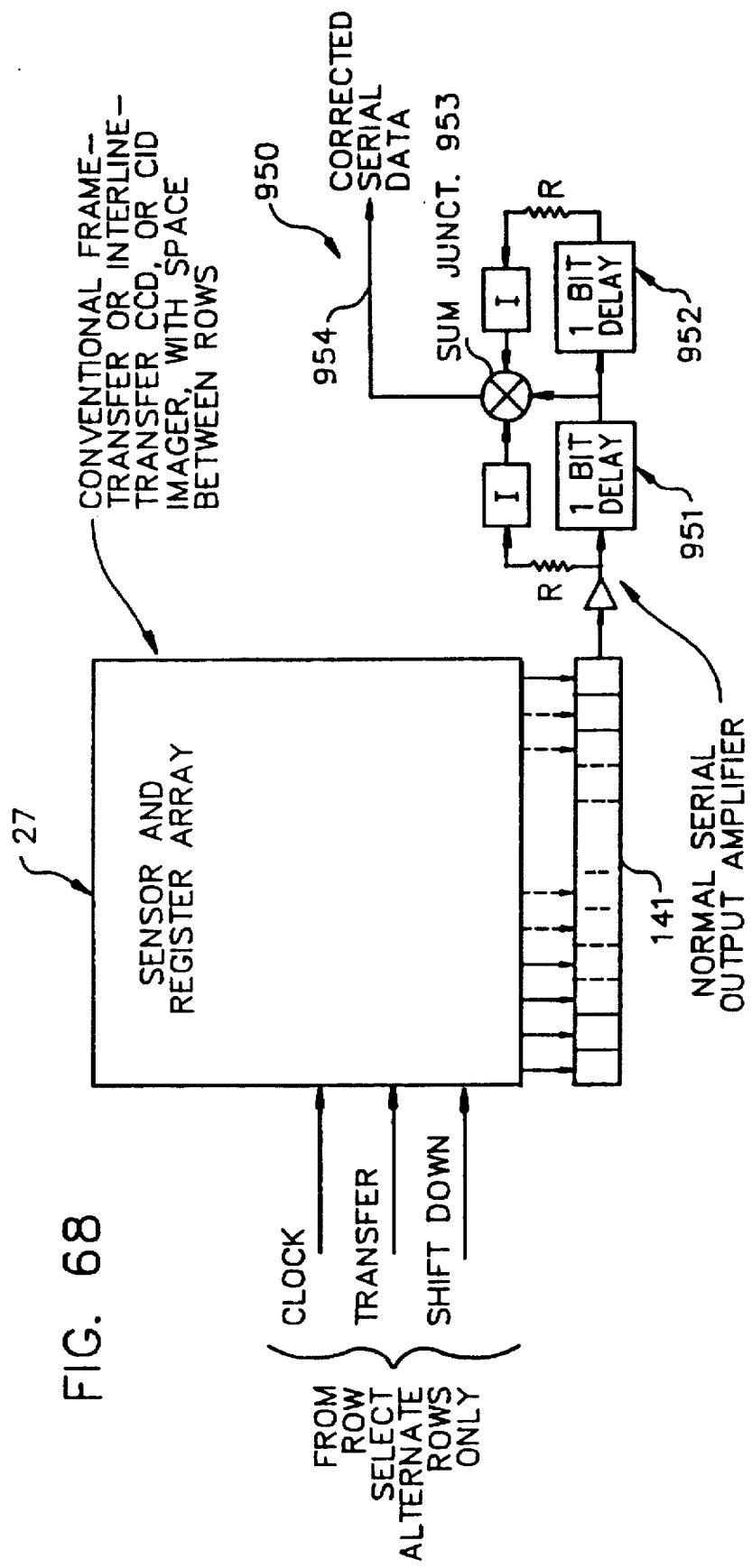
FIG. 68 is a block diagram of an alternative data output processing scheme for reading the binary data from the sensor array.

With reference to FIG. 68, an alternative embodiment of the sensor and register array 27 is illustrated for improved readout reliability by sacrificing image density. In particular, sensor and register array 27 is provided with spacing between rows of sensor elements to eliminate image overlap in one dimension and the output data is processed from the adjacent elements in common rows by simplified processing circuit 950 that subtracts out the overlap light from adjacent bits. By increasing the space in one dimension, in this sense it's between the rows of array 27, the processing circuit 950 operates on a serial data stream output from parallel-to-serial register 141 to correct for inter-symbol interference (ISI). In the illustrated embodiment, sensor and register array 27 uses the same array as described above in connection with FIG. 15A and data from the record is stored only in alternate rows, bypassing the intervening rows to create the desired inter-row space without requiring fabrication of a different sensor array. Alternatively, the sensor and register array shown in the embodiment of FIG. 68 may be specially made to provide a blank space between rows and that blank space may be somewhat less than a full sensor element spacing as exists in the present embodiment but with sufficient inter-row space to substantially eliminate image cross-talk between adjacent data rows. To resolve the data along each row and hence reduce image cross-talk, the data is serially stepped out of register 141 into processor circuit 950 which includes preceding and following subtraction circuits 951 and 952 each being made up of a one bit delay, an attenuating resistor R and an Invertor connected to a summing junction 953 as illustrated. Data imaged on sensor and register array is sequentially down shifted through the array into parallel-to-serial register 141 and then out shifted from register 141 into processing circuit 950 in which the preceding and trailing data bits are subtracted at summing junction 953 with the center or desired data bit existing at the Juncture of the one bit delays. Hence raw data signals on the preceding and trailing sensors are subtracted from the desired data bit correcting the serial data which is output on lead 954 and passed on to the downstream data processing. The attenuating resistors R are selected to cause subtraction of only a fraction of the preceding and following data bits to negate the overlap of the fringes of light images that overlap the sensors on array 27. As an example, subtracting a value of 10 percent of the full amplitude of the preceding and trailing data bits is suitable.

Color and/or Polarization Filtering of Overlapping Data Spots

Figure 69A:
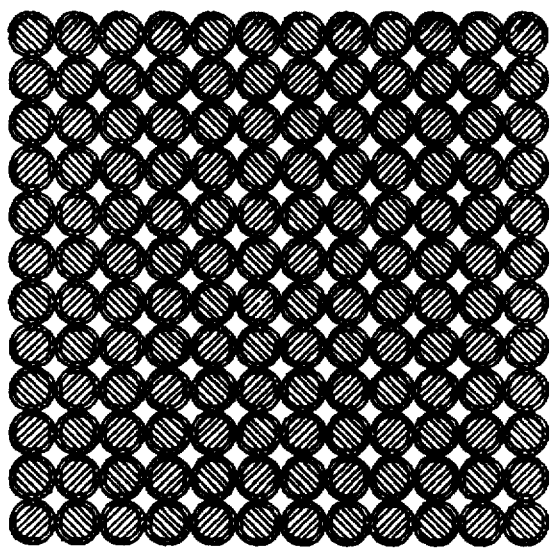
FIGS. 69A, 69B, and 69C show an alternative embodiment in which the photo sensitive elements forming sensor array 27 are overlaid by alternating color and/or polarization filters in order to increase the separation of sensor bits for improved readout reliability.
Figure 69B:
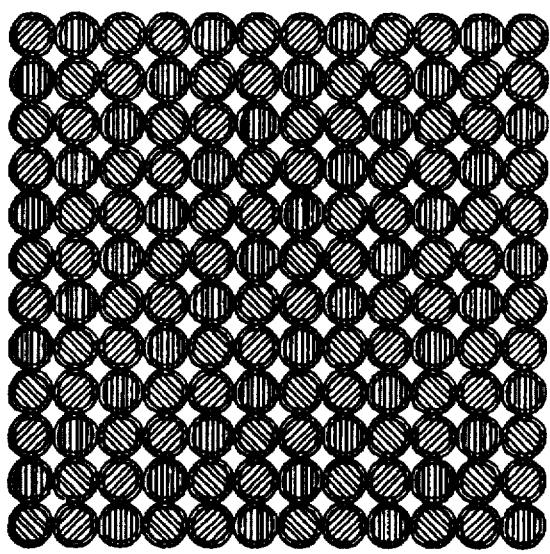
Figure 69C:
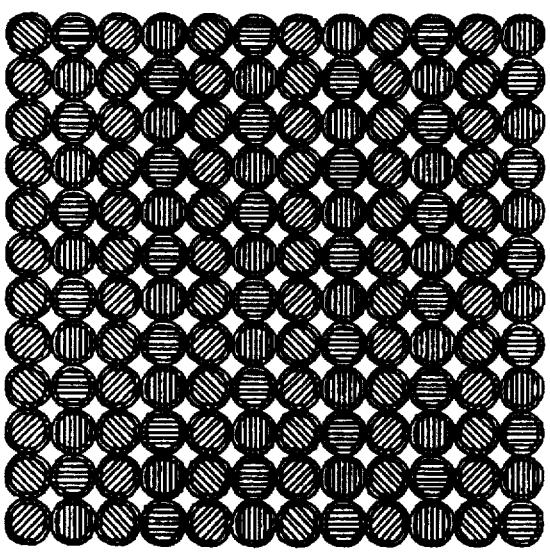

FIG. 69A, 69B and 69C show various forms of polarizing and/or color filtering of adjacent sensor cells on array 27 as an embodiment of the invention for improving reliability by reducing cross-talk between sensor cells. Thus in FIG. 69A, a two filter scheme is illustrated in which like polarizing or color filters are located along the diagonals representing a greater inter-cell spacing than occurs along rows and columns. The two filter embodiment is constructed by overlaying the filter array 1002 over the sensor sites of array 27 so that the centers of the circular filters in this instance are coincident with the centers of each sensor cell. A two filter screening in this manner may be by using alternate polarizations or two different filter colors. To read out data in this embodiment, each page will be illuminated by two sequentially driven sources either differently polarized or of different colors and the sensors of array 27 are read in synchronization with each source flash. In the case of the polarization of two filter array 1002, the two types of polarizers are at 90° apart, and corresponding light sources would have likewise a 90° or orthogonal polarization.

FIGS. 69B and 69C illustrate variations of differently colored filters, including a three color filter version in array 1004 in FIG. 69B and a four filter array 1006, again of a plurality of different colors illustrated in FIG. 69C for even greater separation between like filtered elements. The three and four filter versions 1004 and 1006 require a corresponding number of colored light sources flashed in sequence and the data read in synchronization therewith as described above for the two filter embodiment.

Focal Plane Lens Array

Figure 70:
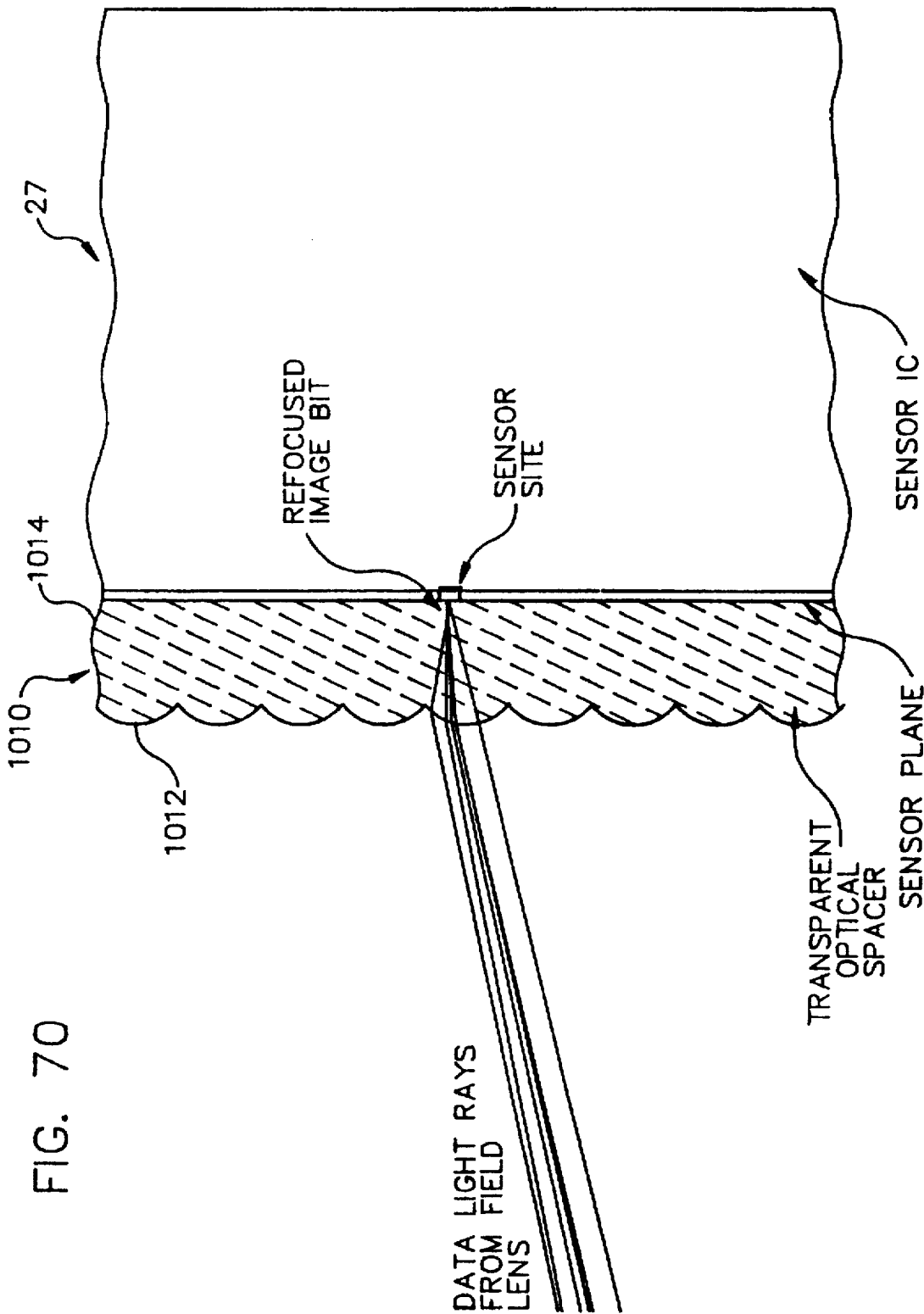
FIG. 70 is an enlarged, cross-sectional fragment of the sensor array overlaid by an array of micro-focal plane lenses to refocus and hence concentrate data image rays onto the sensor elements.

The embodiment shown in FIG. 70 enhances the precision by which the data light rays from the imaging optics are directed onto the elements of sensor array 27. Because the rays from the data light are striking the sensor plane at an angle that is usually not normal and because the light rays tend to be somewhat diffracted or dispersed, this embodiment provides a focal plane lens array 1010 provided by an array of single surface refractive lens elements indicated at 1012 and formed by a molding process on an optical plastic or transparent spacer 1014 that lies flush against the sensor image plane. The bundle of light rays associated with each data bit as depicted in FIG. 70 are refocused by the refractive surface elements 1012 so that the refocused image bit strikes the sensor elements squarely and with greater sharpness than without the focal plane lens array 1010. The focal length of elements 1012 is relatively short, on the order of the center-to-center spacing of the lens contours and hence on the same order of spacing as the sensor elements as described above. The thickness of the transparent optical spacer 1010, which may be plastic or ordinary glass, is approximately three to four-times the center-to-center spacing of the lens surfaces 1012; however, this spacing will change depending upon the type of spacer material used. One advantage of this focal plane array is that each sensor element can be made smaller, thus improving the signal-to-noise, and leaving more room adjacent each element for on site processing elements.

Field Flattener Lens at Sensor Plane

Figure 71:
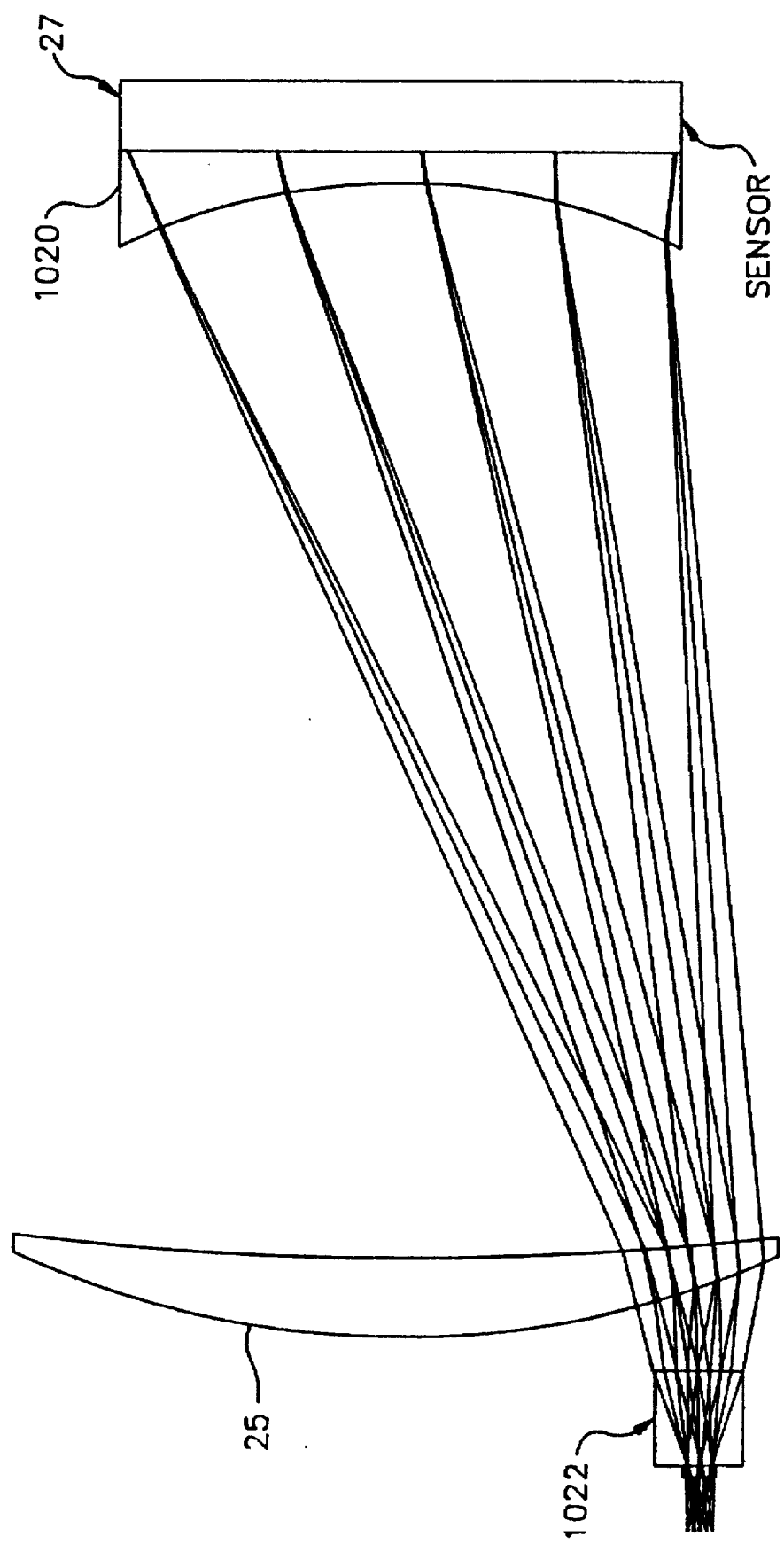
FIG. 71 is a diagramatic view of the optical system embodying an alternative field flattener lens overlying the sensor array to enhance the consistency of the data bit spacing image on the sensor array.

In FIG. 71, an optical system is shown in a view similar to that of above described FIG. 13, but with the addition of a plano concave field flattener lens 1020 placed up against the sensor plane of array 27 as illustrated. Also, in this embodiment, the relatively high powered imaging optics are provided by an all diffractive array 1022 (shown for one data page only) which may utilize the all diffractive lens system described above in connection with FIG. 25. The field lens 25 remains as a refractive element. The advantage of a field flattener lens 1020 is to reduce the requirements on the imaging optics to produce a flat image field, in turn, the manufacturing of the imaging optics will be less expensive.

Alternative Embodiments of Sensor Array and Data Processor

Figure 72C:
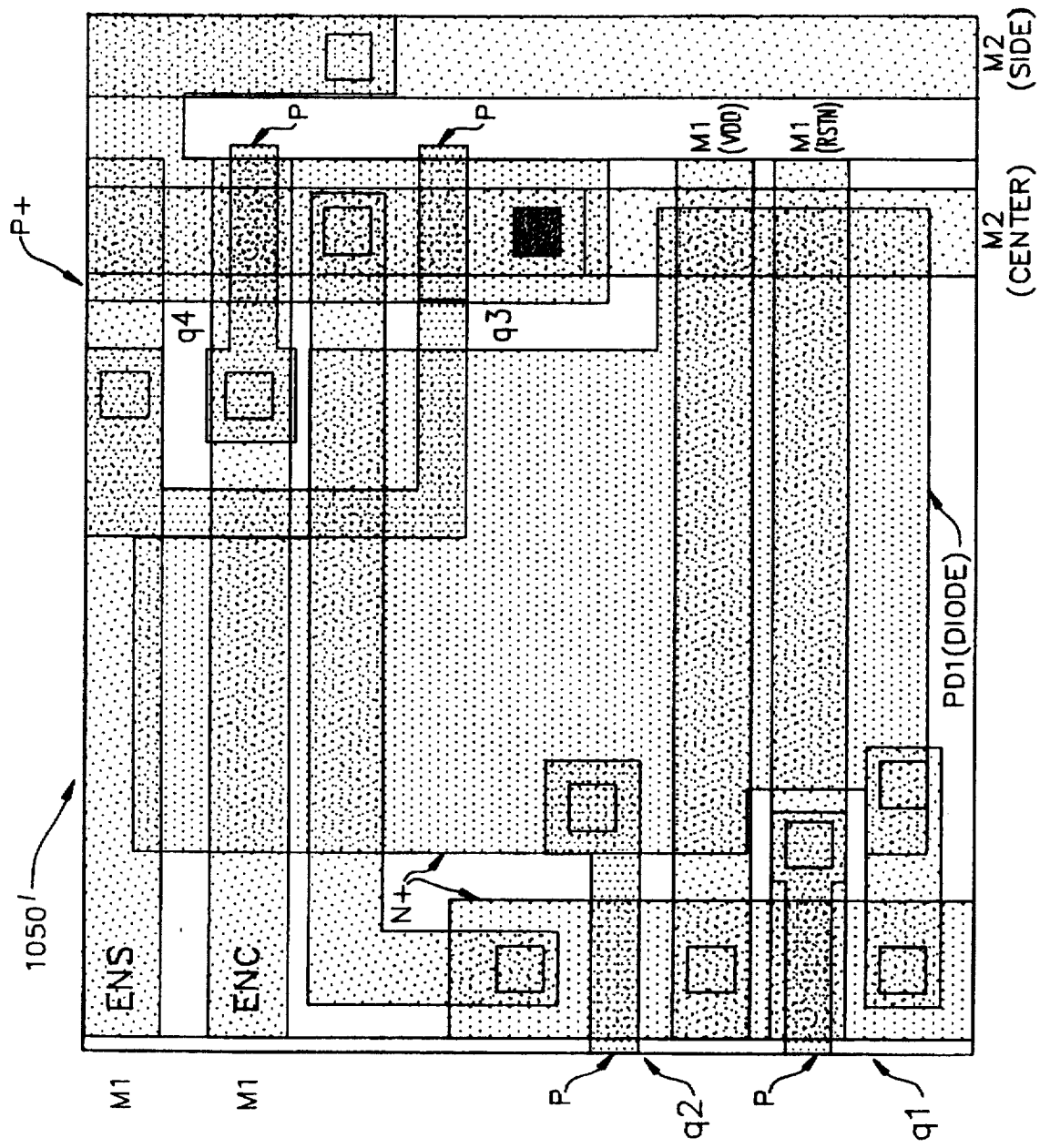
Figure 72D:
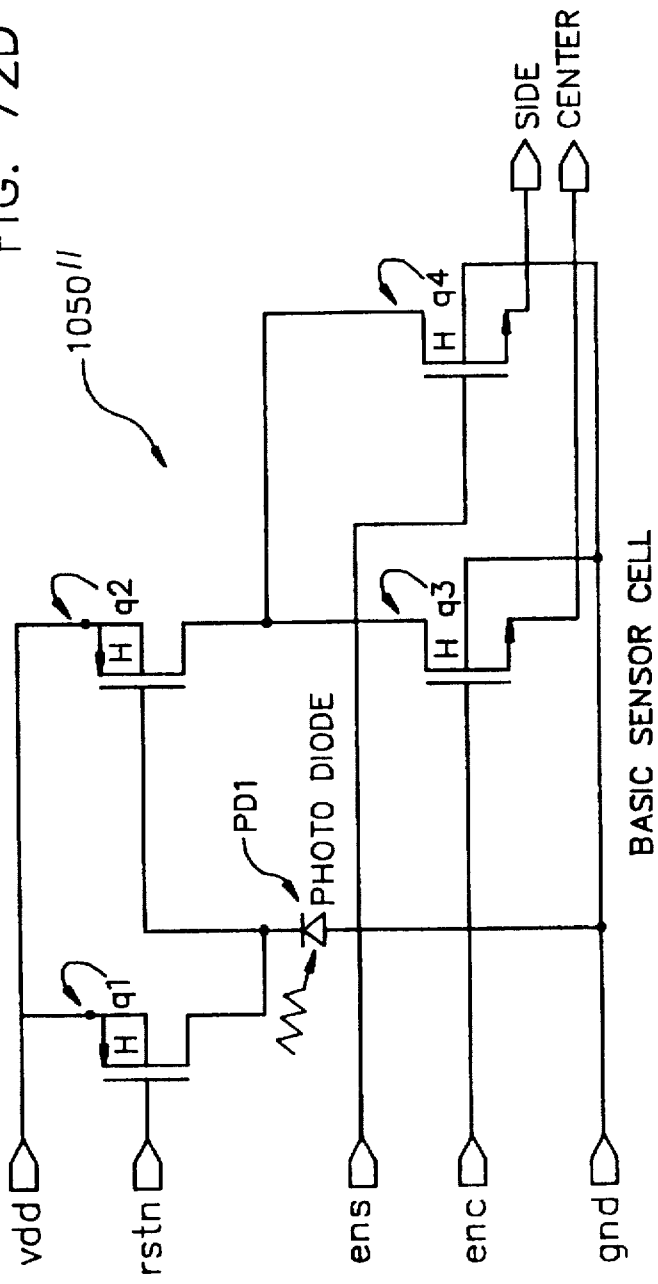

With reference to FIGS. 72A, 72B, 72C, and 72D, an alternative configuration of the sensor is shown as a large scale integrated circuit sensor array 1050 in FIG. 72A in which each sensor site or cell appears separately in FIG. 72B on an enlarged scale as cell 1050'. The number of cells in array 1050 will depend on the desired data storage capacity of the optical memory and the resolution specifications, but as an example of one embodiment, an array of 512×512 IC sensor cells 1050' is formed on the sensor chip. Each cell 1050' as depicted in FIG. 72B is shown in a further enlarged and shaded IC topographical layout in FIG. 72C and the corresponding schematic diagram is depicted in FIG. 72D as cell schematic 1050". Each of the cells 1050' receive light data in the area of photodiode PD1 shown by the textured region that is roughly three quarters of the overall rectangular cell site and generally centered in the rectangle. The remaining elements, including various input and output metallizations as well as FET transistor gates, are shown in FIG. 72C by like reference numerals in the schematic diagram 1050" of FIG. 72D. Thus the FET gates appear as q1, q2, q3 and q4 in both figures and the various input supply and output Vdd, rstn (reset), ens (enable side), and enc (enable center), gnd (ground), side and center signal outputs also are indicated in both figures. As explained herein, the side and center outputs, when enabled by ens and enc, respectively, produce the detected light signal in analog form as raw signal information by means of two isolated outputs which are used in an off site processing of these signals to develop the corrected and processed binary data in the manner described below. Alternatively, the processing can be on site in the IC matrix or along the edge of the IC sensor module chip.

In order to read information off the sensor placed in the focal plane of the data image, the sensor 1050 and associated signal processing decides where to look for each bit and then determines whether the bit value is (1) or (0). Ideally, the sensor module automatically aligns itself to the data image, suppresses the optical intersymbol interference between bits, and quantizes the optical information into digital (1)s and (0)s. For this embodiment, sensor 1050 uses twice the bit density or size as the image it is trying to discern to prevent image aliasing. Thus, for each nominal optical data spot, a 2×2 array of four sensor cells 1050' is used.

The image is initially found by means of peak detectors, the method of which is described in detail below, by searching a known area for fiducial data or special marks in the data image. Once these peak fiducial values are located, the offset and skew (rotation) of the image are known within one sensor cell. This allows the system to locate any particular spot (or bit) that it chooses. When the bit value of a particular address is desired, the processor (see FIG. 73B) adds the effective offset value to its programmed address and examines the appropriate data levels at the sensor plane.

To suppress optical interference between bits, the processor not only examines the image bit containing the information it wants, but also looks at neighboring bit values. Depending upon the optical spot spread and the orientation of neighboring image bits, a percentage of each is subtracted from the bit of interest.

To quantize this analog value and convert to binary data, a threshold is set. This function is served by looking at peak current values in the region of the cell site that is being examined. Knowing the maximum value and the fact that this value represents a (1) and that the minimum value represents a (0) yields a central current value around which a decision is made. Coding format can assure that there are (1)s and (0)s nearby. This allows the processor to compensate for intensity variation across the data image and to make the best decision for each bit based on its environment, yielding the best signal-to-noise ratio. An example of the basic sensor cell used for this technique is shown by the circuit schematic of FIG. 72D that is the basic unit cell on the array. The circuit 1050" functions to collect photons in the photo-diode and produce a current for processing.

The photo diode PD1 is constructed of an N+ diffusion into the substrate of the IC, commonly used for source and drain implants of the N-MOS species of transistor. This diode is back biased an amount equal to the power supply voltage Vdd to maximize its depletion region volume. A percentage of the photons striking the diode surface produce electron-hole pairs as they pass through the depletion region and impact the lattice. In the presence of the depletion region field, the electron-hole pairs do not recombine, and those form a photo current. This current is integrated on the gate capacitor of q2, producing a gate voltage proportional to the intensity of exposure and its duration. With an applied gate voltage, q2 will conduct and pass a current from the supply voltage.

To sense the bit value, either q3 (center) or q4 (side) is turned on with a positive voltage. These devices act as switches to enable the photo-proportional current potential of q2 onto one of the two sensing buses. Depending upon whether the processor has determined that this particular bit is a side value or a central value determines which enable line (ens for side, enc for center) will be turned on. When the sensing operation is complete, the enabled FET is turned off and the rstn signal is driven to ground potential, discharging the gate of q2 and re-establishing the full depletion region on the photo diode. When this operation is complete, the rstn line is driven back to the supply voltage and re-exposure can occur.

Sensor Processor

Figure 73C:
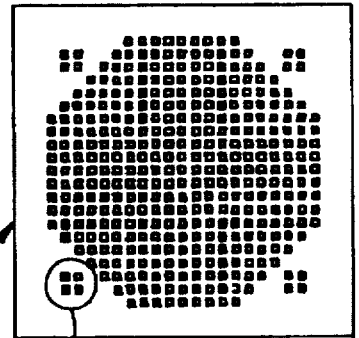
FIGS. 73A, 73B, and 73C are, respectively, a top plan view of a typical distribution of sensed data in which the information of bit A covers four sensor quadrants or elements for reliability and is surrounded by background information illustrated as bits B.
Figures 1, 73C:
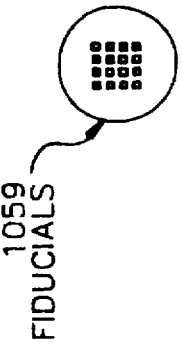
Figure 73A:
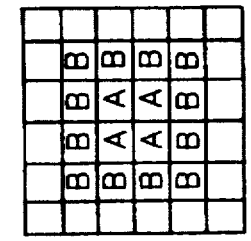
Figure 73B:
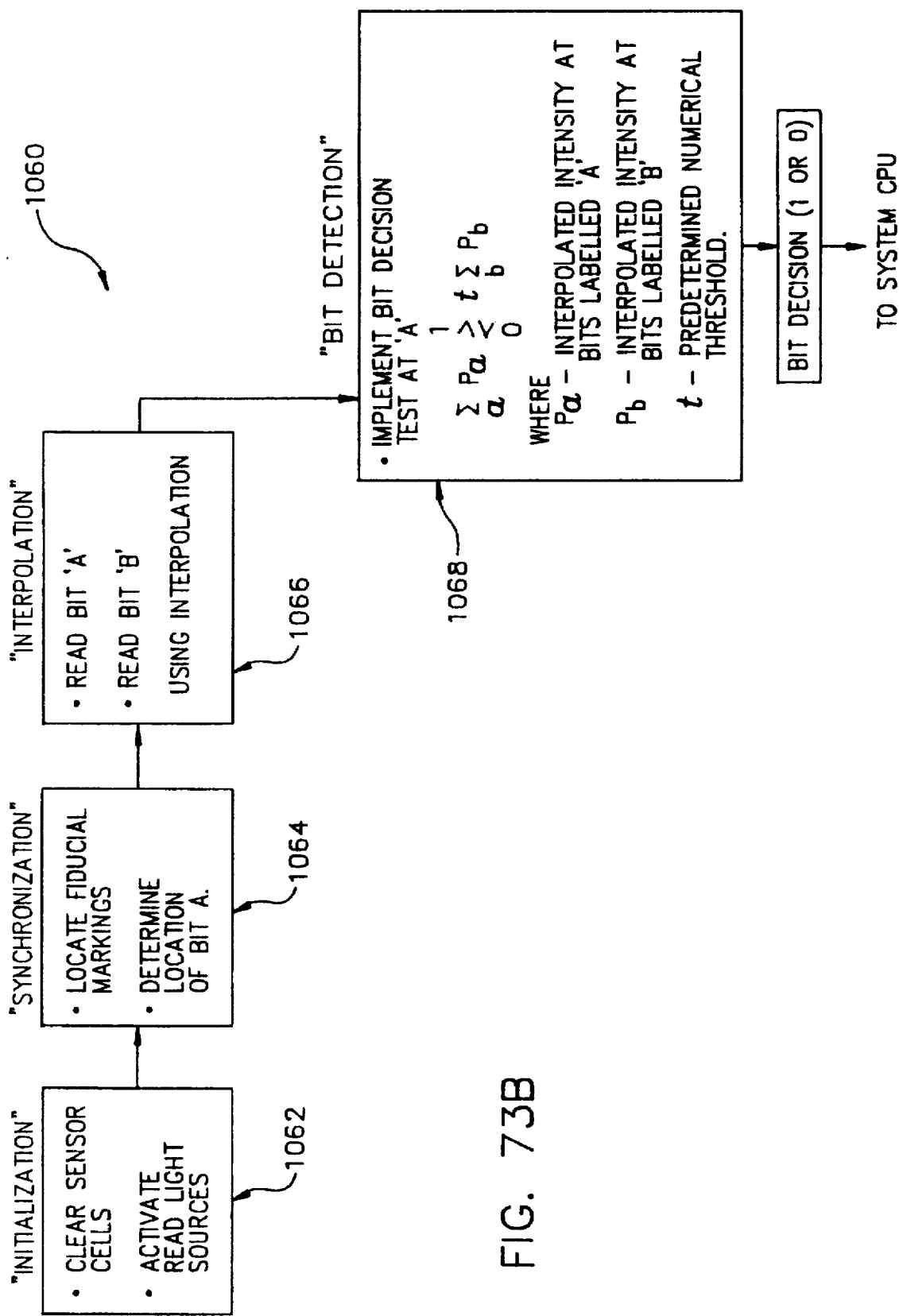

With reference to FIGS. 73A and 73B, the sensor processor element provides an interface between the outside world and the data. The processor sits on a parallel digital data bus and talks to a system CPU like an ordinary storage device (such as RAM, ROM or a disk drive). When the system CPU requests data by presenting the address and appropriate control signals, the processor's actions are set in motion. The first step is to initialize at 1062 by clearing the array of old data, effectively discharging all sensor cells to a known initial state. Having done this, the processor 1060 activates a light source, illuminating the germane data page on the record. This exposes the sensor to the data at which point the information can be accessed electrically.

In the next phase of operation, the processor synchronizes at 1064 by determining where exactly on the sensor the data is imaged. This is to account for any mechanical misalignment that may have occurred due to functional tolerances (each new piece of media mounted to the reader will have a new randomly determined alignment). To do this, the processor initiates a peak detector action which returns the sensor address of known fiducial data from several locations. This gives the processor relative addressing information which is used to modify the word address presented by the system CPU, thus the correct sensor data location may be accessed.

At this point, page data may be obtained. The relative address is presented to the sensor from the processor and the analog information from the sensor is input to the de-blurring and threshold circuitry on the side of the sensor. This function removes any interference between bits and then decides whether a location contains a one or a zero. In this way, the processor constructs the word in a digital format. Having done these steps, the processor can then feed the data to the system CPU via the data bus. If another word in the same page is requested by the system CPU, the processor simply goes out and accesses the desired sensor location without re-exposing the sensor to a new data patch (page). An address on a new page requires that the sensor be cleared and that a new data patch be imaged on the sensor.

Peak Detection

The image is aligned by means of peak detectors which go out and search a known area for fiducial marks in the data image. Once these peak values are located, the offset and rotation of the image are known within one sensor cell. This allows the device to locate any particular spot (or bit) that it chooses. When the bit value of a particular address is desired, the processor can add the effective offset value to its programmed address and examine the appropriate bits. Since image rotation will be small, any angular calculations degenerate to linear summations not trigonometric operations. This is due to the fact that $Sin(x)=x$ for small x. Thus both offset and rotation can be accounted for by an offset address which varies across the image (depending upon the rotational angle).

Algorithm

To suppress the optical interference between bits, the processor must not only examine the bits containing the information it wants, but must also look at neighboring bit values. Depending upon the optical spread and the orientation of neighboring bits, a percentage of each is subtracted from the bit of interest. This may be done in several ways, such as weighted voltage summing, charge summing or current summing. For this discussion, current summing will be described. Presuming that bit values are available as currents, in a randomly accessible fashion, the processor can enable the central bit (the one containing the information desired) and subtract from it portions of the surrounding (side) bit values. This can be done using transimpedance amplifier configurations or simple current mirrors. This difference yields the actual bit current if there were no optical interference. Such an operation is inherently parallel since several bits need to be accessed in order to evaluate a single bit, thus the technique can be applied to a whole word. Also, this method is best applied as the word is read out, and fortunately so since this speeds the access time up. In actuality, three words are accessed at once by parallel read lines. This allows the construction of the local neighborhood for each bit, forming the inputs required for the intersymbol interference inhibition algorithm.

Decision Making

Now with de-blurred analog information, the processor must decide whether a bit contains a one or a zero. To quantize the signal, a threshold met be set. This function is served by looking at peak current values in the region of the bit that is being discerned. Knowing the maximum value (and the fact that this value represents a one) and that the minimum value represents a zero yields a central current value around which a decision can be made. Coding format can assure that there are ones and zeros nearby. This allows the processor to compensate for intensity variation across the image and to make the best decision for each bit based on its environment, thereby yielding the best signal to noise ratio. An example of the basic bit cell which can be used for this technique follows.

The rationale for the interconnect scheme shown in this embodiment is best understood by considering the nature of the algorithm. Since all bits surrounding the one of interest need to be evaluated, their information must be brought to the edge of the sensor array as well. Thinking in terms of a vertical orientation (with the algorithm circuitry at the bottom of the sensor bit array), the bit values to the left, right, top and bottom of the desired bit, must be available in addition to the values at the corners of the 3×3 array of bits making up the neighborhood (with the bit of interest at the center). To accomplish this with the least amount of interconnect one can consider that the values above and below the central bit to have an identical impact upon the algorithm evaluation. Thus they may be summed, and this influence upon the weighting of their contribution can be taken into account in the processing. Summing in this scheme is simply the addition of currents, thus a single interconnect line suffices to bring out the information of two bits. This accounts for the labeling of side bit and the signal name ens, for "enable side". The central bit must be brought out uniquely, so a second line is required. The name for its enable signal enc (for enable center) reflects this. Were these aspects of the algorithm not true, three interconnect lines would be needed to bring out the required information. This would reduce the optical capture area and reduce sensor chip yield.

In general, the theory of the processor is as follows. We presume a two dimensional random data source, I, passed through an effective linear space-invariant system which models optical blurring and misalignment. The data is encoded at the baud rate of 1 symbol per unit length T, which we call one baud. However, because each symbol is read out on a two-by-two grid, doubling the baud rate, we artificially view the input as being placed at twice the baud rate, with a single repetition in each dimension. This simplifies the discussion, by allowing us to formulate the problem at a single sample rate, 2/T. This increased sampling rate is crucial to system performance, since it acts to remove spatial frequency domain aliasing. Elimination of aliasing is required to mitigate misalignment. We write $$\sum_{m,l} I_{m,l} h(x - m, y - l)$$

where the spatial impulse response, h, is sampled with misalignment, and can be assumed known, after measurement in laboratory tests. These tests have shown that a single input data symbol, read-out on a two-by-two grid, falls on a L-by-L grid, with L=6.

The required filtering can be broken down into three steps: realignment or interpolation (INT), equalization (EQ), and matched filtering (MF). We briefly discuss the role of each filter.

Interpolation is required to correct for offset and rotation of the input mask. This is a linear process (L), but is space variant (SV). The spatial variation is due to the rotation, as the corrective interpolation would be space-invariant in the presence of offset alone. The offset problem is a common one in data communications, and is referred to as symbol timing error. The rotation effect has no counterpart in one-dimensional data communications.

Equalization, or deblurring or pulse sharpening, consists of providing a linear (L) filter to undo the effect of the blurring. When the blurring is space-invariant (SI), so is the filtering. If the blurring function, or optical impulse response, is known in advance through lab tests, the inverse filter can be synthesized in advance, and does not vary with position. The optimal LSI filter depends on the system noise level and on the blurring response, and presumes that the misalignment has been compensated.

Matched filtering is a signal processing technique used to combat random Gaussian electronic noise. In effect, it is a weight-and-sum filter acting only on all pixels that contribute to any data value. Based on the lab tests, this will be a two-by-two grid. This filter is LSI, and can be cascaded with the equalizer. Thus, the EQ and MF are effectively a single filter, although they have different functions. The MF is readout at the baud rate and is sliced or compared to a threshold to make a hard symbol decision on the data symbol value. This data can be FEC (forward error correction) encoded, and the hard decision can be forwarded to an off-chip de-interleaver and FEC decoder as required.

Above, we have discussed the basic components of the information retrieval process; initialization, synchronization and interpolation, equalization, and matched filtering. In order to alleviate processing complexity, a simplified but effective system has been developed and is described in connection with FIGS. 73A, 73B and 73C.

Misregistration and skew (rotation) forces the retrieval system to resynchronize each time a new mask is inserted. To aid this process, fiducial data or markings have been placed on the mask as described above for mechanical registration systems and again as shown here in FIG. 73C, which are easily identified based on their unique signature and gross location. Basically, these are data arrays 1059 that lie at the corners of each page, but alternatively can be embedded in the data such as in the form of a large cross centered on the mask. By reading the offset in the horizontal and vertical we determine misregistration at 1064, and by reading the slope of these fiducial lines, we determine rotation. With computation of the required trig functions, and multiplies and adds, the group of pixels surrounding information bit A is retrieved. (See FIG. 73A). Because of the gradual skew due to rotation, interpolation at 1066 of nearby intensities is used to correct for offsets of less than one full data bit. This operation requires scaling and adding of adjacent bits after read-out, as shown in the flowchart of FIG. 73B.

At this point, we have obtained the blurred values of data bits surrounding group A. In fact, this consists only of the adjacent bits marked B in FIG. 73A, since far-out data are less relevant in the decision making. The next step in the general procedure is deblurring or equalization, as discussed in the generic procedure. In actuality, we combine equalization with matched filtering and thresholding to develop an expedient algorithm called "bit detection" 1068 shown in FIG. 73B.

The algorithm 1068 which has been implemented is based on a judicious approximation to ideal equalization. All bits labeled 'A' in FIG. 73A are summed; this forming the matched filter, as the input mask is 4:1 oversampled upon readout. The ideal processing in a noise free environment would be the MF cascaded with the equalizer, or inverse filter. We have succeeded in approximating this filtering scheme by that shown in the last block 1068 of FIGS. 73B, where the sum of all bits at 'A' is compared to the sum of all intensity in the adjacent bits marked 'B'. These bits are further scaled by a factor "t" to properly approximate the ideal filtering scheme. The data then is passed through a threshold determination and the result of decision block 1070 is a (1) or (0) at the corresponding address. This data reading process is now complete and the data passed to a system CPU.

As will be apparent, still further alternative embodiments fall within the scope of this invention including the use of reading light sources can be one of a variety of types. The requirements are that the bandwidths should be relatively narrow, turn on and off rapidly, and in practical applications, should be long-lived. For most applications, speed is desirable, so a high flux of photons, i.e. high power, is also desirable. Laser diodes would be best, and they are required for the highest speed systems, but they are the most expensive. LEDs may be used and those made as a monolithic array are preferred. Plasma, or electroluminescent arrays, such as are currently available for computer displays, would be effective, although each element cannot, at present, provide as much power as an LED. Field emission light source arrays, currently available as prototypes, are another alternative. The light elements can consist of a single source with an array of shutters between said source and the pages. In the embodiment shown in FIGS. 24a and 24b, the light source element on the IC in combination with the photosensor can be a silicon filament-type element which will lend itself to integration with the silicon based sensors more readily than GaAs sources.

In alternative implementations of the write/read embodiments a wavelength may be used for recording that is different from that used for reading. In particular, a short wavelength, e.g., blue, recording light, would allow smaller spots to be made because diffraction would be less. In addition, there are desirable recording materials that are sensitive only to short wavelengths, such as photopolymers, diazo materials and energy storage crystals.

Alternatively to the storage of binary data described above, the system can be used to store a multiplicity of analog pictures, e.g., patterns, photographs, etc., each randomly accessible at rapid retrieval times. Each page area would contain at least one photograph or pattern. When the page source is activated, a picture image is transferred to the sensor array. Each sensor of the array senses one picture element, i.e., pixel. The sensor array would provide an analog output for each pixel in the same manner as a TV sensor, except that pixels may be addressed randomly or at a non-TV standard rate. These data then may be compared or correlated with other data in a separate processor.

I claim:

1. An optical data sensor for sensing optical data imaged on a sensing plane, comprising:
    an array of solid state light sensor elements disposed for receiving imaged data; and
    a plurality of adaptive threshold sensing circuit means for providing a variable, adaptive light sensing threshold to data at each sensor element in response to receipt of light on adjacent sensor elements.

2. The optical data sensor of claim 1 wherein said array of light sensor elements comprises a plurality of charge coupled devices.

3. The optical data sensor of claim 1 wherein said array of light sensor elements comprises photosensing diodes.

4. The optical data sensor of claim 3 wherein at least one of said photosensing diodes is a PIN diode.

5. The optical data sensor of claim 1 further comprising a plurality of solid state light emitters disposed substantially in juxtaposition with said light sensor elements, and means for selectively energizing said light emitters.

6. The optical data sensor of claim 1 wherein said plurality of adaptive threshold sensing circuit means comprises variable level comparator means, said variable level comparator means connected to receive sensor output signals from predetermined subgroups of said sensor elements for changing a threshold sensing level at each said variable level comparator means as a function of the amount of light incident on said subgroups of said sensor elements.

7. The optical data sensor of claim 1 wherein said array of solid state light sensor elements and said adaptive threshold sensing circuit means are fabricated as an integrated solid state circuit.

8. A method of sensing optical data imaged on a sensing plane, comprising:
    forming a light image of a data pattern on an array of photo sensitive elements;
    outputting data from each element when light in said pattern that is incident on one of said elements has a predetermined intensity threshold; and
    changing said intensity threshold in response to light incident on elements adjacent to said one of said elements.

9. An optical data system comprising:
    an optical data means for storing data as light altering characteristics and being organized into a plurality (P) of juxtaposed data regions each having capacity to store (B) bits of data;
    controllable light source means for selectively illuminating at least one of said data regions of said optical data means;
    data imaging lens system having a plurality of juxtaposed lenslet subsystems each being formed of multiple elements and so shaped and arranged in such proximity to and in optical registration with a different one of said juxtaposed data regions so that the image resolving power thereof is substantially uniform over the field of view of that data region to form an image thereof on a common image surface spaced from said data means and data imaging lens system and wherein at least one element is diffractive for imaging an associated data region, and at least one element is an anomalous lens means for achromatizing the imaging rays;
    sensor means having a plurality (S) of juxtaposed light sensors arranged at said image surface for sensing data as a light image corresponding to an illuminated data region; and
    data signal output means coupled to said sensor means for outputting data signals representing said data of an illuminated and imaged data region.

10. The system of claim 9, wherein said anomalous lens means comprises an optical medium containing a buried refractive surface formed by a preselected dye that has an anomalous dispersion selected to cancel out color aberration caused by dispersion in the diffractive element.

11. The system of claim 9, wherein said anomalous lens means is in the configuration of a Fresnel lens.

12. The system of claim 9, wherein said anomalous lens means is characterized by an optical medium having embedded therein an optical material exhibiting a predetermined sharp change in index of refraction as a function of wavelength.

13. The system of claim 9, wherein said anomalous lens means is formed by at least two optical media that exhibit a predetermined net dispersion such that the optical power introduced thereby substantially affects color aberration.

14. An optical data system comprising:
    an optical data means for storing data as light altering characteristics and being organized into a plurality (P) of juxtaposed data regions each having capacity to store (B) bits of data;
    controllable light source means for selectively illuminating at least one of said data regions of said optical data means;
    data imaging lens system having a plurality of juxtaposed lenslet subsystems each being formed of multiple elements and so shaped and arranged in such proximity to and in optical registration with a different one of said juxtaposed data regions so that the image resolving power thereof is substantially uniform over the field of view of that data region to form an image thereof on a common image surface spaced from said data means and data imaging lens system and wherein at least one element is diffractive for imaging an associated data region, and at least one element is a gradient index lens means;

sensor means having a plurality (S) of juxtaposed light sensors arranged at said image surface for sensing data as a light image corresponding to an illuminated data region; and data signal output means coupled to said sensor means for outputting data signals representing said data of an illuminated and imaged data region.

15. The system of claim 14, wherein said gradient index lens means is formed by a gradient of anomalous dispersion dye varying the index of refraction longitudinally of the optical axis.

16. The system of claim 14, wherein said gradient index lens means is formed by a gradient of anomalous dispersion dye varying the index of refraction radially of the optical axis.

17. An optical data system comprising:

an optical data means for storing data as light altering characteristics and being organized into a plurality (P) of juxtaposed data regions each having capacity to store (B) bits of data;

controllable light source means for selectively illuminating at least one of said data regions of said optical data means;

data imaging lens system having a plurality of juxtaposed lenslet subsystems each being formed of multiple elements and so shaped and arranged in such proximity to and in optical registration with a different one of said juxtaposed data regions so that the image resolving power thereof is substantially uniform over the field of view of that data region to form an image thereof on a common image surface spaced from said data means and data imaging lens system;

sensor means having a plurality (S) of juxtaposed light sensors arranged at said image surface for sensing data as a light image corresponding to an illuminated data region and having adaptive threshold sensing circuit means for providing a variable, adaptive light sensing threshold to data images incident on each of said sensors wherein said adaptive threshold sensing circuit means comprises an integrated circuit sensor array having a plurality of subarrays of grouped sensor cells for detecting a single light image bit and sensor processing means for detecting data bits from said light image bits; and data signal output means coupled to said sensor means for outputting data signals representing said data of an illuminated and imaged data region.

18. The optical data system of claim 17, wherein each of said data regions has fiducial data stored thereon for registering the light image on said sensor means, and wherein said adaptive threshold sensing circuit comprises processing means for reading said fiducial data and controlling addressing of said data signal output means for adapting the reading of data from said sensor means according to said fiducial data.

19. An optical data system comprising:

an optical data means for storing data as light altering characteristics and being organized into a plurality (P) of juxtaposed data regions each having capacity to store (B) bits of data;

controllable light source means for selectively illuminating at least one of said data regions of said optical data means;

data imaging lens system having a plurality of juxtaposed lenslet subsystems each being formed of multiple elements and so shaped and arranged in such proximity to and in optical registration with a different one of said juxtaposed data regions so that the image resolving power thereof is substantially uniform over the field of view of that data region to form an image thereof on a common image surface spaced from said data means and data imaging lens system;

sensor means having a plurality (S) of juxtaposed light sensors arranged at said image surface for sensing data as a light image corresponding to an illuminated data region and means for submultiplexing data from each of said data regions so as to cause portions of each of said regions to be selectively imaged on said sensor means; and data signal output means coupled to said sensor means for outputting data signals representing said data of an illuminated and imaged data region.

20. An optical data system comprising:

an optical data means for storing data as light altering characteristics and being organized into a plurality (P) of juxtaposed data regions each having capacity to store (B) bits of data;

controllable light source means for selectively illuminating at least one of said data regions of said optical data means;

data imaging lens system having a plurality of juxtaposed lenslet subsystems each being formed of multiple elements and so shaped and arranged in such proximity to and in optical registration with a different one of said juxtaposed data regions so that the image resolving power thereof is substantially uniform over the field of view of that data region to form an image thereof on a common image surface spaced from said data means and data imaging lens system and a field flattener lens means for correcting spherical aberration of said light image incident on said sensor means;

sensor means having a plurality (S) of juxtaposed light sensors arranged at said image surface for sensing data as a light image corresponding to an illuminated data region; and data signal output means coupled to said sensor means for outputting data signals representing said data of an illuminated and imaged data region.

21. An optical data system comprising:

an optical data means for storing data as light altering characteristics and being organized into a plurality (P) of juxtaposed data regions each having capacity to store (B) bits of data;

controllable light source means for selectively illuminating at least one of said data regions of said optical data means;

data imaging lens system having a plurality of juxtaposed lenslet subsystems each being formed of multiple elements and so shaped and arranged in such proximity to and in optical registration with a different one of said juxtaposed data regions so that the image resolving power thereof is substantially uniform over the field of view of that data region to form an image thereof on a common image surface spaced from said data means and data imaging lens system, and a focal plane lens array after said plurality of juxtaposed lenslet subsystems and proximate said common image surface for refocusing each imaged data region onto said common image surface;

sensor means having a plurality (S) of juxtaposed light sensors arranged at said image surface for sensing data as a light image corresponding to an illuminated data region; and data signal output means coupled to said sensor means for outputting data signals representing said data of an illuminated and imaged data region.

22. An optical data recording and retrieval system comprising:

read light source array means;

optical data record means disposed proximate to said read light source array means for being illuminated thereby;

lens array means comprising a plurality of substantially similar lenslets arrayed in a lens structure disposed proximate and affixed to said optical data record means, each said lenslet forming a distal image of a portion of said optical data record means illuminated by said read light source array means;

light sensor array means disposed to receive said image of said portion of said optical data record means illuminated by said read light source means, said sensor array means responding to said image to output data; and recording light data composer means for producing a recording light data pattern and imaging same onto said optical data record means for storing said data pattern, wherein said recording light data composer means comprises ultrasonic lens means for controllably directing said data pattern and imaging it onto said optical data record.

23. The optical data system of claim 19, wherein said controllable light source means comprises at least one light guide means for jointly illuminating a subset of said data regions, and electrically controlled shutter means disposed in a data image path between said light guide and said sensor means for shuttering image light from certain but not all of said subset of said data regions.

24. An optical data reading system comprising:

at least one of an optical data storage medium with juxtaposed data regions thereon;

a controllable light source means for selectively illuminating a data region on said data storage medium;

a data imaging lens means having a plurality of juxtaposed lenslets proximate said data storage medium being shaped and arranged to form an image of an associated data region on a common image surface; and a sensor means having a plurality of juxtaposed light sensors arranged at said common image surface for sensing data as a light image corresponding to an illuminated data region, wherein the relative positions of said optical data storage medium, said controllable light source means, said data imaging lens means and said sensor means are controllably moveable in substantially parallel planes.

25. An optical data reading system comprising:

a substantially planar optical data storage medium with juxtaposed data regions thereon wherein said data storage medium is controllably movable within a first planar area occupied by it;

a plurality of juxtaposed lenslets proximate a first side of said data storage medium being shaped and arranged to form an image of an associated data region on a common image surface spaced from said first side;

a controllable light source means for selectively illuminating a data region of said data storage medium wherein said controllable light source means is controllably moveable within a second plane parallel to said first plane, and a substantially planar sensor means having a plurality of juxtaposed light sensors arranged at said common image surface for sensing data as a light image corresponding to an illuminated data region wherein said sensor means is cooperatively connected to said light source means.

26. An optical data system comprising:

an optical data means for storing data as light altering characteristics and being organized into a plurality (P) of juxtaposed data regions each having capacity to store (B) bits of data, said optical data means defining a plane;

controllable light source means for selectively illuminating at least one of said separate data regions of said optical data means;

data imaging lens means having a plurality of juxtaposed lenslets each being shaped and arranged in such proximity to and in optical registration with a separate one of said juxtaposed data regions so that the image resolving power thereof is substantially uniform over the field of view of that data region to form an image thereof on a common image surface spaced from said data means and lens means;

sensor means having a plurality (S) of juxtaposed light sensors arranged at said image surface for sensing data as a light image corresponding to an illuminated data region;

data signal output means coupled to said sensor means for outputting data signals representing said data of an illuminated and imaged data region; and registration adjustment means being controlled by a control signal for adjusting the position of said optical data means within said plane for maintaining optical registration of said light image and said sensor means.

27. An optical data cartridge reading system comprising:

a cartridge including a housing, said housing suspending in its interior a data array of substantially planar optical data storage medium with juxtaposed data regions thereon, said data array including a plurality of juxtaposed lenslets proximate a first side of said data array being shaped and arranged to form an image of an associated data region on a common image surface spaced from said first side, a reading unit including a controllable light source means for selectively illuminating a data region from a second side of said data array wherein said light source means is supported by said reading unit in a plane parallel to said data array, said reading unit further including a sensing array of substantially planar sensor means having a plurality of juxtaposed light sensors arranged at said common image surface for sensing data as a light image corresponding to an illuminated data region wherein said sensing array is supported by said reading unit in a plane parallel to said data array a clamping means including registration means mounted within said reading unit for clamping said data array and said plurality of lenslets between said light source means and said sensing array.

28. An optical data sensor for sensing optical data imaged on a sensing plane, comprising:

an array of solid state light sensor elements disposed for receiving imaged data; and a plurality of adaptive threshold sensing circuit means for providing a variable, adaptive light sensing threshold to data at each sensor element in response to receipt of light on adjacent sensor elements wherein said plurality of adaptive threshold sensing circuit means comprises variable level comparator means, said variable level comparator means connected to receive sensor output signals from predetermined subgroups of said sensor elements for changing a threshold sensing level at each said variable level comparator means as a function of the amount of light incident on said subgroups of said sensor elements.

* * * * *